(12) United States Patent
Nobuto et al.

(10) Patent No.: US 6,198,130 B1
(45) Date of Patent: *Mar. 6, 2001

(54) SEMICONDUCTOR DEVICE AND METHOD FOR MANUFACTURING THE SAME

(75) Inventors: Shinji Nobuto; Kiyoto Watabe; Hideki Takahashi, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/003,338

(22) Filed: Jan. 6, 1998

(30) Foreign Application Priority Data

Aug. 4, 1997 (JP) .................................. 9-209173

(51) Int. Cl.[7] .................................. H01L 29/76
(52) U.S. Cl. .................. 257/343; 257/331; 257/347
(58) Field of Search .................. 257/328, 329, 257/331, 332, 341, 342, 343, 335, 162, 172, 347, 409

(56) References Cited

U.S. PATENT DOCUMENTS

| | | | |
|---|---|---|---|
| 4,766,474 | * | 8/1988 | Nakagawa et al. ............ 257/409 |
| 5,448,083 | * | 9/1995 | Kitagawa et al. ............ 257/139 |

* cited by examiner

*Primary Examiner*—Minh Loan Tran
*Assistant Examiner*—Shouxiang Hu
(74) *Attorney, Agent, or Firm*—Oblon, Spivak, McClelland, Maier & Neustadt, P.C.

(57) ABSTRACT

An ON-state voltage is reduced. A line of gate trenches 8 is formed on an n-type silicon layer (a SOI layer) 3 so as to divide a p-type base layer 4 and an n-type emitter layer 5. The gate trench 8 extends from the n-type emitter layer 5 toward a collector electrode 21. A gate electrode 10 is buried in the gate trench 8 with a gate insulation film 9 interposed therebetween. The gate electrode 10 is provided opposite to a vertical section of the p-type base layer 4. Therefore, a channel width can be kept great. Furthermore, a wide region of the n-type silicon layer 3 which is provided opposite to the gate trench 8 functions as an accumulation layer of a hole. As a result, the ON-state voltage can be reduced.

16 Claims, 48 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device suitable for an IGBT (Insulated Gate Bipolar Transistor), and more particularly to an improvement to reduce an ON-state voltage.

2. Description of the Background Art

FIG. 70 is a sectional front view showing a structure of a semiconductor device according to the prior art which is a background of the present invention. FIG. 71 is a sectional view taken along the line K—K in FIG. 70. An device 150 according to the prior art comprises a SOI (Silicon On Insulator) wafer. The SOI wafer includes a silicon substrate 151, a silicon oxide film (a substrate insulation film) 152 formed on the silicon substrate 151, and an n$^-$-type silicon layer (an active layer or a SOI layer) 153 formed on the silicon oxide film 152.

A p-type base layer 154 and an n-type buffer layer 156 are selectively formed apart from each other over an upper principal surface of the n$^-$-type silicon layer 153. An n$^+$-type emitter layer 155 is selectively formed on an upper principal surface of the p-type base layer 154. A p$^+$-type collector layer 157 is selectively formed on an upper principal surface of the n-type buffer layer 156.

An emitter electrode 170 is connected across an upper principal surface of the n$^+$-type emitter layer 155 and that of the p-type base layer 154. A collector electrode 171 is connected to an upper principal surface of the p$^+$-type collector layer 157. A gate electrode 173 is provided opposite to the upper principal surface of the p-type base layer 154 with a gate insulation film (not shown) interposed therebetween. In other words, the device 150 comprises a "transverse (or lateral)" and n-channel type IGBT.

An isolation trench 161 is formed around the IGBT. An isolation electrode 163 is buried in the isolation trench 161 with an isolation insulation film 162 interposed therebetween. A circuit element which is not shown is formed in a region of the n$^-$-type silicon layer 153 provided opposite to the IGBT with the isolation trench 161 interposed therebetween. The circuit element is an device portion for controlling the IGBT, for example. Differently from the IGBT acting as a power element, only a current having a small magnitude flows in the circuit element. The isolation trench 161 is provided in order to isolate the IGBT in which a current having a great magnitude flows from the circuit element which operates with the current having a small magnitude.

In recent years, a dielectric isolation type HVIC (High Voltage Integrated Circuit) having high-speed switching characteristics and less parasitic bipolar operation has vigorously been developed as a transverse type power device. The device 150 corresponds to an example in which a dielectric isolation is implemented by a SOI wafer and a trench isolation (the isolation trench 161).

When using the device 150, a positive voltage for the emitter electrode 170 is usually applied to the collector electrode 171 through a load. In this state, if a positive voltage which exceeds a predetermined threshold voltage is applied to the gate electrode 173, a channel region Ch defined in a surface portion of the p-type base layer 154 opposite to the gate electrode 173 becomes conductive so that electrons are injected from the n$^+$-type emitter layer 155 to the n$^-$-type silicon layer 153.

More specifically, an electronic current Jn flows from the n$^+$-type emitter layer 155 to the n$^-$-type silicon layer 153 (In the drawing, a direction of the electronic current Jn represents that of a flow of a positive electric charge). Accordingly, a hole is injected from the p$^+$-type collector layer 157 to the n$^-$-type silicon layer 153. As a result, conductivity modulation is caused so that an electric resistance is lowered in the n$^-$-type silicon layer 153. Therefore, a main current (collector current) is caused to flow from the collector electrode 171 to the emitter electrode 170. More specifically, the IGBT is brought into a conductive state (an ON state).

When a zero voltage or a negative voltage is applied to the gate electrode 173, the channel region Ch becomes non-conductive so that the injection of the electrons from the n$^+$-type emitter layer 155 to the n$^-$-type silicon layer 153 is stopped. As a result, the conductivity modulation in the n$^-$-type silicon layer 153 dissipates. Consequently, the flow of the main current is stopped. In other words, the IGBT is brought into a cut-off state (an OFF state). In the IGBT described above, a magnitude of the main current is controlled according to a voltage applied to the gate electrode 173.

As an example, the IGBT provided in the device 150 according to the prior art shown in FIGS. 70 and 71 will be described below. In the IGBT, a voltage drop is caused in the vicinity of the channel region Ch in the ON state so that a voltage drop is great between the collector electrode 171 and the emitter electrode 170 in the ON state, that is, an ON-state voltage is high. Furthermore, a hole current Jh passes through a transverse resistor (or lateral resistor) R of the p-type base layer 154. Therefore, a latch-up tolerance is low.

Such troubles are more or less caused in a MOS transistor as well as the IGBT, and are outstanding problems to be solved in semiconductor device represented by these elements (IGBT and MOS).

SUMMARY OF THE INVENTION

A first aspect of the present invention is directed to a semiconductor device comprising a first semiconductor layer of a first conductivity type having one of principal surfaces and the other principal surface, a second semiconductor layer of a second conductivity type which is selectively formed on one of the principal surfaces of the first semiconductor layer, a third semiconductor layer of a first conductivity type selectively formed on an inside of an exposed surface of the second semiconductor layer, wherein the third semiconductor layer is shallower than the second semiconductor layer and has a higher impurity concentration than that of the first semiconductor layer, a fourth semiconductor layer which is selectively exposed to one of the principal surfaces of the first semiconductor layer apart from the second semiconductor layer, a first main electrode connected to the second and third semiconductor layers, and a second main electrode connected to the fourth semiconductor layer.

The first semiconductor layer defines a gate trench which is open to one of the principal surfaces, the gate trench being defined to extend in a direction from the third semiconductor layer toward the second main electrode, and to traverse at least from an edge of the third semiconductor layer which is closer to the second main electrode to an edge of the second semiconductor layer which is closer to the second main electrode, the semiconductor device further comprising a gate insulation film covering an internal wall of the gate trench which is defined by the first semiconductor layer, and a gate electrode buried in the gate trench with the gate insulation film interposed therebetween.

A second aspect of the present invention is directed to the semiconductor device according to the first aspect of the present invention, wherein the gate trench is divided into lines of unit gate trenches arranged at regular intervals, and a connecting portion of the first main electrode and the second and third semiconductor layers is divided into a plurality of regions interposed between the lines of the unit gate trenches.

A third aspect of the present invention is directed to the semiconductor device according to the second aspect of the present invention, wherein the fourth semiconductor layer is a semiconductor layer of a second conductivity type, and the connecting portion is provided thinly in a part of the regions.

A fourth aspect of the present invention is directed to the semiconductor device according to the second aspect of the present invention, wherein the fourth semiconductor layer is a semiconductor layer of a second conductivity type, the third semiconductor layer retreats on a side wall facing the fourth semiconductor layer in a central position of each of the regions from the side wall toward an opposite side or up to the opposite side, and the connecting portion includes at least a part of the exposed surface of a portion of the second semiconductor layer which fills up a retreating portion of the third semiconductor layer.

A fifth aspect of the present invention is directed to the semiconductor device according to the fourth aspect of the present invention, further comprising a fifth semiconductor layer of a second conductivity type which is selectively formed in the retreating portion of the third semiconductor layer and has a higher impurity concentration than that of the second semiconductor layer.

A sixth aspect of the present invention is directed to the semiconductor device according to the first or second aspect of the present invention, wherein the fourth semiconductor layer is a semiconductor layer of a second conductivity type.

A seventh aspect of the present invention is directed to the semiconductor device according to any of the third to sixth aspects of the present invention, wherein the first main electrode is connected to exposed surfaces of the second and third semiconductor layers across the edge of the third semiconductor layer which is closer to the second main electrode.

An eighth aspect of the present invention is directed to the semiconductor device according to the first or second aspect of the present invention, wherein the fourth semiconductor layer is a semiconductor layer of a first conductivity type having a higher impurity concentration than that of the first semiconductor layer.

A ninth aspect of the present invention is directed to the semiconductor device according to any of the first to eighth aspects of the present invention, wherein the gate trench also extends to a portion of the first semiconductor layer on an outside beyond the edge of the second semiconductor layer which is closer to the second main electrode.

A tenth aspect of the present invention is directed to the semiconductor device according to any of the third to seventh aspects of the present invention, wherein the gate trench extends to a portion of the first semiconductor layer on an outside beyond the edge of the second semiconductor layer which is closer to the second main electrode, and the gate trench projects in a direction orthogonal to an extension direction on an end closer to the second main electrode in the extension direction.

An eleventh aspect of the present invention is directed to the semiconductor device according to any of the first to tenth aspects of the present invention, wherein the gate trench is defined deeper than the second semiconductor layer.

A twelfth aspect of the present invention is directed to the semiconductor device according to any of the first to eleventh aspects of the present invention, further comprising a substrate insulation film covering the other principal surface of the first semiconductor layer, and a semiconductor substrate covering the substrate insulation film.

A thirteenth aspect of the present invention is directed to the semiconductor device according to the twelfth aspect of the present invention, wherein a bottom portion of the gate trench reaches the substrate insulation film, the first semiconductor layer further defines an isolation trench open to one of the principal surfaces, and the isolation trench has an annular shape to enclose the second, third and fourth semiconductor layers and the gate trench, and has a bottom portion which reaches the substrate insulation film, the semiconductor device further comprising an isolation insulation film covering an internal wall of the isolation trench which is defined by the first semiconductor layer, and an isolation electrode buried in the isolation trench with the isolation insulation film interposed therebetween.

A fourteenth aspect of the present invention is directed to the semiconductor device according to any of the third to seventh and tenth aspects of the present invention, further comprising a semiconductor well layer of a first conductivity type which is selectively formed on the first semiconductor layer and has a higher impurity concentration than that of the first semiconductor layer, wherein the semiconductor well layer is in contact with the second semiconductor layer on a side of the second semiconductor layer which is closer to the second main electrode.

A fifteenth aspect of the present invention is directed to the semiconductor device according to the fourteenth aspect of the present invention, further comprising a substrate insulation film covering the other principal surface of the first semiconductor layer, a semiconductor substrate covering the substrate insulation film, and a semiconductor well layer of a first conductivity type which is selectively formed on the first semiconductor layer and has a higher impurity concentration than that of the first semiconductor layer, wherein the semiconductor well layer is in contact with the second semiconductor layer on a side of the second semiconductor layer which is closer to the second main electrode, and has a bottom portion which reaches the substrate insulation film.

A sixteenth aspect of the present invention is directed to the semiconductor device according to any of the first to fifteenth aspects of the present invention, wherein a material of the first semiconductor layer is single-crystalline silicon, and a <100> orientation of the single-crystalline silicon is coincident with an extension direction of the gate trench.

A seventeenth aspect of the present invention is directed to the semiconductor device according any of the first to sixteenth aspects of the present invention, further comprising an insulation layer and a field plate opposite to each other through the insulation layer in a region interposed between the first and second main electrodes in one of the principal surfaces of the first semiconductor layer, wherein an end of the field plate which is closer to the first main electrode is electrically connected to the first main electrode or the gate electrode, and an end of the field plate which is closer to the second main electrode is electrically connected to the second main electrode.

An eighteenth aspect of the present invention is directed to the semiconductor device according any of the first to seventeenth aspects of the present invention, further comprising a bottom semiconductor layer of a first conductivity type which is selectively formed between the other principal surface of the first semiconductor layer and the second semiconductor layer and has a higher impurity concentration than that of the first semiconductor layer.

A nineteenth aspect of the present invention is directed to a method for manufacturing a semiconductor device comprising the steps of preparing a first semiconductor layer of a first conductivity type having one of principal surfaces and the other principal surface, selectively forming a second semiconductor layer of a second conductivity type on one of the principal surfaces of the first semiconductor layer, selectively forming a third semiconductor layer of a first conductivity type, on an inside of an exposed surface of the second semiconductor layer, wherein the third semiconductor layer is shallower than the second semiconductor layer and has a higher impurity concentration than that of the first semiconductor layer, forming a gate trench open to one of the principal surfaces on the first semiconductor layer, forming a gate insulation film so as to cover an internal wall of the gate trench which is defined by the first semiconductor layer, burying a gate electrode in the gate trench with the gate insulation film interposed therebetween, forming a fourth semiconductor layer which is selectively exposed to one of the principal surfaces of the first semiconductor layer apart from the second semiconductor layer, connecting a first main electrode to the second and third semiconductor layers, and connecting a second main electrode to the fourth semiconductor layer.

At the gate trench forming step, the gate trench is formed so as to extend in a direction from the third semiconductor layer toward the second main electrode, and to traverse at least from an edge of the third semiconductor layer which is closer to the second main electrode to an edge of the second semiconductor layer which is closer to the second main electrode.

A twentieth aspect of the present invention is directed to the method for manufacturing a semiconductor device according to the nineteenth aspect of the present invention, wherein the preparing step includes the steps of preparing a semiconductor substrate having one of principal surfaces and the other principal surface, forming a substrate insulation film on one of the principal surfaces of the semiconductor substrate, and forming the first semiconductor layer on the substrate insulation film.

At the gate trench forming step, the gate trench is formed in such a manner that a bottom portion of the gate trench reaches the substrate insulation film, the manufacturing method further comprising the steps of forming an isolation trench open to one of the principal surfaces on the first semiconductor layer simultaneously with the gate trench forming step, forming an isolation insulation film so as to cover an internal wall of the isolation trench which is defined by the first semiconductor layer simultaneously with the gate insulation film forming step, and burying an isolation electrode in the isolation trench with the isolation insulation film interposed therebetween, simultaneously with the gate electrode forming step.

At the isolation trench forming step, the isolation trench is formed so as to have an annular shape to enclose the second, third and fourth semiconductor layers and the gate trench and so as to have a bottom portion which reaches the substrate insulation film.

According to the first aspect of the present invention, the gate electrode buried in the gate trench is opposite to a vertical section of the second semiconductor layer. Therefore, a channel width has a great choice and can widely be changed almost freely by regulating the number of the gate trenches, a depth thereof, a width thereof, and the like. In other words, an ON-state voltage can widely be varied and can be set lower than in an device according to the prior art.

According to the second aspect of the present invention, the gate trench is formed in the line of the unit gate trenches arranged at regular intervals. Therefore, the channel width of the whole device can be kept great so that the ON-state voltage can be reduced. Furthermore, the gate trench, that is, the line of the unit gate trenches extends in the direction toward the second main electrode. Therefore, if the number of the unit gate trenches is increased, the channel width can be increased effectively. As a result, the ON-state voltage can effectively be reduced.

According to the third aspect of the present invention, the connecting portion of the first main electrode and the second and third semiconductor layers is divided into a plurality of regions interposed the unit gate trenches, and a part thereof is provided thinly. Therefore, a current of a carrier (a first type of carrier) injected from the fourth semiconductor layer goes around the thin region. Therefore, a density of the current of the first type of carrier is increased around the region. Consequently, conductivity modulation is increased. As a result, the ON-state voltage can be reduced still more.

According to the fourth aspect of the present invention, the retreating portion is formed on the third semiconductor layer, and the first main electrode is connected to the retreating portion. Therefore, a voltage drop caused by the current of the first type of carrier passing through the second semiconductor layer is suppressed. Consequently, a latch-up tolerance can be enhanced.

According to the fifth aspect of the present invention, the fifth semiconductor layer having a high impurity concentration is inserted in the retreating portion of the fourth semiconductor layer. Therefore, the voltage drop is further suppressed. As a result, the latch-up tolerance can be enhanced more.

According to the sixth aspect of the present invention, the fourth semiconductor layer is the semiconductor layer of the second conductivity type. Therefore, the device functions as an IGBT. More specifically, the ON-state voltage can effectively be reduced by the conductivity modulation generated by the current of the first type of carrier. By regulating a dimension of the gate trench, a shape thereof and the like, an area of an accumulation layer of the first type of carrier can widely be varied almost freely in addition to the channel width. Therefore, the ON-state voltage can further be reduced.

According to the seventh aspect of the present invention, the first main electrode is connected to the exposed surfaces of the second and third semiconductor layers across the edge of the third semiconductor layer which is closer to the second main electrode. Therefore, the current of the first type of carrier passing through the second semiconductor layer does not need to set, as a path, a transverse resistor provided under the third semiconductor layer. Accordingly, a voltage drop of the third semiconductor layer caused by the transverse resistor is suppressed. Thus, the latch-up tolerance can be enhanced.

According to the eighth aspect of the present invention, the semiconductor well layer having a higher impurity concentration than that of the first semiconductor layer is provided. Therefore, the first type of carrier is accumulated in the vicinity of a boundary between the first semiconductor layer and the semiconductor well layer. Consequently, the conductivity modulation is increased more. Thus, the ON-state voltage can further be reduced.

According to the ninth aspect of the present invention, the semiconductor well layer having a higher impurity concentration than that of the first semiconductor layer is provided. Therefore, the first type of carrier is accumulated in the vicinity of the boundary between the first semiconductor layer and the semiconductor well layer. Consequently, the conductivity modulation is increased more. Thus, the ON-state voltage can further be reduced. Furthermore, the bottom portion of the semiconductor well layer reaches the substrate insulation film. Therefore, the semiconductor well effectively interferes with the path for the current of the first type of carrier. As a result, the effect of accumulating the first type of carrier can be increased more. Consequently, the ON-state voltage can effectively be reduced.

According to the tenth aspect of the present invention, the gate trench has a projecting portion on the end closer to the second main electrode. Therefore, the density of the first type of carrier is increased by the current of the first type of carrier which goes around in the vicinity of the projecting portion. As a result, the conductivity modulation is increased. Thus, the ON-state voltage can be reduced still more.

According to the eleventh aspect of the present invention, the fourth semiconductor layer is the semiconductor layer of a first conductivity type having a higher impurity concentration than that of the first semiconductor layer. Therefore, the device functions as a MOS transistor. In other words, a MOS transistor having a high switching speed and a low ON-state voltage can be implemented.

According to the twelfth aspect of the present invention, the gate trench having the gate electrode buried therein extends to the first semiconductor layer toward the second main electrode beyond the second semiconductor layer. Therefore, the gate electrode also functions as a field plate. Consequently, a breakdown voltage of the device can be enhanced. If the fourth semiconductor layer is the second conductivity type, the current can depend on the first type of carrier. Therefore, a portion of the first semiconductor layer opposite to the gate electrode also functions as an accumulation layer of the first type of carrier. As a result, the ON-state voltage can be reduced still more.

According to the thirteenth aspect of the present invention, the gate trench is deeper than the second semiconductor layer. Therefore, the channel width is kept greater. Consequently, the ON-state voltage can be reduced still more. As a result, a curved portion of the second semiconductor layer in which an electric field easily concentrates is covered. Therefore, the effect of alleviating the concentration of the electric field can further be increased, and the breakdown voltage can be enhanced still more.

According to the fourteenth aspect of the present invention, the device has a SOI structure. Although the gate trench is formed on the first semiconductor layer acting as a SOI layer, it extends in the direction toward the second main electrode. Therefore, even if a thickness of the SOI layer has manufacturing errors, a path for a main current is less affected. In other words, even if the thickness of the SOI layer is changed, the ON-state voltage fluctuates with difficulty.

According to the fifteenth aspect of the present invention, the isolation trench is formed. Therefore, it is possible to form another kind of element on an outside of the isolation trench. In the same manner as the isolation trench, the gate trench has such a depth as to reach the substrate insulation film. Therefore, these trenches can be formed simultaneously at the same step. In other words, a manufacturing process can be simplified.

According to the sixteenth aspect of the present invention, the <100> orientation of the single-crystalline silicon which is the material of the first semiconductor layer is coincident with the extension direction of the gate trench. More specifically, the gate trench extends in a direction of the highest mobility. Consequently, the ON-state voltage can be reduced still more.

According to the seventeenth aspect of the present invention, the field plate is provided. Therefore, the breakdown voltage can be enhanced.

According to the eighteenth aspect of the present invention, the bottom semiconductor layer is provided in a region in which the current relatively concentrates. Therefore, a voltage drop is suppressed in the same region. Consequently, the ON-state voltage can be reduced still more.

According to the nineteenth aspect of the present invention, known steps are combined so that the semiconductor device of the present invention can easily be manufactured.

According to the twentieth aspect of the present invention, the gate trench and the isolation trench, the gate insulation film and the isolation insulation film, and the gate electrode and the isolation electrode are formed simultaneously at the same steps, respectively. In other words, the semiconductor device of the present invention can be manufactured by a more simplified method.

In order to solve the above-mentioned problems of the prior art, it is an object of the present invention to provide a semiconductor device having a low ON-state voltage and a high latch-up tolerance.

It is another object of the present invention to provide a method suitable for manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Embodiment

First of all, a semiconductor device and a method for manufacturing the same according to a first embodiment will be described below.

1—1. Structure of Device

Figure 2:
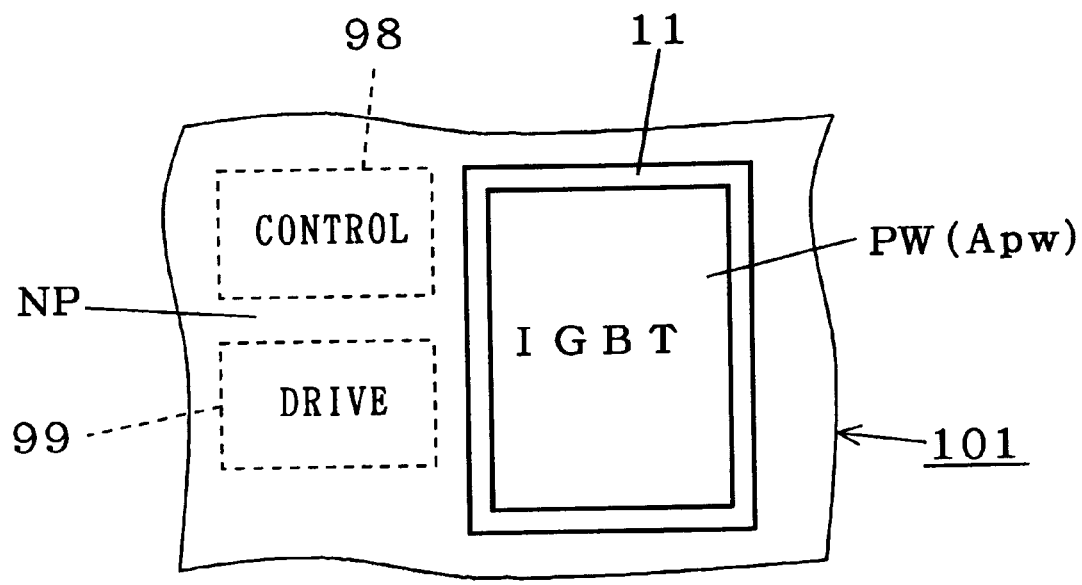
FIG. 2 is a plan view showing the device according to the first embodiment.

FIG. 2 is a partial plan view showing a semiconductor device according to the first embodiment. As shown in FIG. 2, an device 101 has a power section PW and a non-power section NP formed on the same semiconductor substrate. An IGBT is formed as a power element on the power section PW. For example, a drive section 99 for driving the IGBT and a control section 98 for controlling the drive section 99 are formed on the non-power section NP. The power section PW is enclosed by an isolation trench 11 in such a manner that a current having a great magnitude which flows in the power section PW does not leak to the non-power section NP to interfere with operation of the non-power section NP. An area of the power section PW enclosed by the isolation trench 11 will be hereinafter referred to as a total area Apw.

Figure 1:
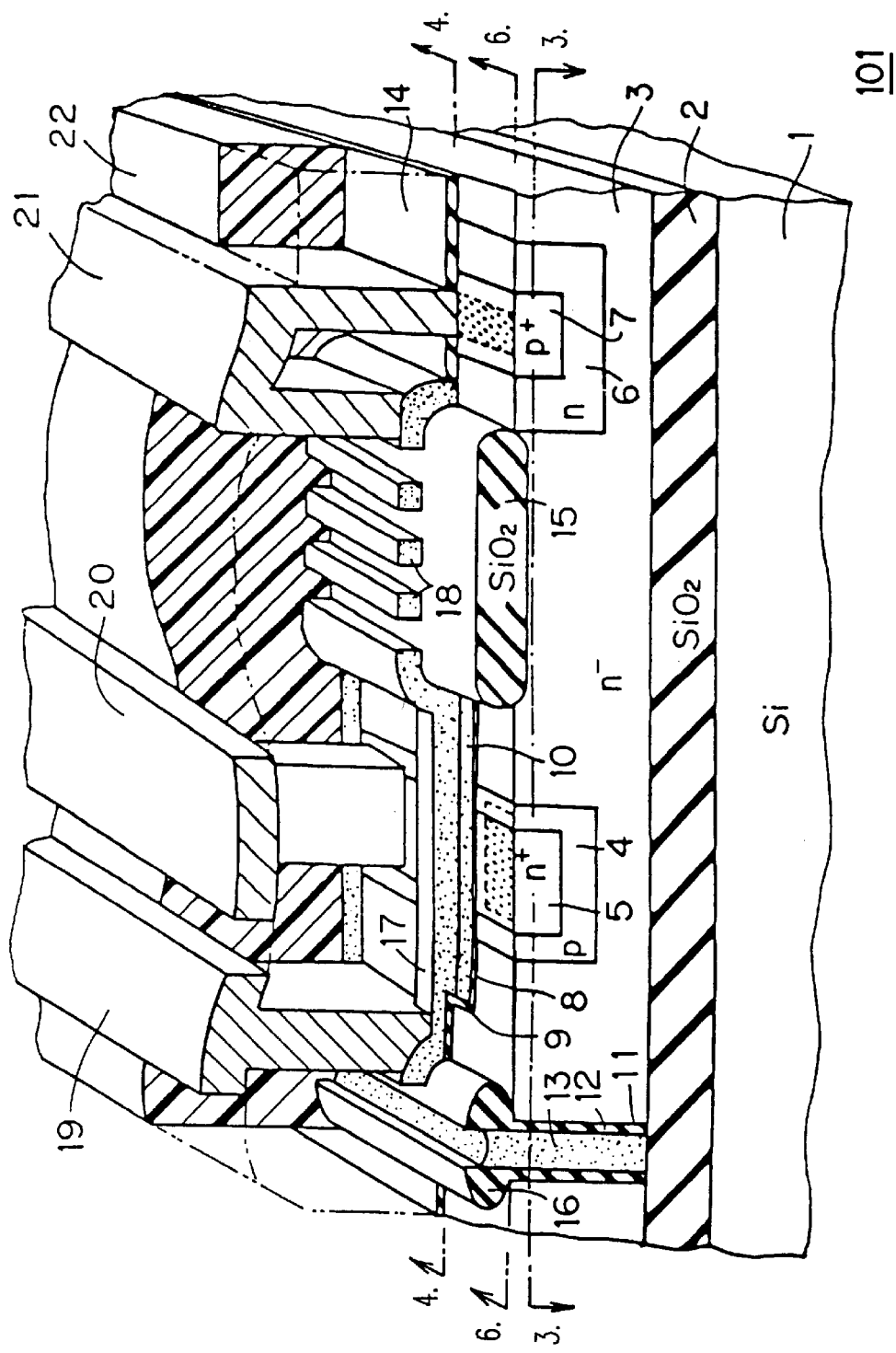
FIG. 1 is a sectional perspective view showing an device according to a first embodiment.
Figure 3:
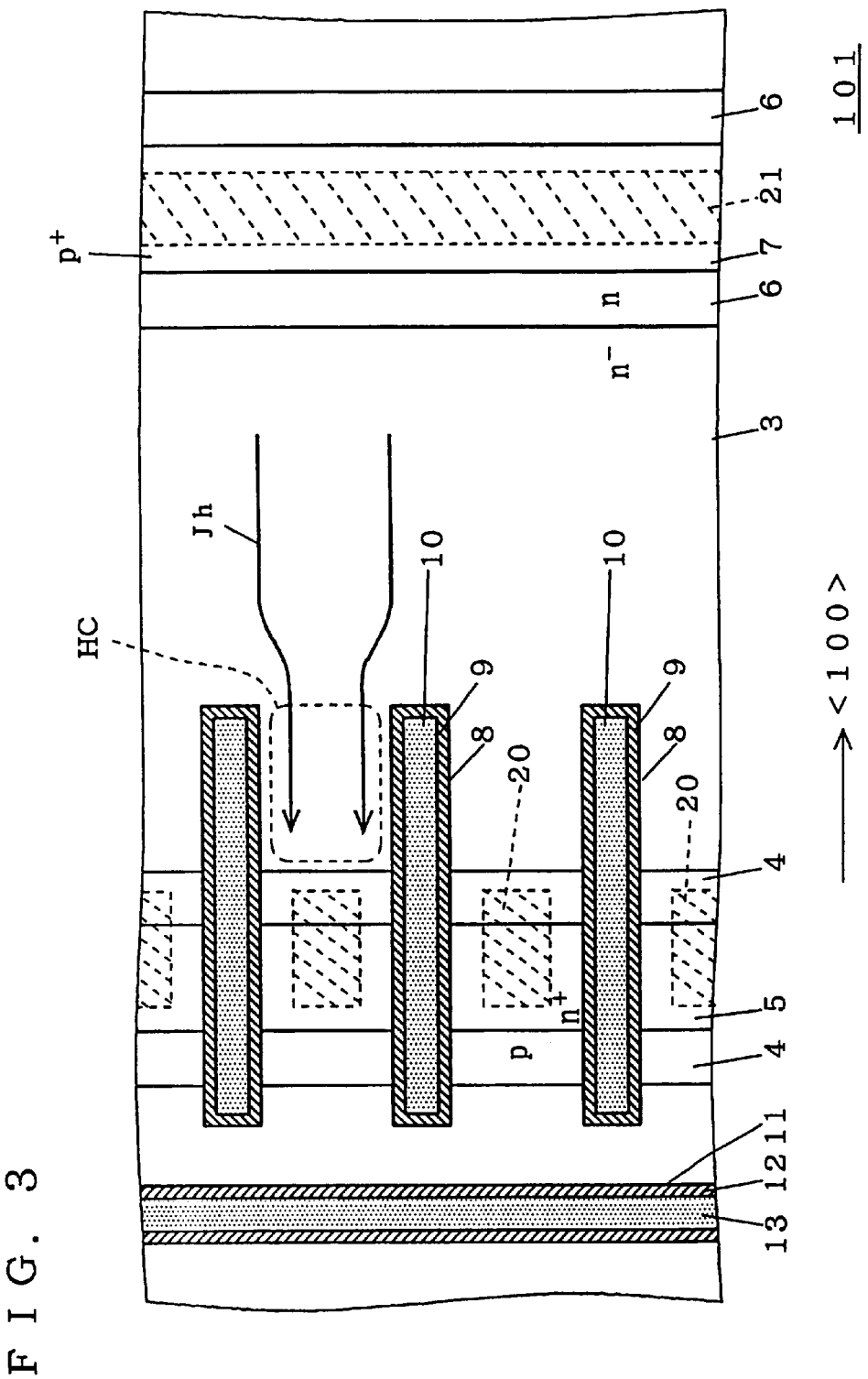
FIG. 3 is a sectional view taken along the line D—D shown in FIG. 1.
Figure 4:
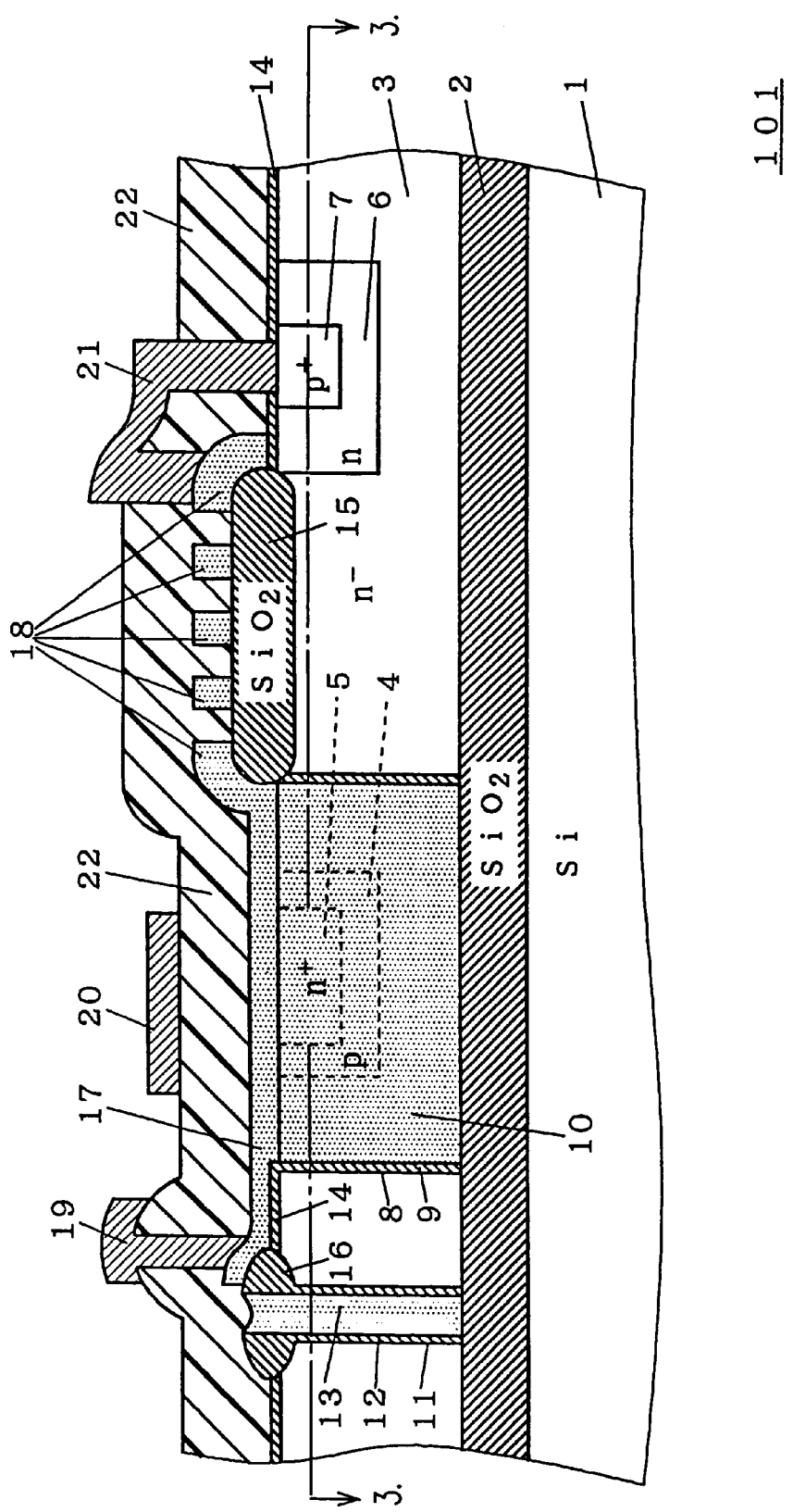
FIG. 4 is a sectional view taken along the line B—B shown in FIG. 1.
Figure 5:
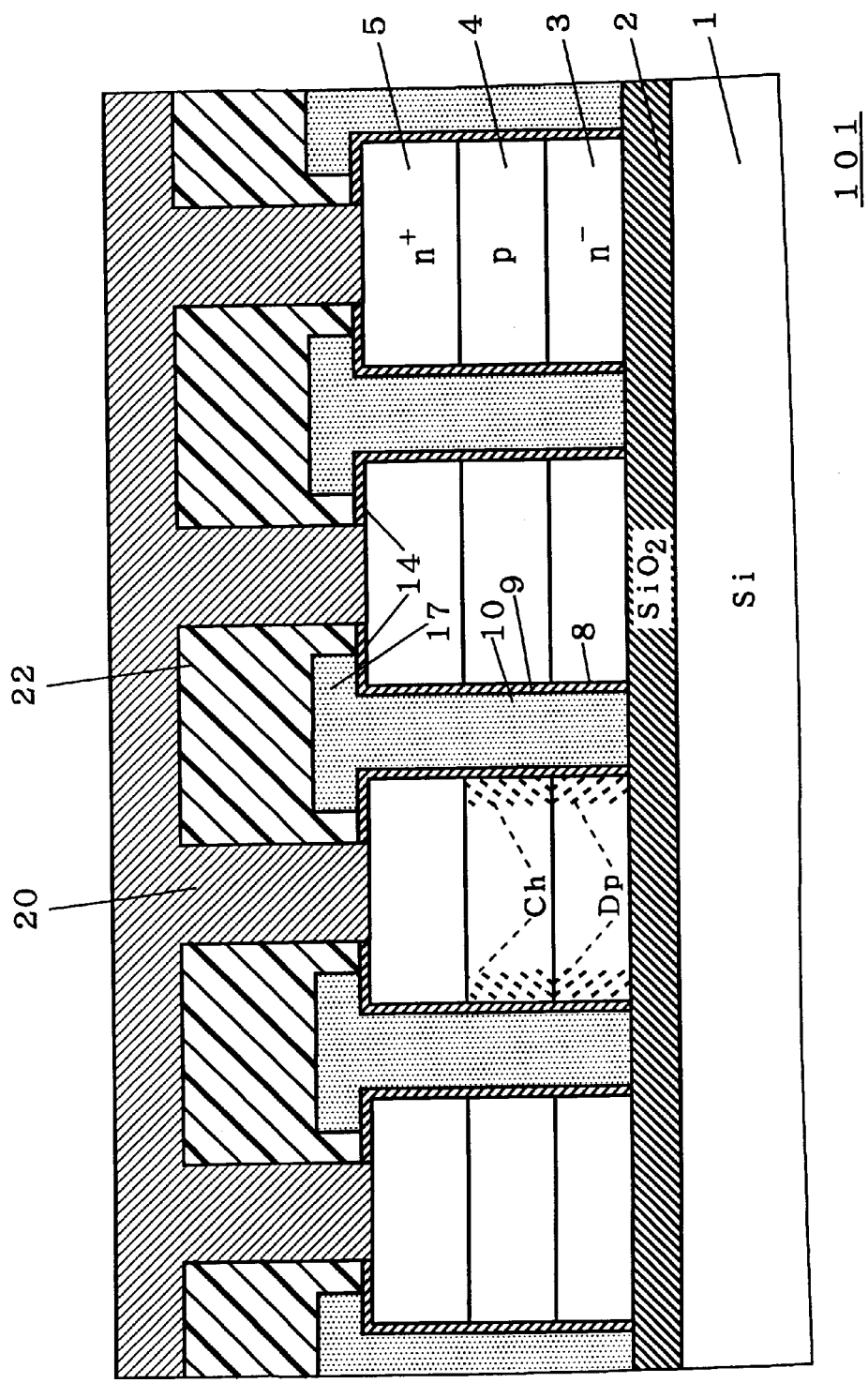
FIG. 5 is a sectional view taken along the line E—E shown in FIG. 3.
Figure 6:
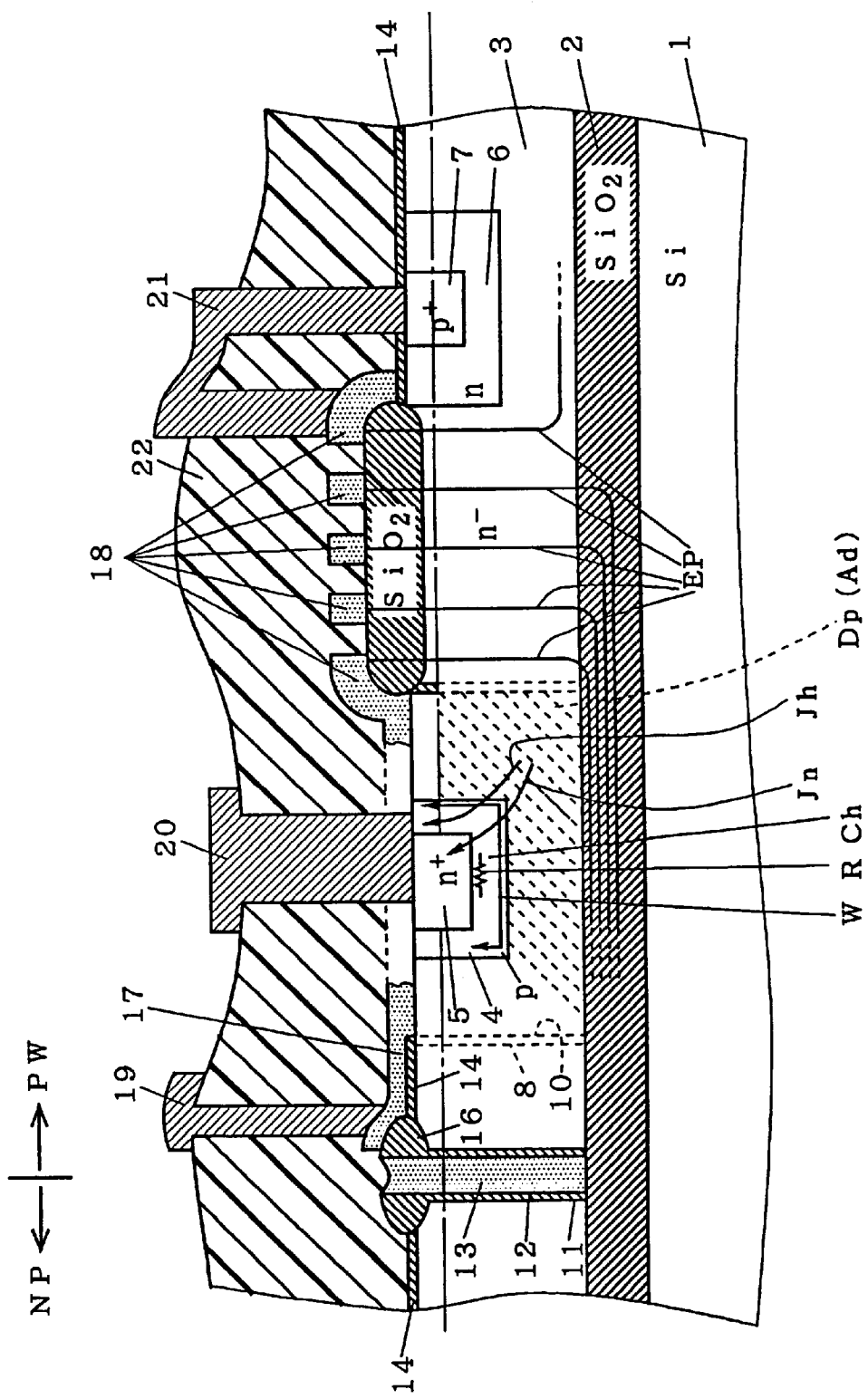
FIG. 6 is a sectional view taken along the line A—A shown in FIG. 1.

FIG. 1 is a sectional perspective view showing the power section PW forming a main part of the device 101. FIG. 3 is a sectional plan view taken along the line D—D shown in FIG. 1. FIG. 4 is a sectional front view taken along the line B—B. FIG. 5 is a sectional side view taken along the line E—E shown in FIG. 3. FIG. 6 is a sectional view taken along the line A—A shown in FIG. 1 or FIG. 3, and also explains operation of the device. A structure of the device 101 will be described below with reference to FIGS. 1 to 6.

The device 101 comprises a SOI wafer. The SOI wafer includes a silicon substrate (a semiconductor substrate) 1, a silicon oxide film (a substrate insulation film) 2 formed on the silicon substrate 1, and an n-type silicon layer (an active layer or a SOI layer; a first semiconductor layer) 3 formed on the silicon oxide film 2. A concentration of an n-type impurity contained in the n-type silicon layer 3 is set low in such a manner that a specific resistance has a value of 3 to 10 Ω·cm, for example. In an example in which a maximum rating of a breakdown voltage of the device 101 is 600 V, a thickness of the silicon oxide film 2 is preferably set to 1 to 8 $\mu$m, and a thickness of the n-type silicon layer 3 is set to 5 to 20 $\mu$m, and more preferably to 8 $\mu$m or less.

A so-called transverse (or lateral) type n-channel IGBT is formed on the power section PW enclosed by the isolation trench 11. More specifically, a p-type base layer (a second semiconductor layer) 4 and an n-type buffer layer 6 are selectively formed apart from each other on an upper principal surface of the n-type silicon layer 3. The p-type base layer 4 and the n-type buffer layer 6 are formed like bands parallel with each other. A concentration of an n-type impurity contained in the n-type buffer layer 6 is set higher than in the n-type silicon layer 3.

Furthermore, an n-type emitter layer (a third semiconductor layer) 5 is selectively formed on an exposed surface of the p-type base layer 4. The n-type emitter layer 5 is formed like a band along the p-type base layer 4, and is formed on an inside of the p-type base layer 4 so as not to come off the p-type base layer 4. More specifically, the n-type emitter layer 5 and the n-type silicon layer 3 are separated from each other with the p-type base layer 4 having a certain thickness interposed therebetween. A concentration of an n-type impurity contained in the n-type emitter layer 5 is set much higher than in the n-type buffer layer 6.

Similarly, a p-type collector layer (a fourth semiconductor layer) 7 is selectively formed on an exposed surface of the n-type buffer layer 6. The p-type collector layer 7 is formed like a band along the n-type buffer layer 6, and is formed on an inside of the n-type buffer layer 6 so as not to come off the n-type buffer layer 6. More specifically, the p-type collector layer 7 and the n-type silicon layer 3 are separated from each other with the n-type buffer layer 6 having a certain thickness interposed therebetween.

A concentration of a p-type impurity contained in the p-type collector layer 7 is set higher than in the p-type base layer 4. The n-type buffer layer 6 is provided in such a manner that a punch-through can be prevented and a space between the n-type emitter layer 5 and the p-type collector layer 7 can be reduced.

An emitter electrode (a first main electrode) 20 is connected across an exposed surface of the n-type emitter layer 5 and that of the p-type base layer 4. A collector electrode (a second main electrode) 21 is connected to an upper principal surface of the p-type collector layer 7. The collector electrode 21 is connected to the p-type collector layer 7 in a band region provided along the p-type collector layer 7. The emitter electrode 20 and the collector electrode 21 form a pair of main electrodes which function as paths for a collector current (main current). Both the main electrodes are connected to one of principal surfaces (the upper principal surface) of the n-type silicon layer 3. Therefore, this IGBT belongs to a "transverse type" IGBT.

Furthermore, the isolation trench 11 open to the upper principal surface is formed on the n-type silicon layer 3. As described above, the isolation trench 11 is annularly provided so as to enclose the power section PW. A bottom portion of the isolation trench 11 reaches an upper principal surface of the silicon oxide film 2. In other words, the isolation trench 11 is formed so as to penetrate from the upper principal surface of the n-type silicon layer 3 to a lower principal surface thereof.

An internal wall of the isolation trench 11 which is defined by the n-type silicon layer 3, that is, a side wall thereof is covered with an isolation insulation film 12. An isolation electrode 13 is buried in the isolation trench 11 on an inside of the isolation insulation film 12. In other words, the isolation electrode 13 is buried in the isolation trench 11 with the isolation insulation film 12 interposed therebetween. The isolation insulation film 12 is formed of a silicon oxide film, and the isolation electrode 13 is formed of polysilicon doped with impurities.

A plurality of band-shaped gate trenches (unit gate trenches) 8 open to the principal surface are further formed on the n-type silicon layer 3 so as to divide the band-shaped p-type base layer 4 and the band-shaped n-type emitter layer 5. The gate trench 8 extends orthogonally to a longitudinal direction of the band-shaped p-type base layer 4, i.e., in a direction from the n-type emitter layer 5 toward the collector electrode 21 (or the p-type collector layer 7). A bottom portion of the gate trench 8 reaches the upper principal surface of the silicon oxide film 2. In the same manner as the isolation trench 11, the gate trench 8 is formed so as to penetrate from the upper principal surface of the n-type silicon layer 3 to the lower principal surface thereof. As shown in FIG. 3, a crystal orientation of the n-type silicon layer 3 is preferably selected in such a manner that a <100> orientation in which a mobility of a carrier is the highest is coincident with a longitudinal direction of the gate trench 8.

The gate trenches 8 are arranged at regular intervals in parallel with each other. In addition, one of ends of the gate trench 8 in the longitudinal direction toward the collector electrode 21 is positioned in the n-type silicon layer 3 beyond an edge of the p-type base layer 4 which is closer to the collector electrode 21. Furthermore, the other end of the gate trench 8 in the longitudinal direction is positioned in the n-type silicon layer 3 beyond an end of the p-type base layer 4 which is farther from the collector electrode 21. As shown in FIG. 4, a side wall of the gate trench 8 in the longitudinal direction covers the p-type base layer 4 (shown by a dotted line in FIG. 4), and extends into the n-type silicon layer 3 beyond both the edges of the p-type base layer 4.

An internal wall of the gate trench 8 which is defined by the n-type silicon layer 3, that is, a side wall thereof is covered with a gate insulation film 9. A gate electrode 10 is buried in the gate trench 8 on an inside of the gate insulation film 9. In other words, the gate electrode 10 is buried in the gate trench 8 with the gate insulation film 9 interposed therebetween. The gate insulation film 9 is formed of a silicon oxide film in the same manner as the isolation insulation film 12, and has a thickness set to about 100 nm, for example.

In the same manner as the isolation electrode 13, the gate electrode 10 is formed of polysilicon doped with impurities. A region of the p-type base layer 4 interposed between the n-type emitter layer 5 and the n-type silicon layer 3 opposite to the gate electrode 10 functions as a channel region Ch (FIGS. 5 and 6). A region of the n-type silicon layer 3 provided opposite to the gate electrode 10 functions as an accumulation layer Dp of a hole (a first type of carrier) (FIGS. 5 and 6).

Since the trenches 8 are formed, each of the band-shaped p-type base layer 4 and the n-type emitter layer 5 is divided into a plurality of rectangular regions by the trenches 8 as shown in FIGS. 3 and 5. The emitter electrode 20 is connected to each of the regions.

A gate wiring 17 is connected to the gate electrodes 10 buried in the gate trenches 8. The gate wiring 17 is formed of polysilicon doped with impurities in the same manner as the gate electrode 10 and the isolation electrode 13. Furthermore, another gate wiring 19 is connected to the gate wiring 17. The gate wiring 19 is formed of the same material as that of each of the emitter electrode 20 and the collector electrode 21, for example, aluminum. All the gate electrodes 10 are connected to each other through the gate wirings 17 and 19.

The upper principal surface of the n-type silicon layer 3 is covered with an insulation film 14 and LOCOSs (insulation layers) 15 and 16 except for a connecting portion of the emitter electrode 20 and the collector electrode 21. The gate wiring 17 provided along the upper principal surface of the n-type silicon layer 3 and the n-type silicon layer 3 are insulated from each other through the insulation film 14 and the LOCOSs 15 and 16. The insulation film 14 and the LOCOSs 15 and 16 are formed of silicon oxide.

The LOCOS 16 is annularly provided along an opening of the isolation trench 11. The LOCOS 15 is laid between one of ends of the isolation trench 11 which is closer to the collector electrode 21 and one of ends of the n-type buffer layer 6 which is closer to the emitter electrode 20. A field plate 18 is provided on the LOCOS 15. The field plate 18 has one of ends connected integrally with the gate wiring 17 and the other end connected to the collector electrode 21. The field plate 18 is formed by a lot of electrodes arranged with a gap so as to be capacity-coupled in series from the gate wiring 17 to the collector electrode 21. For this reason, an electric potential of the field plate 18 is varied almost continuously from an electric potential of the collector electrode 21 to that of the gate wiring 17 with a movement from one of the ends toward the other end. A material of the field plate 18 is the same as that of the gate wiring 17.

An insulation layer 22 is formed on the insulation film 14 and the LOCOSs 15 and 16 so as to fill up the gaps of the gate wirings 17 and 19, the field plate 18, the emitter electrode 20 and the collector electrode 21. The insulation layer 22 is formed of an insulating material such as TEOS (tetra-ethyl-ortho-silicate) or BPSG (silicate glass containing boron and phosphorus).

1–2. Basic Operation of Device

The operation of the device 101 in which the power section PW forming the main part has the IGBT will be described below with reference to FIG. 6. When using the device 101, an external power supply which is not shown is first connected so that a positive voltage is applied to the collector electrode 21 by using the emitter electrode 20 as a reference. A load which is not shown is usually inserted between the external power supply and the collector electrode 21, for example. In this state, a voltage applied to the gate electrode 10 is regulated so that a magnitude of a main current is controlled.

By using the emitter electrode 20 as a reference, a positive gate voltage which exceeds a predetermined gate threshold voltage is applied to the gate electrode 10 (a gate is turned on). Consequently, an n-type inversion layer is formed in a region of the p-type base layer 4 opposite to the gate electrode 10, that is, the channel region Ch. As a result, the channel region Ch becomes conductive. Therefore, electrons are injected from the emitter electrode 20 to the n-type silicon layer 3 through the n-type emitter layer 5 and the channel region Ch.

Since the p-type collector layer 7 and the n-type silicon layer 3 (including the n-type buffer layer 6) are forward biased by the injected electrons. Therefore, a hole is injected from the p-type collector layer 7 to the n-type silicon layer 3. As a result, conductivity modulation is caused in the n-type silicon layer 3 so that a resistance of the n-type silicon layer 3 is greatly lowered. For this reason, a collector current (a main current) having a great magnitude flows from the collector electrode 21 to the emitter electrode 20. In other words, the emitter electrode 20 and the collector electrode 21 are brought into the conductive state (the ON state). At this time, a voltage across the emitter electrode 20 and the collector electrode 21 is referred to as an ON-state voltage.

Thereafter, the gate voltage applied across the emitter electrode 20 and the gate electrode 10 is returned to zero or a negative (backward bias) value (the gate is turned off). Consequently, the inversion layer formed in the channel region Ch disappears and the channel region Ch returns to an original p-type conductivity type. As a result, the injection of the electrons from the emitter electrode 20 is stopped. Therefore, the injection of the hole from the p-type collector layer 7 into the n-type silicon layer 3 is also stopped.

Then, the electrons and the holes which have stayed in the n-type silicon layer 3 (and the n-type buffer layer 6) are collected into the collector electrode 21 and the emitter electrode 20, respectively, or are recombined with each other to disappear. As a result, the emitter electrode 20 and the collector electrode 21 are brought into a cut-off state (an OFF state) in which a current does not flow.

1–3. Advantage of Device

In the device 101, the whole region of the p-type base layer 4 provided opposite to the gate electrode 10 buried in the gate trench 8 forms the channel region Ch as shown in FIG. 6. As described above, the positive gate voltage is applied to the gate electrode 10 so that the inversion layer is formed in the channel region Ch. At this time, an electronic current Jn passing through the channel region Ch is high in a region of the channel region Ch which is close to the collector electrode 21, and is low in a region of the channel region Ch which is far from the collector electrode 21.

Accordingly, the channel region Ch which essentially functions is generally restricted to a region interposed between a side wall of the n-type emitter layer 5 which is closer to the collector electrode 21 and the n-type silicon layer 3, and a region interposed between a bottom portion of the n-type emitter layer 5 and the n-type silicon layer 3 as shown in FIG. 6. As a result, a width of the channel region Ch, that is, a channel width W is virtually defined within a range shown by an arrow in FIG. 6.

Nevertheless, the channel width W approximates a width of the whole region of the p-type base layer 4 opposite to the gate electrode 10 buried in the gate trench 8. For this reason, a channel width density defined as a ratio of the channel width W of the whole IGBT to the total area Apw of the IGBT (FIG. 2) can easily be set higher than in the device 150 according to the prior art. In particular, if the number of the gate trenches 8 is increased (that is, a space between the gate trenches 8 is reduced), the channel width density can virtually be increased without limit.

As shown by a dotted hatch in FIG. 6, a region of the n-type silicon layer 3 provided opposite to the gate electrode 10 which is adjacent to the virtual channel region Ch corresponds to the accumulation layer Dp which essentially functions. For this reason, an accumulation layer area Ad, that is, an area of the accumulation layer Dp approximates an area of the whole region of the n-type silicon layer 3 provided opposite to the gate electrode 10.

Accordingly, an accumulation layer density defined as a ratio of the accumulation layer Dp of the whole IGBT to the total area Apw of the IGBT (FIG. 2) can easily be set higher than in the device 150 according to the prior art in the same manner as the channel width density. In particular, if the number of the gate trenches 8 is increased, the accumulation layer density can virtually be increased without limit.

As described above, the device 101 has the gate electrode 10 buried in the gate trench 8. Consequently, the channel width density and the accumulation layer density can be set higher than in the device 150 according to the prior art. If the channel width density is higher, a magnitude of the electronic current Jn is increased. Accordingly, a magnitude of the hole current Jh is also increased. As a result, a main current having a great magnitude flows with the same collector-emitter voltage, which means that a main current having the same magnitude is obtained with a low collector-emitter voltage, that is, the ON-state voltage is low.

When the accumulation layer density is high, a voltage drop generated on the accumulation layer is suppressed even if the main current has the same magnitude. In other words, if the accumulation layer density is higher, the ON-state voltage is reduced more.

Furthermore, the hole current Jh flowing in the n-type silicon layer 3 goes around the gate trench 8 as shown in FIG. 3. As a result, a density of the hole current Jh is increased in a region HC interposed between the adjacent gate trenches 8. In other words, the hole is accumulated at a high density in the region HC. As a result, the electronic current Jn is further increased and the conductivity modulation in the n-type silicon layer 3 is further increased. More specifically, the main current is further increased with the same emitter-collector voltage, and the emitter-collector voltage is further lowered with the same main current. In other words, the ON-state voltage is further reduced.

In the device 101, thus, it is possible to enhance the accumulation layer density in addition to the channel width density, and to effectively reduce the ON-state voltage through the effect of accumulating the hole in the region HC.

Depending on a crystal orientation, a mobility of the electrons is varied in the following manner. While the mobility of the electrons in a <110> orientation is about 300 cm$^2$/V·s, the mobility of the electrons in a <100> orientation is about 450 cm$^2$/V·s. Accordingly, when a crystal orientation of the n-type silicon layer 3 is selected in such a manner that the <100> orientation in which a mobility of a carrier is high is coincident with the longitudinal direction of the gate trench 8 as shown in FIG. 3, more electrons are injected from the n-type emitter layer 5 to the n-type silicon layer 3. In other words, the magnitude of the electronic current Jn is increased. As a result, the ON-state voltage is reduced more.

Furthermore, the gate trenches 8 in which the gate electrodes 10 are buried are formed in such a manner that their longitudinal directions go toward the collector electrode 21. Therefore, any channel region Ch adjacent to the gate trenches 8 functions identically. More specifically, it is assumed that the gate trench 8 is formed in a direction deviated from the direction toward the collector electrode 21, for example, in an orthogonal direction. As compared with this form, the channel width density and the accumulation layer density are increased more effectively according to an increase in the number of the gate trenches 8 in the device 101. In the device 101, the channel width density and the accumulation layer density can be increased most effectively in the various virtual forms having different directions of the gate trench 8.

In the device 101, moreover, the gate electrodes 10 are widely provided opposite to each other in a portion surrounding the p-type base layer 4 in the n-type silicon layer 3. In general, an electric field easily concentrates in a curved portion of the p-type base layer 4. In the device 101, however, the gate electrode 10 is buried orthogonally to an equipotential surface in a region in which the electric field easily concentrates. Therefore, concentration of the electric field is alleviated or eliminated. In other words, the gate electrode 10 also functions as a field plate. Consequently, a breakdown voltage of the device can be enhanced.

In the device 101, furthermore, the field plate 18 is provided through the LOCOS 15 on an upper principal surface of the region interposed between the gate trench 8 of the n-type silicon layer 3 and the n-type buffer layer 6. Therefore, distribution of the electric field in this region can be kept relatively constant as shown by an equipotential line EP in FIG. 6. For this reason, the breakdown voltage of the device can further be enhanced.

In the device 101, the gate electrode 10 is buried in the gate trench 8 differently from the device 150 according to the prior art in which a gate electrode is provided opposite to an upper principal surface of a p-type, base layer 154. Therefore, a connecting portion of the emitter electrode 20 and the p-type base layer 4 can be set to the upper principal surface of the p-type base layer 4 which is closer to the collector electrode 21 than the n-type emitter layer 5 as shown in FIG. 6. For this reason, the hole current Jh flowing from the n-type silicon layer 3 to the emitter electrode 20 through the p-type base layer 4 does not need to pass through the region of the p-type base layer 4 provided under the n-type emitter layer 5 differently from the device 150 according to the prior art, but passes along a short path in the p-type base layer 4.

In the device 101, it is possible to alleviate or eliminate a voltage drop caused by the hole current Jh passing through the transverse (lateral) resistance R of the p-type base layer 4 provided under the n-type emitter layer 5. Consequently, a latch-up tolerance (which is usually evaluated by an upper limit value of the main current for causing no latch-up) can be enhanced.

The isolation trench 11 is provided in order to prevent a part of the main current having a great magnitude flowing in the power section PW, that is, the IGBT from leaking to the non-power section NP. Therefore, the isolation trench 11 has a bottom portion having such a depth as to reach the upper principal surface of the silicon oxide film 2. In the device 101, the gate trench 8, as well as the isolation trench 11, has the bottom portion having such a depth as to reach the upper principal surface of the silicon oxide film 2. The depths of both the trenches are common to each other.

Since the gate trench 8 extends in the direction toward the collector electrode 21, a path for the current is not blocked even if the gate trench 8 is formed in such a manner that the bottom portion thereof has such a depth as to reach the silicon oxide film 2 in the same manner as the isolation trench 11. In other words, since the gate trench 8 extends in the direction toward the collector electrode 21, it can be formed to have a depth equal to that of the isolation trench 11.

Because both the trenches have the depths equal to each other, the gate trench 8 and the isolation trench 11 can simultaneously be formed at the same step when manufacturing the device 101. In other words, the gate trench 8 is provided so that a new manufacturing process does not need to be added. As compared with the device 150 according to the prior art, thus, the device 101 can produce more excellent effects that the ON-state voltage is reduced, the breakdown voltage is enhanced and the latch-up tolerance is enhanced without a complicated manufacturing process and an increase in a manufacturing cost.

1–4. Method for Manufacturing Device

Figure 7:
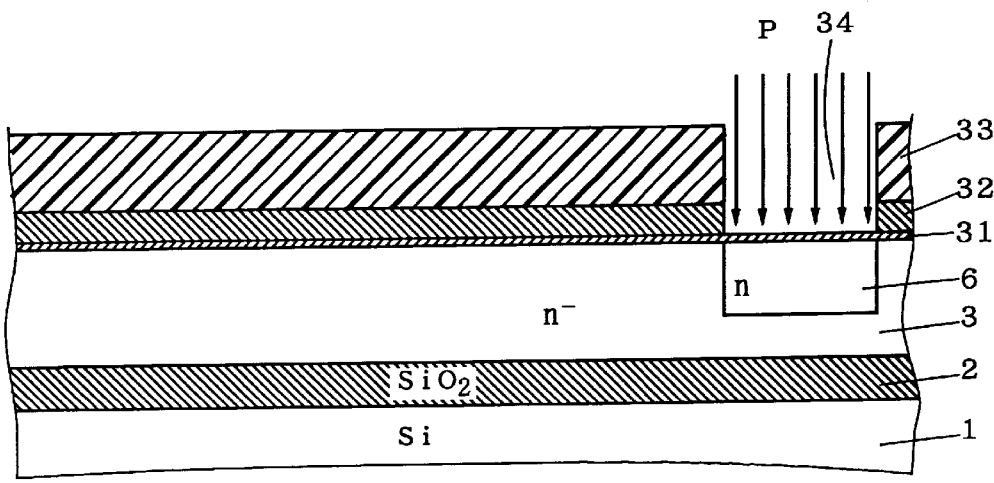
FIG. 7 is a diagram showing a process of manufacturing the device according to the first embodiment.

FIGS. 7 to 25 are diagrams showing a preferred method for manufacturing the device 101. First of all, a step shown in FIG. 7 is performed in order to manufacture the device 101. At the step shown in FIG. 7, a SOI wafer is first prepared. The SOI wafer includes a silicon substrate 1, a silicon oxide film 2 formed on the silicon substrate 1, and an n-type silicon layer 3 formed on the silicon oxide film 2. Then, a silicon oxide film 31 is formed on the n-type silicon layer 3, and a silicon nitride film 32 is deposited on the silicon oxide film 31. After a resist layer 33 is formed on the silicon nitride film 32, an opening 34 is selectively formed in a portion of the resist layer 33 corresponding to an n-type buffer layer 6 by using photolithography. In other words, the resist layer 33 is patterned.

Thereafter, the silicon nitride film 32 is subjected to etching by using the patterned resist layer 33 as a shield. Thus, the silicon nitride film 32 is selectively removed. Subsequently, phosphorus is implanted into an upper principal surface of the n-type silicon layer 3 by using the resist layer 33 and the silicon nitride film 32 as the shields. As a result, the n-type buffer layer 6 is selectively formed in a shape corresponding to the opening 34 on the upper principal surface of the n-type silicon layer 3.

When the implanting step is completed, the resist layer 33, the silicon nitride film 32 and the silicon oxide film 31 are removed. More strictly, after impurities are implanted, the resist layer 33 is removed and a diffusing step of diffusing the impurities is performed. However, it is obvious that the diffusing step is performed incidentally to the implanting step. Therefore, description will be omitted below.

Figure 8:
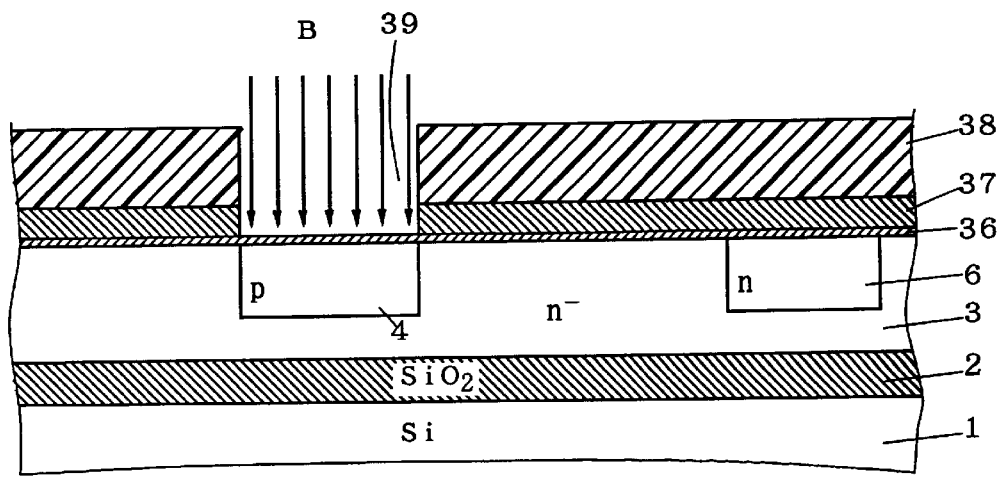
FIG. 8 is a diagram showing the process of manufacturing the device according to the first embodiment.

At a succeeding step shown in FIG. 8, a silicon oxide film 36 is newly provided on the n-type silicon layer 3 in which the n-type buffer layer 6 is formed, and a silicon nitride film 37 is deposited on the silicon oxide film 36. After a resist layer 38 is formed on the silicon nitride film 37, an opening 39 is selectively formed in a portion of the resist layer 38 corresponding to a p-type base layer 4. Etching is carried out by using the resist layer 38 as the shield. Consequently, the silicon nitride film 37 is selectively removed.

Then, boron is implanted into the upper principal surface of the n-type silicon layer 3 by using the resist layer 38 and the silicon nitride film 37 as the shields. As a result, the p-type base layer 4 is selectively formed in a shape corresponding to the opening 39 on the upper principal surface of the n-type silicon layer 3. Thereafter, the resist layer 38, the silicon nitride film 37 and the silicon oxide film 36 are removed.

Figure 9:
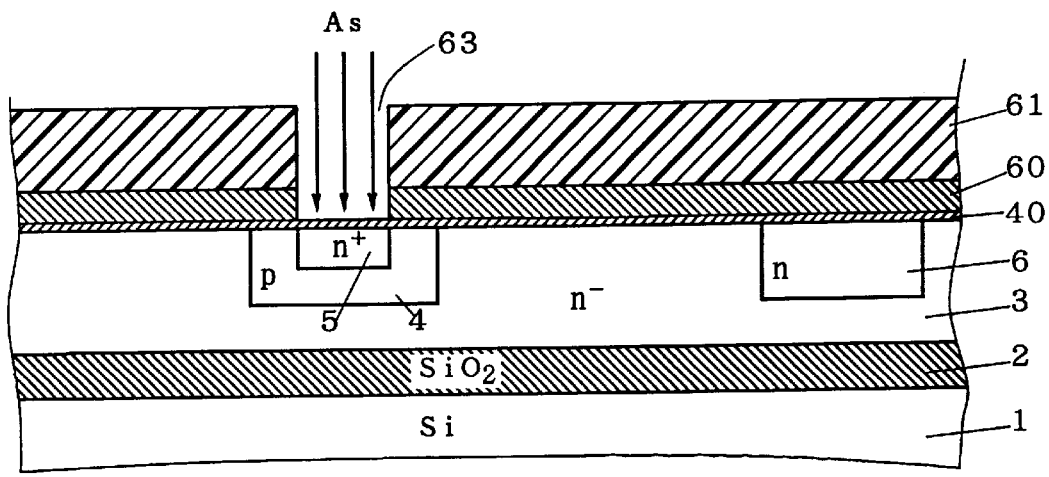
FIG. 9 is a diagram showing the process of manufacturing the device according to the first embodiment.

At a step shown in FIG. 9, a silicon oxide film 40 is newly formed on the n-type silicon layer 3, and a silicon nitride film 60 is deposited on the silicon oxide film 40. After a resist layer 61 is formed on the silicon nitride film 60, an opening 63 is selectively formed in a portion of the resist layer 61 corresponding to an n-type emitter layer 5. Etching is carried out by using the resist layer 61 as the shield. Consequently, the silicon nitride film 60 is selectively removed.

Then, arsenic is implanted into the upper principal surface of the n-type silicon layer 3 by using the resist layer 61 and the silicon nitride film 60 as the shields. As a result, the n-type emitter layer 5 is selectively formed in a shape corresponding to the opening 63, that is, like a band on the p-type base layer 4 on the upper principal surface of the n-type silicon layer 3. Thereafter, the resist layer 61, the silicon nitride film 60 and the silicon oxide film 40 are removed.

Figure 10:
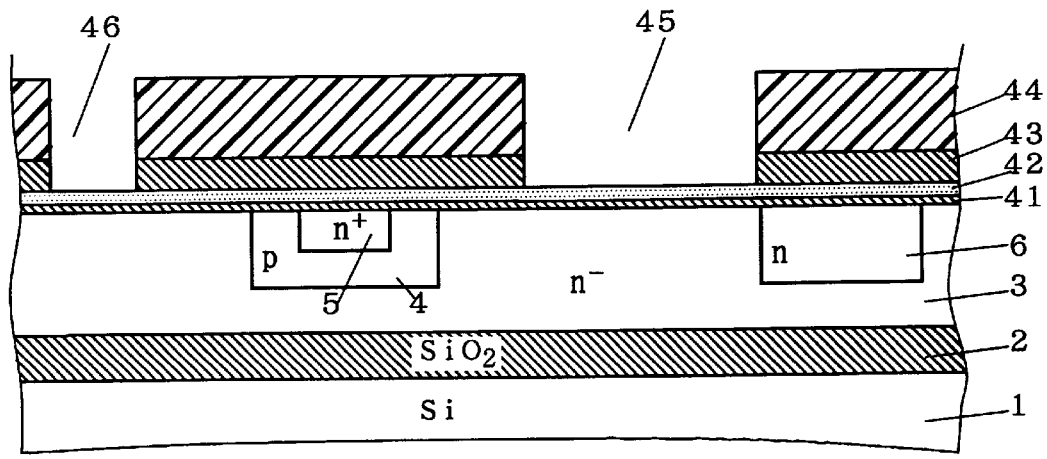
FIG. 10 is a diagram showing the process of manufacturing the device according to the first embodiment.

At a step shown in FIG. 10, a silicon oxide film 41 is newly formed on the n-type silicon layer 3, and a polysilicon film 42 is deposited on the silicon oxide film 41. Then, a silicon nitride film 43 is deposited on the polysilicon film 42, and a resist layer 44 is formed on the silicon nitride film 43. Thereafter, openings 45 and 46 are selectively formed in portions of the resist layer 44 corresponding to LOCOSs 15 and 16, respectively. Etching is carried out by using the resist layer 44 as the shield. Consequently, the silicon nitride film 43 is selectively removed.

Figure 11:
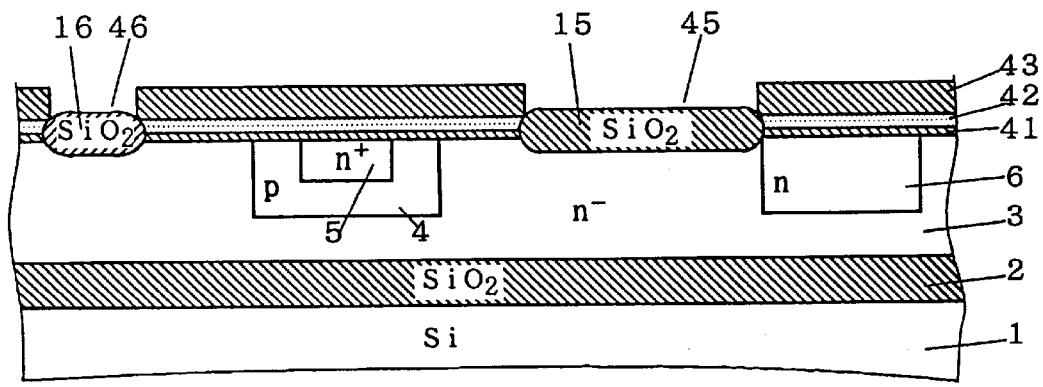
FIG. 11 is a diagram showing the process of manufacturing the device according to the first embodiment.

At a step shown in FIG. 11, after the resist layer 44 is removed, thermal oxidation is performed by using the silicon nitride film 43 as the shield. As a result, the LOCOSs 15 and 16 are selectively formed in shapes corresponding to the openings 45 and 46 on the upper principal surface of the n-type silicon layer 3. Referring to the thermal oxidation, an oxidation temperature is set low, for example, to about 900° C., and an oxidation time is set short, for example, to about 2 hours in such a manner that the n-type impurity contained in the n-type emitter layer 5 is rediffused with difficulty. Then, the silicon nitride film 43, the polysilicon film 42 and the silicon oxide film 41 are removed.

Figure 12:
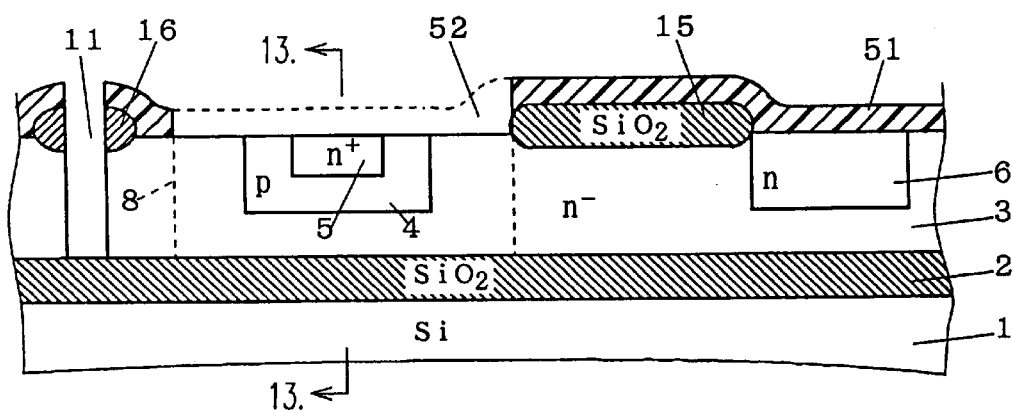
FIG. 12 is a diagram showing the process of manufacturing the device according to the first embodiment.

At a step shown in FIG. 12, a TEOS layer 51 is first deposited on the n-type silicon layer 3 and the LOCOSs 15 and 16. Then, an opening 52 is selectively formed in a portion of the TEOS layer 51 in which a gate trench 8 and an isolation trench 11 are to be formed. The opening 52 is formed on the TEOS layer 51 by using photolithography and selective etching in the same manner as formation of the opening on the resist layer.

Figure 13:
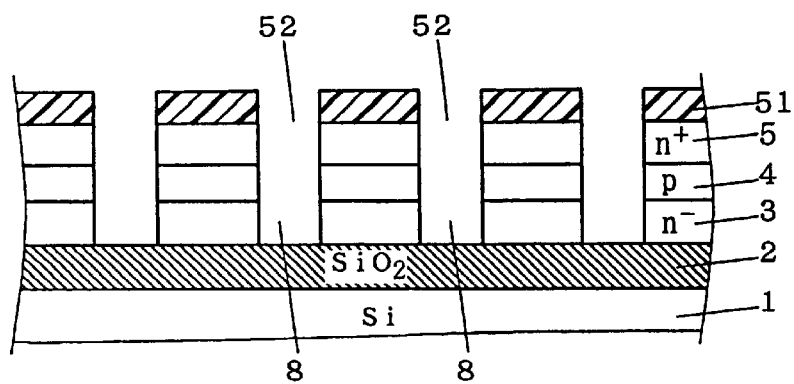
FIG. 13 is a diagram showing the process of manufacturing the device according to the first embodiment.

Then, RIE (reactive ion etching) is carried out by using the patterned TEOS layer 51 as the shield. Consequently, the gate trench 8 and the isolation trench 11 are formed in portions of the n-type silicon layer 3 corresponding to the opening 52. FIG. 13 is a sectional view taken along the line E—E shown in FIG. 12. As shown in FIGS. 12 and 13, the RIE is carried out until the gate trench 8 and the isolation trench 11 completely penetrate the n-type silicon layer 3. Thereafter, the TEOS layer 51 is removed.

Figure 14:
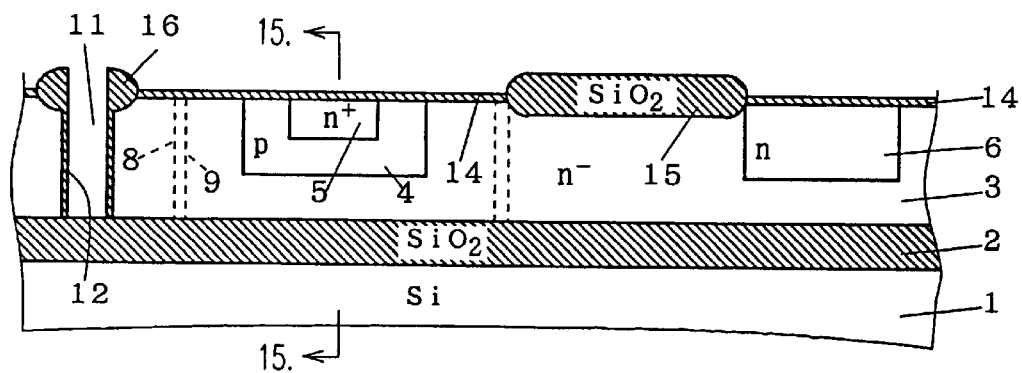
FIG. 14 is a diagram showing the process of manufacturing the device according to the first embodiment.
Figure 15:
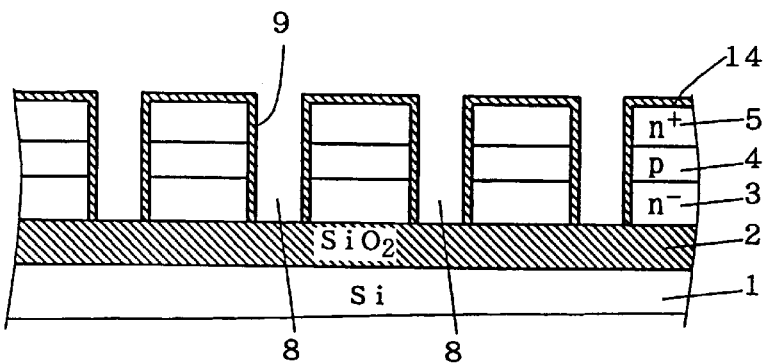
FIG. 15 is a diagram showing the process of manufacturing the device according to the first embodiment.

At steps shown in FIGS. 14 and 15, a silicon oxide film is formed on a surface of the n-type silicon layer 3. As a result, an insulation film 14 is formed over the whole region which is not covered with the LOCOSs 15 and 16 on the upper principal surface of the n-type silicon layer 3. A gate insulation film 9 and an isolation insulation film 12 are formed on internal walls of the gate trench 8 and the isolation trench 11 which are defined by the n-type silicon layer 3, respectively. FIG. 15 is a sectional view taken along the line E—E shown in FIG. 14.

Figure 16:
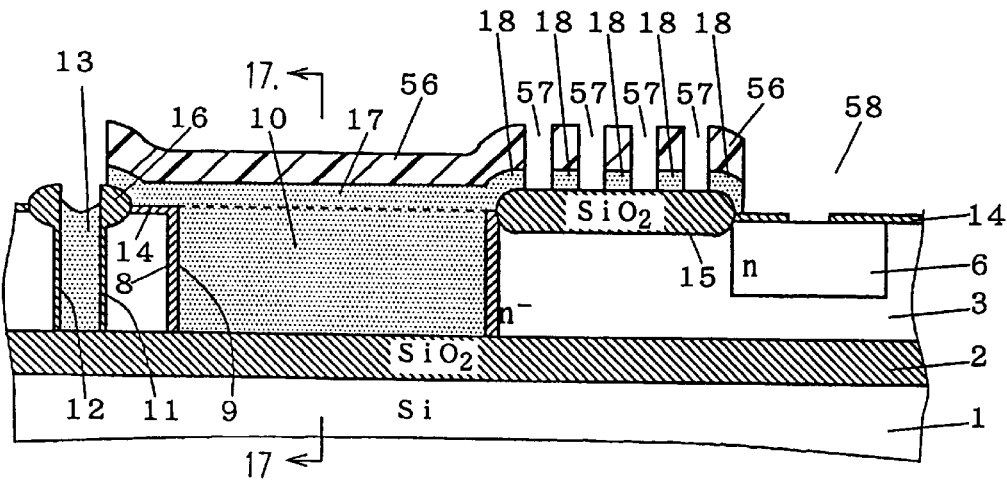
FIG. 16 is a diagram showing the process of manufacturing the device according to the first embodiment.
Figure 17:
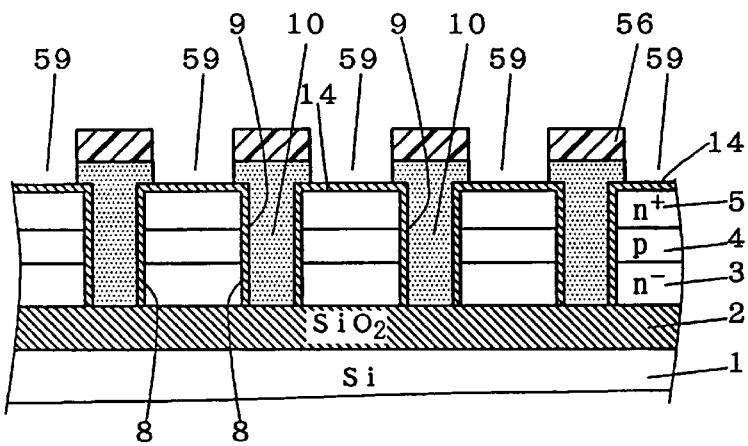
FIG. 17 is a diagram showing the process of manufacturing the device according to the first embodiment.

At steps shown in FIGS. 16 and 17 (which is a sectional view taken along the line E—E shown in FIG. 16), polysilicon doped with impurities is deposited over a whole surface of an intermediate product. As a result, a gate electrode 10 formed of polysilicon is buried in the gate trench 8 with the gate insulation film 9 interposed therebetween. Similarly, an isolation electrode 13 formed of the polysilicon is buried in the isolation trench 11 with the isolation insulation film 12 interposed therebetween. Furthermore, an upper portion of the gate electrode 10, that of the isolation electrode 13, and upper portions of the insulation film 14 and the LOCOSs 15 and 16 are covered with a polysilicon layer having a certain thickness.

After a resist layer 56 is deposited on the polysilicon layer, it is patterned in shapes corresponding to a gate wiring 17 and a field plate 18. As a result, openings 57 and 59 are selectively formed on the resist layer 56. Subsequently, the polysilicon layer is subjected to selective etching by using the patterned resist layer 56 as the shield. Consequently, the gate wiring 17 and the field plate 18 are formed.

Figure 18:
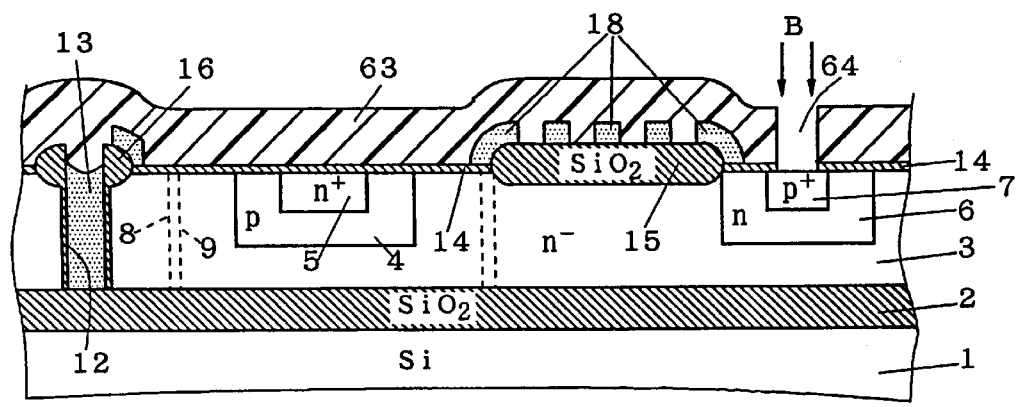
FIG. 18 is a diagram showing the process of manufacturing the device according to the first embodiment.

At a step shown in FIG. 18, a resist layer 63 is first deposited over a whole upper surface of the intermediate product. Then, an opening 64 is selectively formed in a portion of the resist layer 63 corresponding to a p-type collector layer 7. Thereafter, boron is implanted into the upper principal surface of the n-type silicon layer 3 by using the resist layer 63 as the shield. As a result, the p-type collector layer 7 is selectively formed in a shape corresponding to the opening 64 on the upper principal surface of the n-type silicon layer 3. Subsequently, the resist layer 63 is removed.

Figure 19:
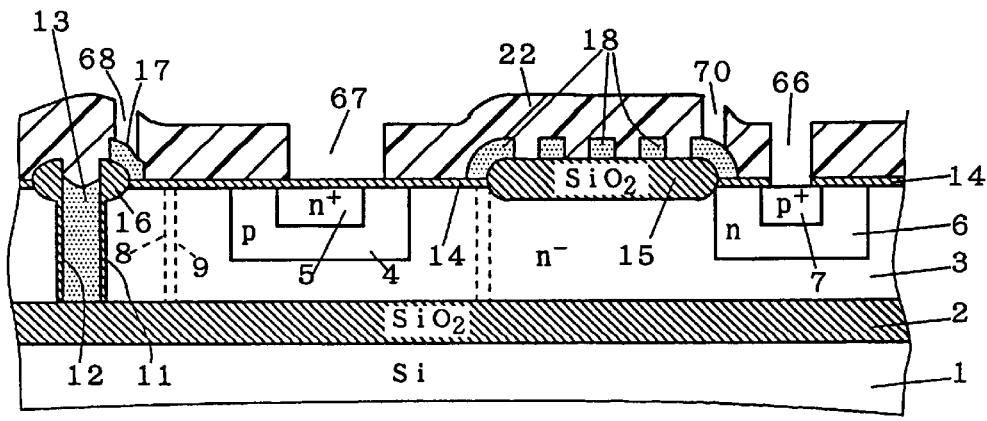
FIG. 19 is a diagram showing the process of manufacturing the device according to the first embodiment.
Figure 20:
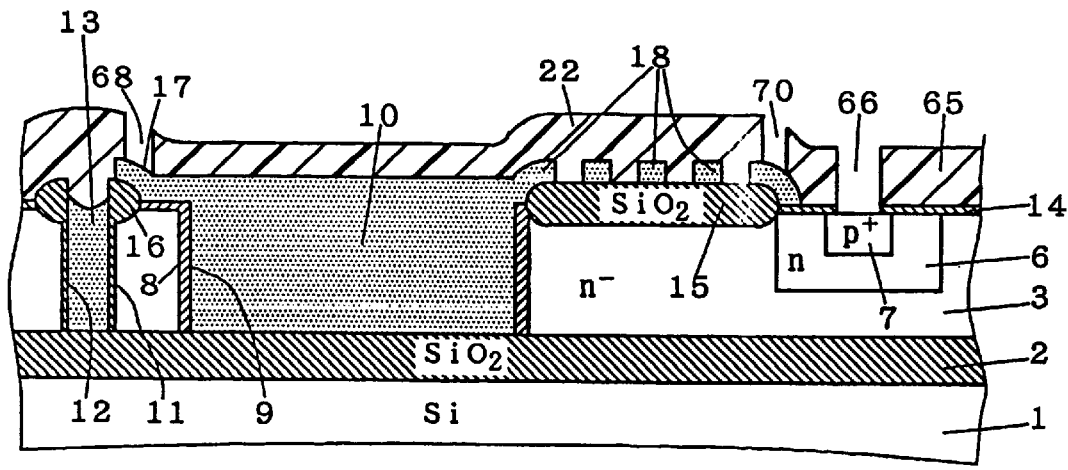
FIG. 20 is a diagram showing the process of manufacturing the device according to the first embodiment.
Figure 21:
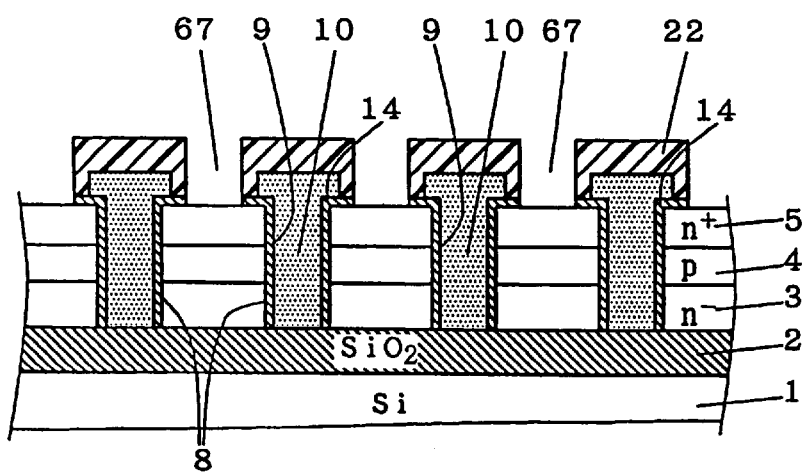
FIG. 21 is a diagram showing the process of manufacturing the device according to the first embodiment.

At steps shown in FIGS. 19, 20 and 21, a TEOS layer is deposited over the whole upper surface of the intermediate product. Then, openings 66, 67, 68 and 70 are selectively formed in portions of the TEOS layer which correspond to a connecting portion of the collector electrode 21 and the n-type silicon layer 3, that of the emitter electrode 20 and the n-type silicon layer 3, that of the gate wirings 17 and 19, and that of the field plate 18 and the collector electrode 21, respectively. As a result, an insulation layer 22 is formed of TEOS.

The openings 66, 67, 68 and 70 defined by the insulation layer 22 function as contact holes of electrodes and electrode wirings. FIG. 19 is a sectional view taken along a line corresponding to the line A—A shown in FIG. 1 at the same step. FIG. 20 is a sectional view taken along the line B—B. FIG. 21 is a sectional view taken along the line E—E.

Figure 22:
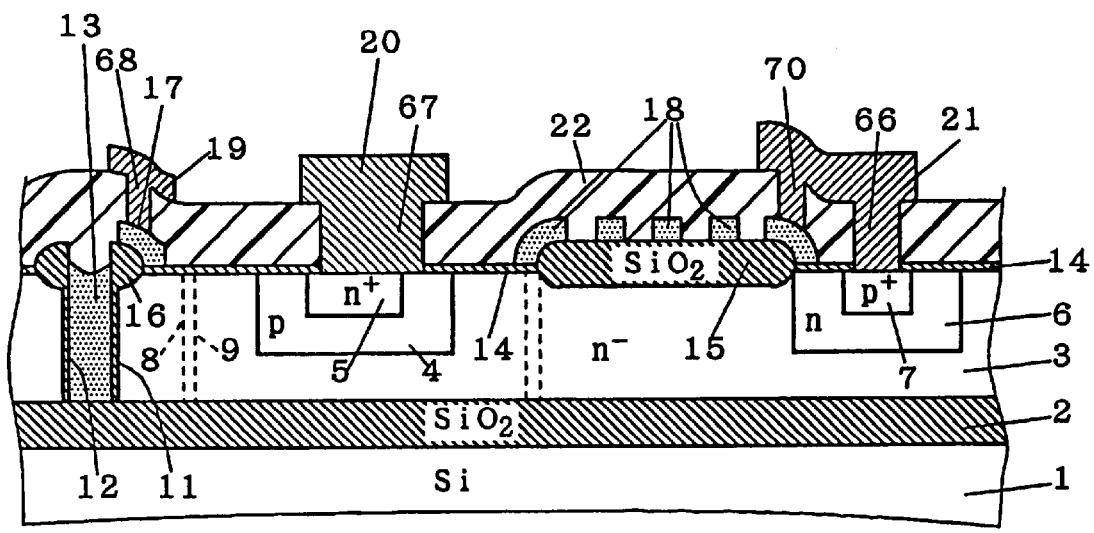
FIG. 22 is a diagram showing the process of manufacturing the device according to the first embodiment.
Figure 23:
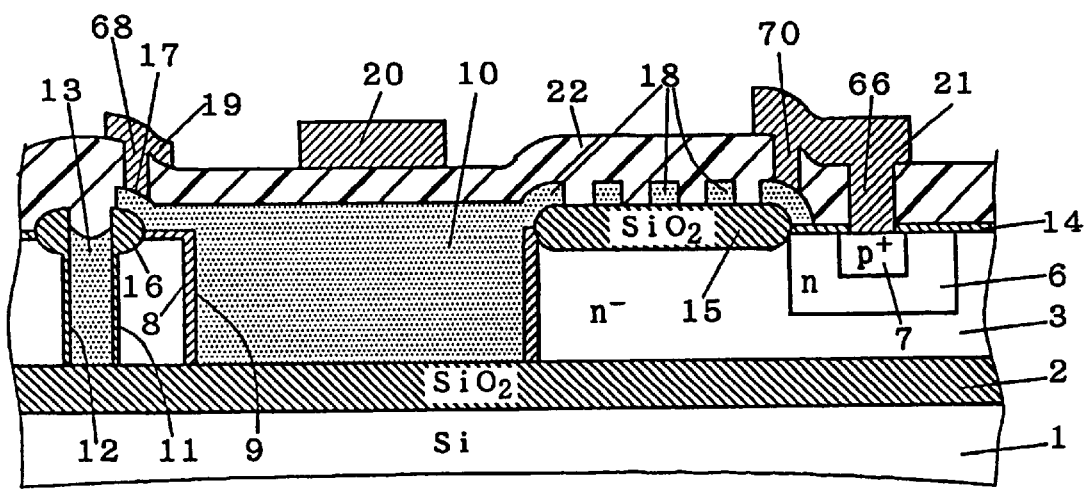
FIG. 23 is a diagram showing the process of manufacturing the device according to the first embodiment.
Figure 24:
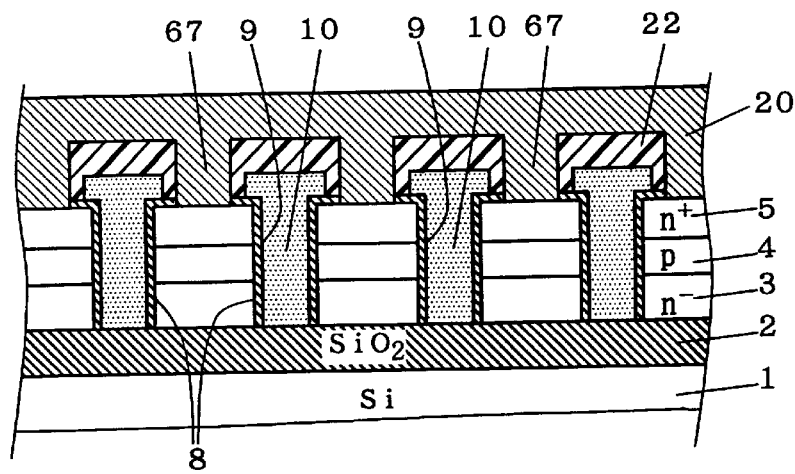
FIG. 24 is a diagram showing the process of manufacturing the device according to the first embodiment.

At steps shown in FIGS. 22 to 24, aluminum is first deposited over the whole upper surface of the intermediate product. As a result, the openings 66, 67, 68 and 70 acting as the contact holes are filled with the aluminum. More specifically, the aluminum is connected to the n-type silicon layer 3, the gate wiring 17 or the field plate 18 in a bottom portion of each contact hole. Furthermore, the aluminum is deposited over upper portions of the openings 66, 67, 68 and 70 and an upper portion of the insulation layer 22.

Then, selective etching is carried out by using a shield which is not shown. Consequently, the aluminum deposit layer is patterned. As a result, the gate wiring 19, the emitter electrode 20 and the collector electrode 21 are formed from the aluminum deposit layer. FIG. 22 is a sectional view taken along a line corresponding to the line A—A shown in FIG. 1 at the same step. FIG. 23 is a sectional view taken along the line B—B. FIG. 24 is a sectional view taken along the line E—E.

Figure 25:
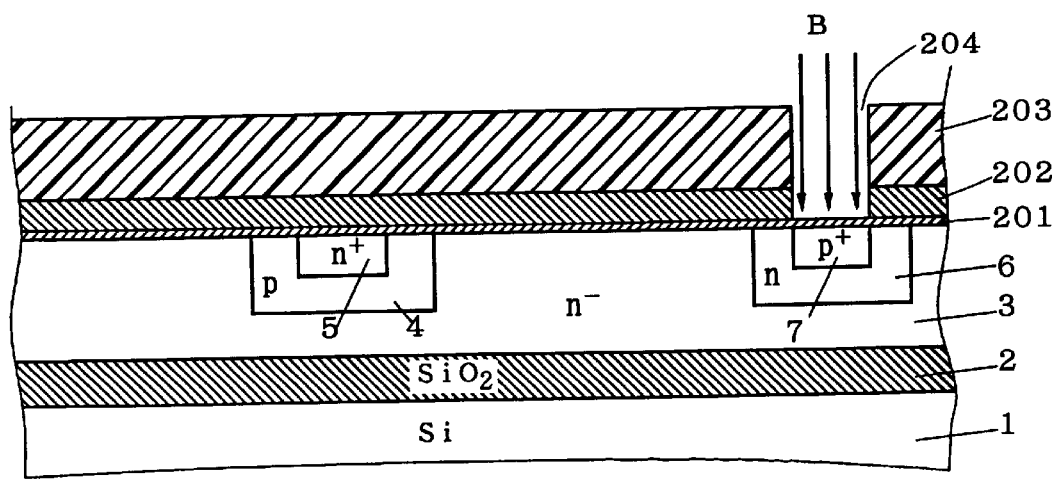
FIG. 25 is a diagram showing the process of manufacturing the device according to the first embodiment.

While the p-type collector layer 7 has been formed after the formation of the gate trench 8 and the isolation trench 11 by the above-mentioned manufacturing method, it may be formed before the formation of the gate trench 8 and the isolation trench 11 as shown in FIG. 25. A step shown in FIG. 25 is performed in the following manner after the step shown in FIG. 9, for example.

More specifically, a silicon oxide film 201 is newly formed on the n-type silicon layer 3, and a silicon nitride film 202 is deposited on the silicon oxide film 201. After a resist layer 203 is formed on the silicon nitride film 202, an opening 204 is selectively formed in a portion of the resist layer 203 corresponding to the p-type collector layer 7. Etching is carried out by using the resist layer 204 as the shield. Consequently, the silicon nitride film 202 is selectively removed.

Then, boron is implanted into the upper principal surface of the n-type silicon layer 3 by using the resist layer 203 and the silicon nitride film 202 as the shields. As a result, the p-type collector layer 7 is selectively formed in a shape corresponding to the opening 204, that is, like a band on the n-type buffer layer 6 on the upper principal surface of the n-type silicon layer 3. Thereafter, the resist layer 203, the silicon nitride film 202 and the silicon oxide film 201 are removed. After the step shown in FIG. 25 is completed, the steps shown in FIGS. 10 to 17 are performed. Furthermore, the step shown in FIG. 18 is omitted and the steps shown in FIGS. 19 to 24 are performed.

By performing the above-mentioned steps, the device 101 shown in FIGS. 1 to 6 is finished. In the manufacturing method shown in FIGS. 12 to 17, the isolation trench 11 and the gate trench 8 are formed at the same step, and the isolation insulation film 12 and gate trench 8 and the isolation electrode 13 and gate electrode 10 are also formed at the same steps, respectively. In other words, a new step which is not included in a method for manufacturing the device 150 according to the prior art is not necessary for the formation of the gate trench 8, the gate insulation film 9 and the gate electrode 10. Therefore, the device 101 can be manufactured without a high cost as compared with the device 150 according to the prior art.

While only the process of manufacturing the power section PW of the device 101 has been described above, the non-power section NP is also manufactured in parallel with each step related to the power section PW.

2. Second Embodiment

Figure 26:
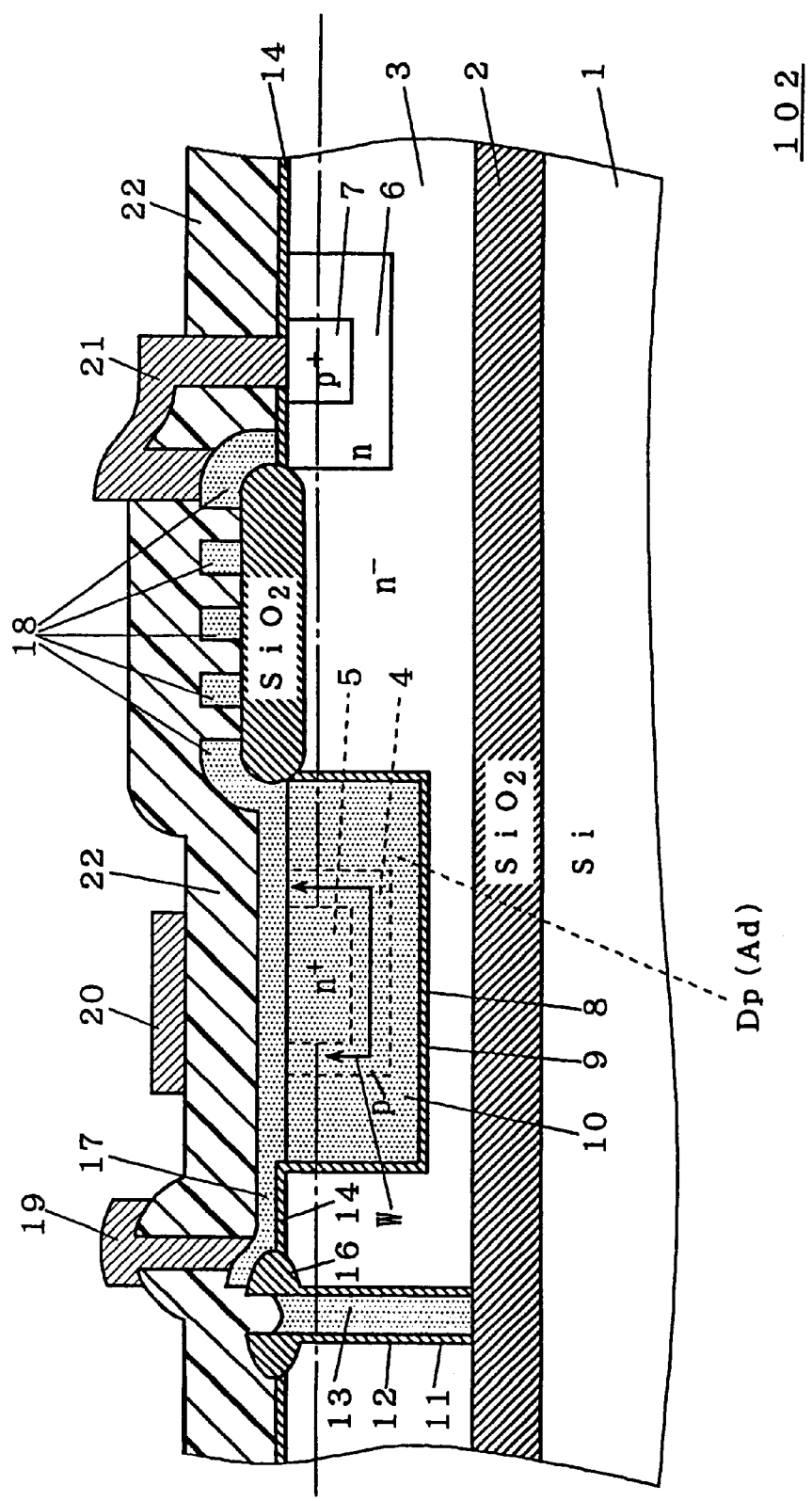
FIG. 26 is a sectional front view showing an device according to a second embodiment.

A form in which a dimension of a gate trench 8 is varied in the device 101 shown in FIGS. 1 to 6 will be described below. An device 102 shown in a sectional front view of FIG. 26 is characteristically different from the device 101 in that a bottom portion of the gate trench 8 does not reach a silicon oxide film 2 but stays in an n-type silicon layer 3. More specifically, the device 102 has a structure in which the gate trench 8 is shallower than that of the device 101 and a depth of the gate trench 8 is not coincident with that of an isolation trench 11. However, the gate trench 8 has a greater depth than that of a p-type base layer 4. In the device 102, a bottom face of the gate trench 8 is defined by the n-type silicon layer 3 in the same manner as a side wall thereof. Therefore, the bottom face is covered with a gate insulation film 9 in the same manner as the side wall.

Also in the device 102, a channel width W is almost equal to that of the device 101. In addition, an area Ad of an accumulation layer Dp is a little smaller than that of the device 101 but is kept very large. Similarly, the effect of accumulating a hole can be obtained. Also in the device 102, accordingly, the effect of reducing an ON-state voltage can fully be obtained. Since the gate trench 8 extends in a direction toward a collector electrode 21, a current flows along the gate trench 8. Therefore, a path for the current is less affected by a change of a thickness of a silicon substrate 1. In other words, even if the thickness of the silicon substrate 1 is changed, the ON-state voltage fluctuates with difficulty.

Figure 27:
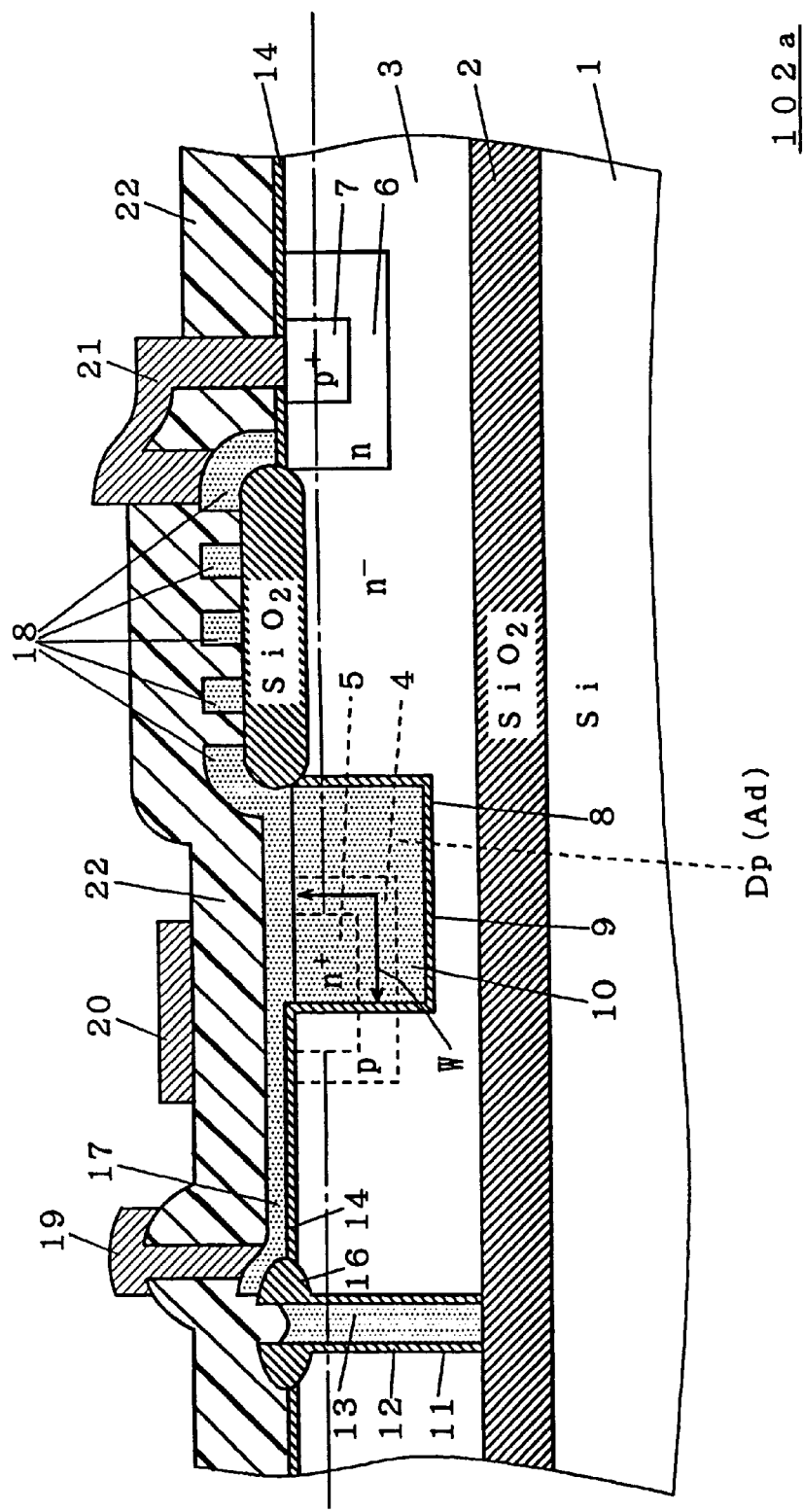
FIG. 27 is a sectional front view showing another example of the device according to the second embodiment.

In an device 102a shown in FIG. 27, a longitudinal end of the gate trench 8 opposite to the collector electrode 21 retreats more than in the device 102. The same end of the gate trench 8 less retreats to a collector electrode 21 side than an edge of an n-type emitter layer 5 on the collector electrode 21 (or a p-type collector layer 7) side. More specifically, a gate electrode 10 is provided opposite to a region of a p-type base layer 4 interposed between the edge of the n-type emitter layer 5 on the collector electrode 21 side and an edge of the p-type base layer 4 on the collector electrode 21 side.

Depending on an extent of the retreat of the end of the gate trench 8, the channel width W is varied within a range of a value which is almost equivalent to a depth of the p-type base layer 4 to a value obtained by adding, thereto, a value which is almost equivalent to a width of the p-type base layer 4 (a width in a longitudinal direction of the gate trench 8). The area Ad of the accumulation layer Dp is also changed depending on the extent of the retreat.

Figure 28:
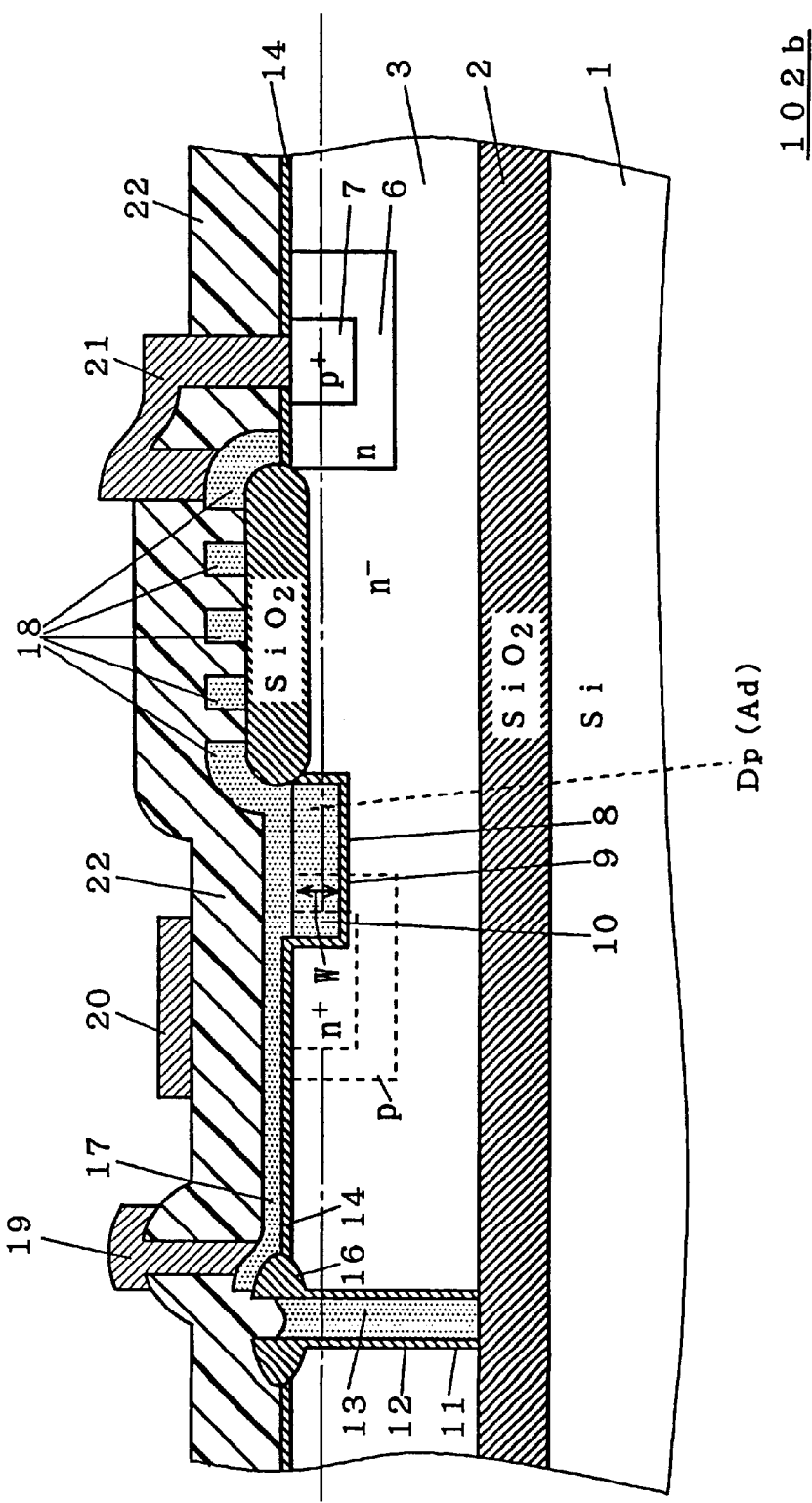
FIG. 28 is a sectional front view showing a further example of the device according to the second embodiment.

An device 102b shown in FIG. 28 corresponds to an example in which the gate trench 8 is the smallest. In the device 102b, the gate trench 8 is shallower than the n-type emitter layer 5. The end of the gate trench 8 on the collector electrode 21 side may retreat more than in the device 102. The gate trench 8 is formed to traverse at least from the edge of the n-type emitter layer 5 on the collector electrode 21 side to the edge of the p-type base layer 4 on the collector electrode 21 side.

Also in the device 102b, if a space between the gate trenches 8 is set small to some extent, a channel width density and an accumulation layer density can be increased more than in the device 150 according to the prior art. In addition, the effect of accumulating a hole can correspondingly be obtained. Accordingly, it is possible to obtain an ON-state voltage which is lower than in the device 150 according to the prior art. Similarly, it is possible to obtain the effect of preventing a latch-up.

In order of the device 102b, 102a, 102 and 101, the channel width W and the area Ad are increased more. Accordingly, if an arrangement space between the gate trenches 8 is constant, the effect of reducing an ON-state voltage is also increased in this order. If a surface area of the gate electrode 10 is smaller, a capacity between the gate electrode 10 and the n-type silicon layer 3 (including the p-type base layer 4 and the n-type emitter layer 5) is reduced more and a switching speed is increased.

Thus, an enhancement of the switching speed and an improvement of the ON-state voltage have a trade-off relationship. The device according to the first and second embodiments have an advantage which cannot be obtained by the device 150 according to the prior art, that is, the ON-state voltage can widely be selected by changing the dimension and arrangement space of the gate trench 8 to answer a purpose of use.

Figure 29:
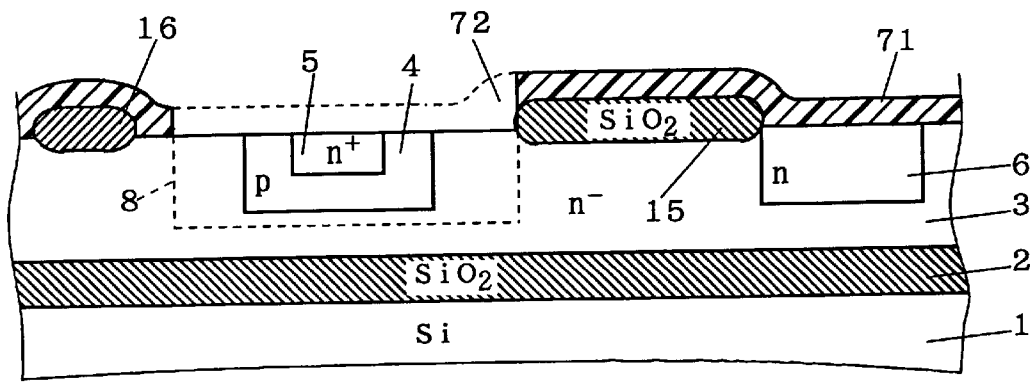
FIG. 29 is a diagram showing a process of manufacturing the device according to the second embodiment.
Figure 30:
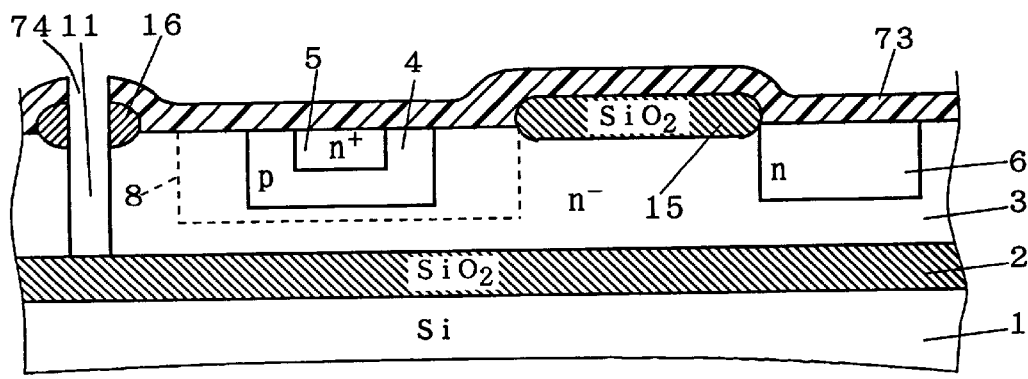
FIG. 30 is a diagram showing the process of manufacturing the device according to the second embodiment.

A method for manufacturing the device according to the second embodiment will be described below. In order to manufacture the device 102, for example, steps shown in FIGS. 29 and 30 are preferably performed in place of the steps shown in FIGS. 12 and 13 in the method for manufacturing the device according to the first embodiment. At the step shown in FIG. 29, a TEOS layer 71 is first deposited on an n-type silicon layer 3 and LOCOSs 15 and 16. Then, an opening 72 is selectively formed in a portion of the TEOS layer 71 in which a gate trench 8 is to be formed. Subsequently, RIE is carried out by using the patterned TEOS layer 71 as a shield. Consequently, the gate trench 8 is formed in a portion of the n-type silicon layer 3 corresponding to the opening 72. Thereafter, the TEOS layer 71 is removed.

At the step shown in FIG. 30, a new TEOS layer 73 is first deposited over a whole surface of an intermediate product. Then, an opening 74 is selectively formed in a portion of the TEOS layer 73 in which an isolation trench 11 is to be formed. Subsequently, the RIE is carried out by using the patterned TEOS layer 73 as a shield. Consequently, the isolation trench 11 is formed in a portion of the n-type silicon layer 3 corresponding to the opening 74. Thereafter, the TEOS layer 73 is removed.

By performing the above-mentioned two steps, the gate trench 8 and the isolation trench 11 are individually formed. Then, the step shown in FIG. 14 and succeeding steps in the method for manufacturing the device according to the first embodiment are performed. In the method for manufacturing the device according to the second embodiment, the gate trench 8 and the isolation trench 11 are individually formed, while the gate electrode 10 and an isolation electrode 13 to be buried therein can be formed at the same step. As compared with the device 150 according to the prior art, consequently, the device according to the second embodiment does not require a remarkably complicated manufacturing process.

3. Third Embodiment

Figure 31:
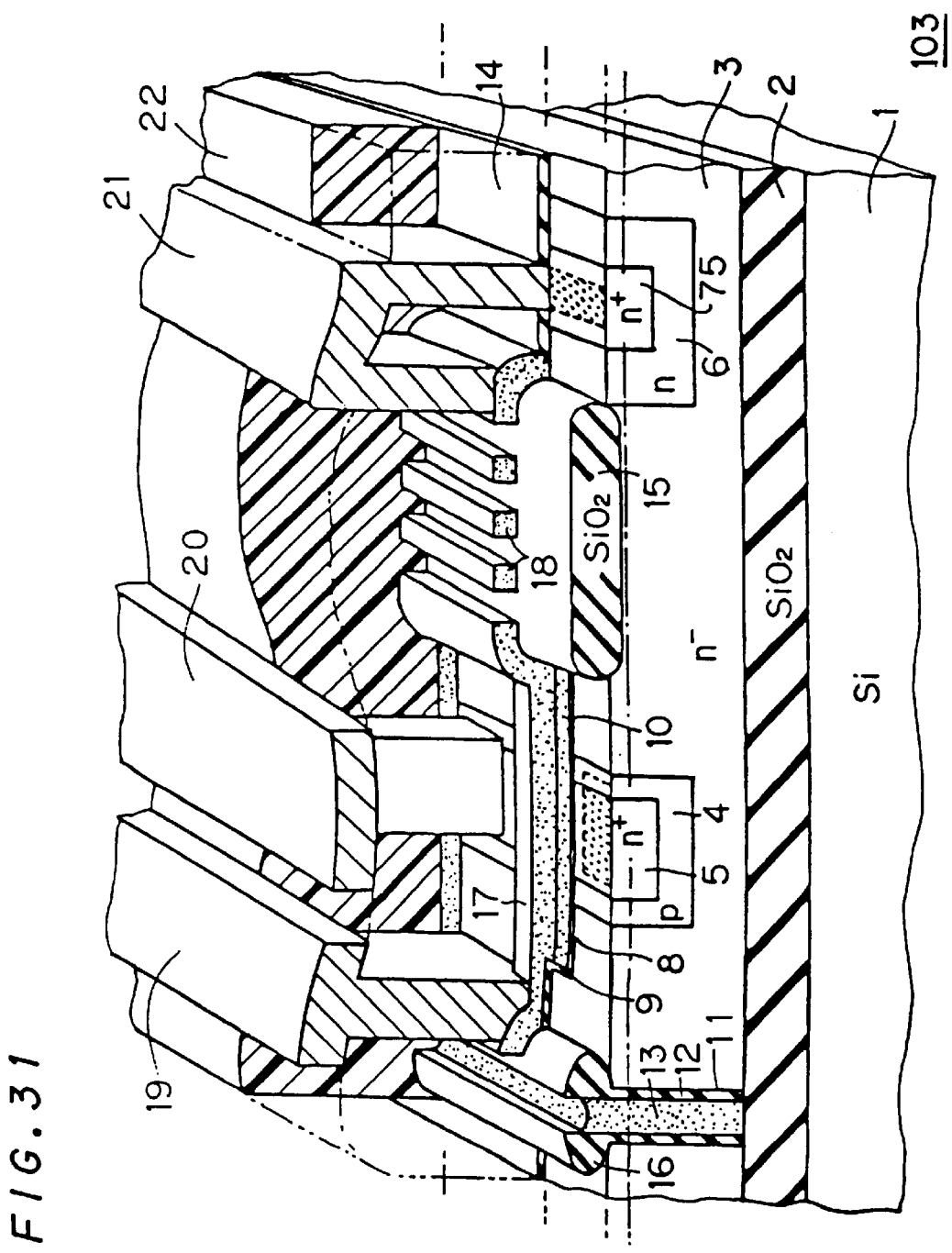
FIG. 31 is a sectional perspective view showing an device according to a third embodiment.

FIG. 31 is a sectional perspective view showing a structure of an device according to a third embodiment. An device 103 is characteristically different from the device 101 in that an n-type drain layer 75 is provided in place of the p-type collector layer 7. More specifically, an n-channel type MOS transistor (MOS type FET) is formed on a power section PW of the device 103.

Also in the device 103, structures of a gate trench 8, a field plate 18, a connecting portion of an emitter electrode 20 and an n-type silicon layer 3 and the like are the same as those of the device 101. In the same manner as the device 101, accordingly, it is possible to obtain the effect that an ON-state voltage is reduced, a breakdown voltage is enhanced and a latch-up tolerance is enhanced without a complicated manufacturing process and an increase in a manufacturing cost. In addition, a switching speed is higher than in the IGBT of the device 101.

Figure 32:
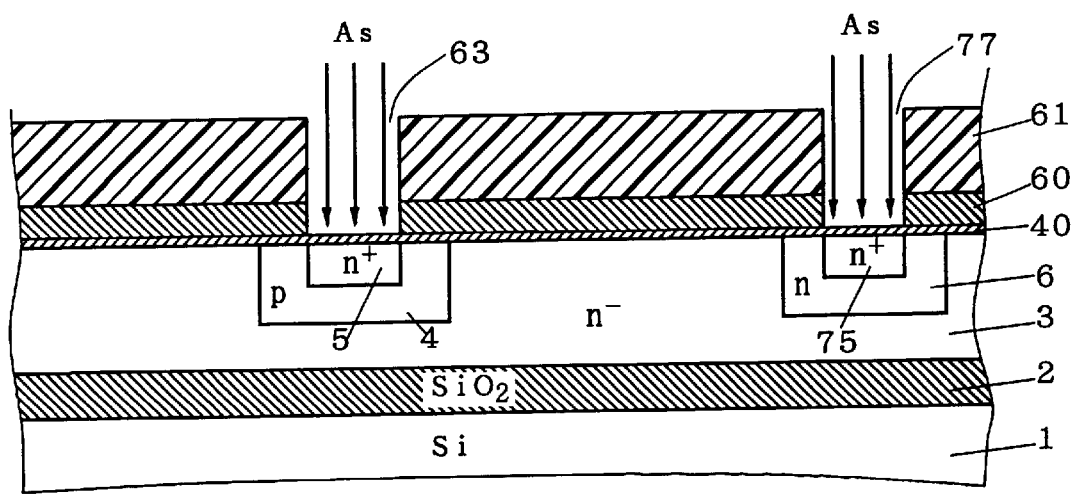
FIG. 32 is a diagram showing a process of manufacturing the device according to the third embodiment.

In order to manufacture the device 103, it is preferable that a step shown in FIG. 32 should be performed in place of the step shown in FIG. 9 and the step shown in FIG. 18 should be omitted in the process of manufacturing the device 101 shown in FIGS. 7 to 24. At the step shown in FIG. 32, a silicon oxide film 40, a silicon nitride film 60 and a resist layer 61 are first formed in this order in the same manner as the step shown in FIG. 9.

Then, an opening 63 is selectively formed in a portion of the resist layer 61 corresponding to an n-type emitter layer 5, and an opening 77 is selectively formed in a portion of the resist layer 61 corresponding to an n-type drain layer 75. Etching is carried out by using the resist layer 61 as a shield. Consequently, the silicon nitride film 60 is selectively removed.

Subsequently, arsenic is implanted into an upper principal surface of the n-type silicon layer 3 by using the resist layer 61 and the silicon nitride film 60 as the shields. As a result, the n-type emitter layer 5 and the n-type drain layer 75 are selectively formed in shapes corresponding to the openings 63 and 77 on the upper principal surface of the n-type silicon layer 3, respectively. Thereafter, the resist layer 61, the silicon nitride film 60 and the silicon oxide film 40 are removed.

4. Fourth Embodiment

Figure 33:
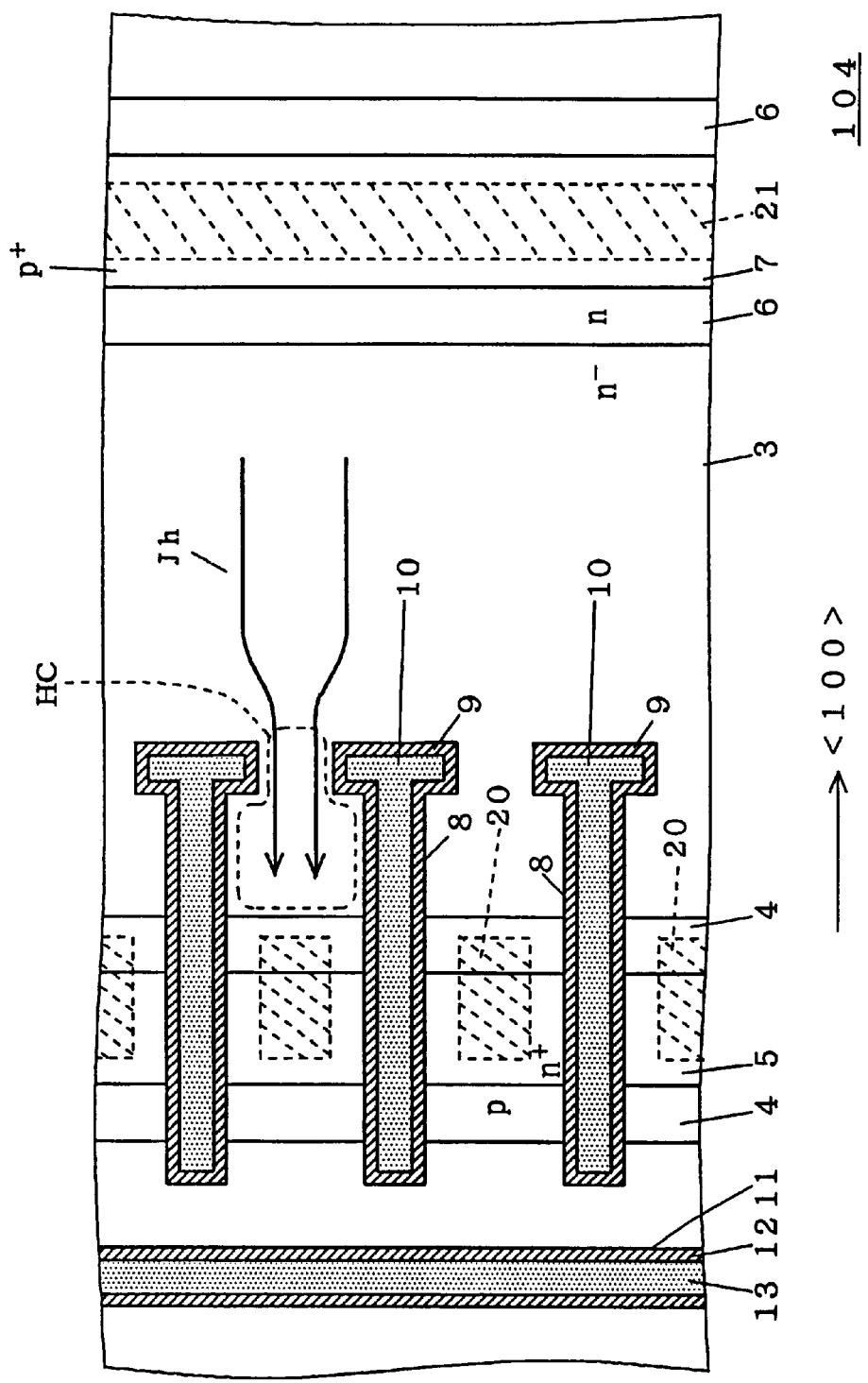
FIG. 33 is a sectional plan view showing an device according to a fourth embodiment.

FIG. 33 is a sectional plan view showing an device according to a fourth embodiment, and illustrates a sectional structure taken along a line corresponding to the line D—D in FIG. 1. An device 104 is characteristically different from the device 101 (FIG. 3) in respect of a plane shape of a gate trench 8. In the device 104 shown in FIG. 33, the gate trench 8 projects in a direction orthogonal to a longitudinal direction on a longitudinal end closer to a collector electrode 21. In other words, the gate trench 8 has a T plane shape. A bottom portion of the gate trench 8 including a projecting portion reaches an upper principal surface of a silicon oxide film 2 in the same manner as in the device 101.

A space between the adjacent gate trenches 8 is further reduced on the same end. For this reason, a density of a hole current Jh is further increased in a region HC interposed between the adjacent gate trenches 8. As a result, a hole is accumulated at a high density in the region HC. Consequently, an electronic current Jn is further increased, and conductivity modulation is further increased on an n-type silicon layer 3. Accordingly, an ON-state voltage can be reduced more.

In order to manufacture the device 104, a sectional shape of the opening 52 at the step shown in FIG. 12 is preferably set corresponding to the plane shape of the gate trench 8 shown in FIG. 33 in the process of manufacturing the device 101 shown in FIGS. 7 to 24. In the device 104, thus, the ON-state voltage can further be reduced without a complicated manufacturing process.

5. Fifth Embodiment

Figure 34:
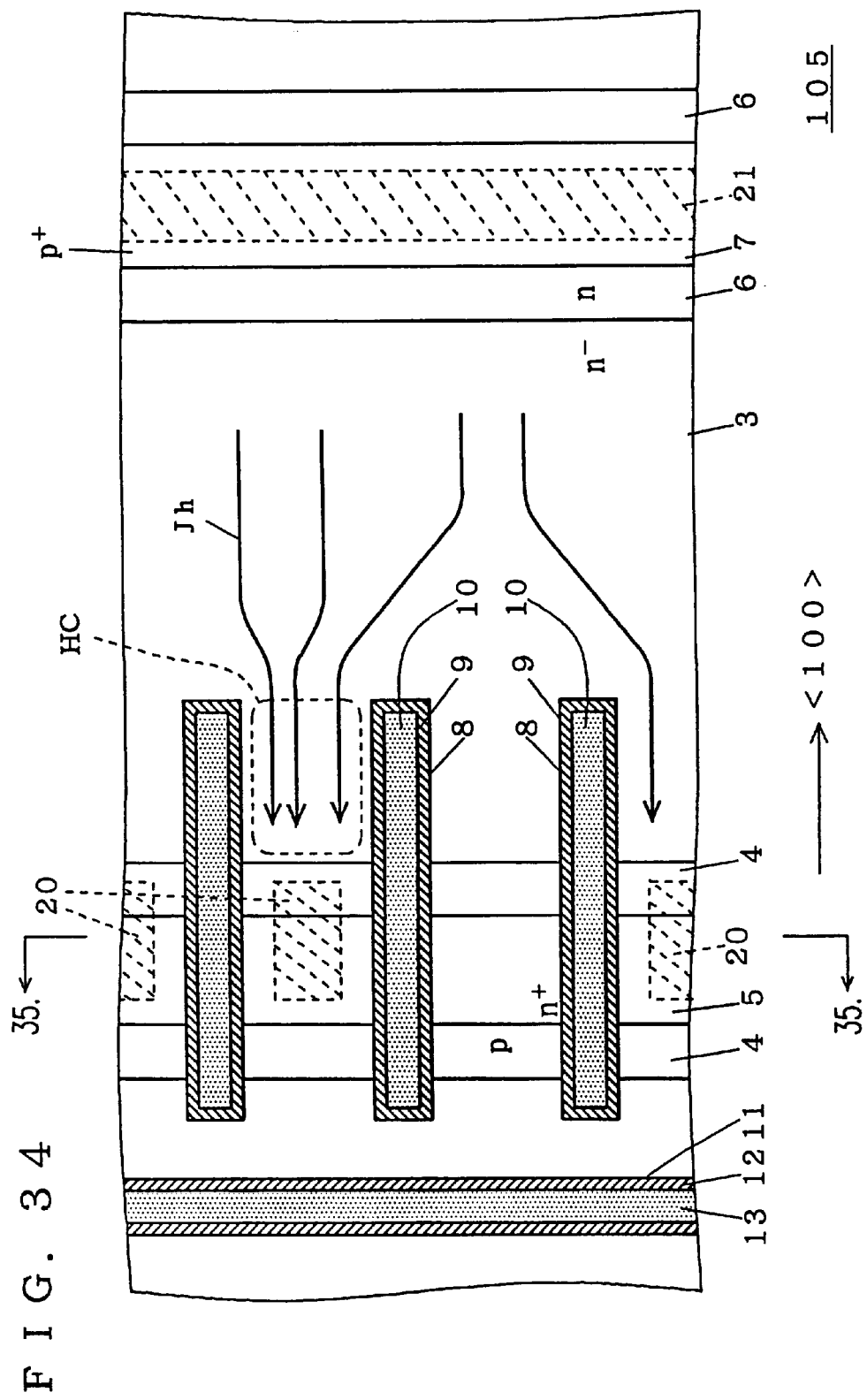
FIG. 34 is a sectional plan view showing an device according to a fifth embodiment.
Figure 35:
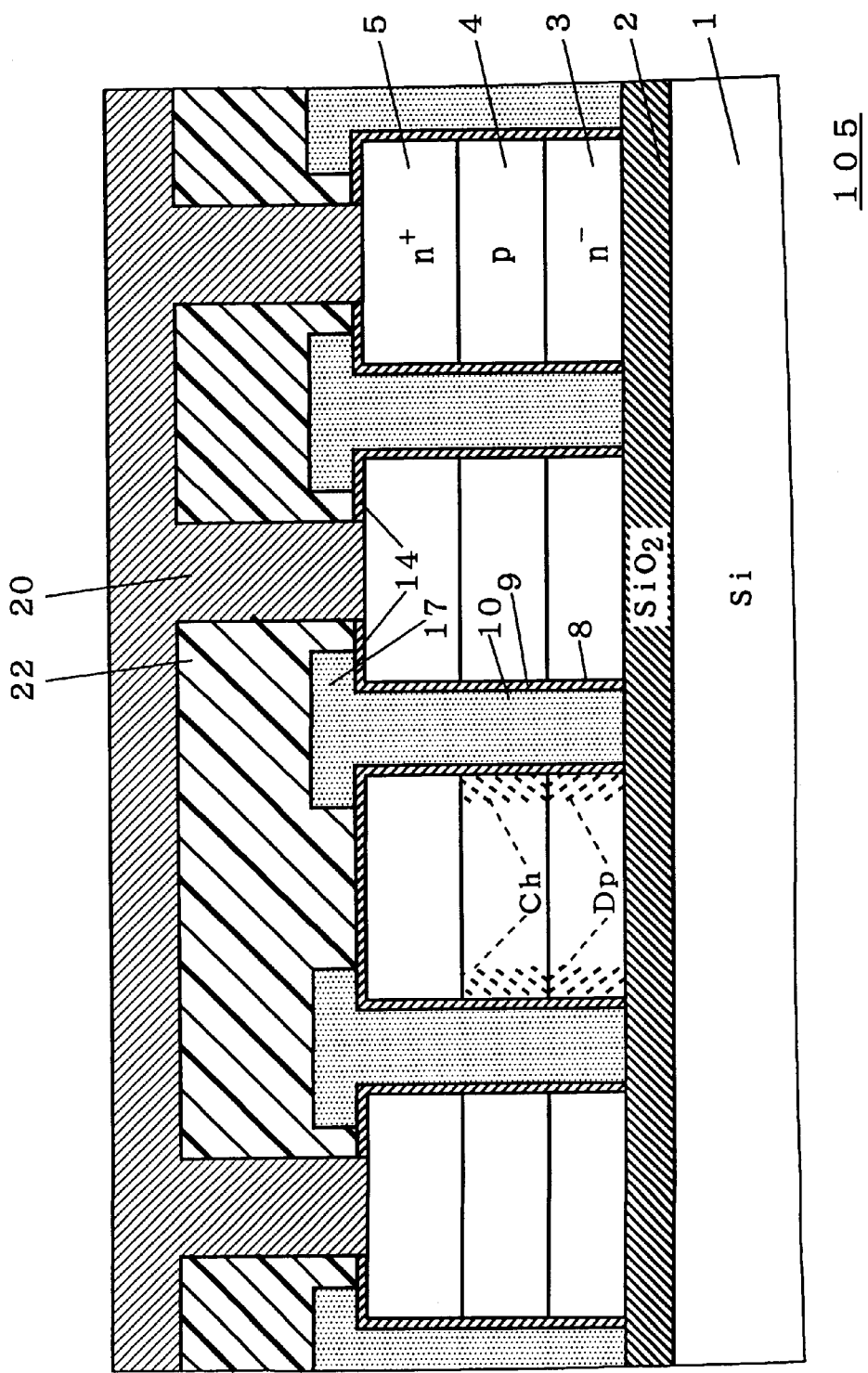
FIG. 35 is a sectional view taken along the line E—E shown in FIG. 34.

FIG. 34 is a sectional plan view showing an device according to a fifth embodiment, and illustrates a sectional structure taken along a line corresponding to the line D—D in FIG. 1. FIG. 35 is a sectional view taken along the line E—E shown in FIG. 34. An device 105 is characteristically different from the device 101 (FIGS. 3 and 5) in that a part of a connecting portion of an emitter electrode 20 and an upper principal surface of an n-type silicon layer 3 provided between gate trenches 8 which are arranged in parallel with each other is omitted.

While the connecting portion of the upper principal surface of the n-type silicon layer 3 and the emitter electrode 20 is provided periodically between the gate trenches 8 in the device 101 as shown in FIGS. 3 and 5, a part of the connecting portions arranged periodically is omitted in the device 105 as shown in FIGS. 34 and 35. In other words, the connecting portions are provided thinly.

In a region interposed between the adjacent gate trenches 8, a hole current Jh does not flow into a region having no connecting portion but goes around into a region HC having the adjacent connecting portion. Therefore, a density of the hole current Jh is increased in the region HC into which the hole current Jh that has gone around flows. As a result, a hole is accumulated at a high density in the region HC. Consequently, an electronic current Jn is further increased, and conductivity modulation is further increased on the n-type silicon layer 3. Accordingly, an ON-state voltage can be reduced more.

Figure 36:
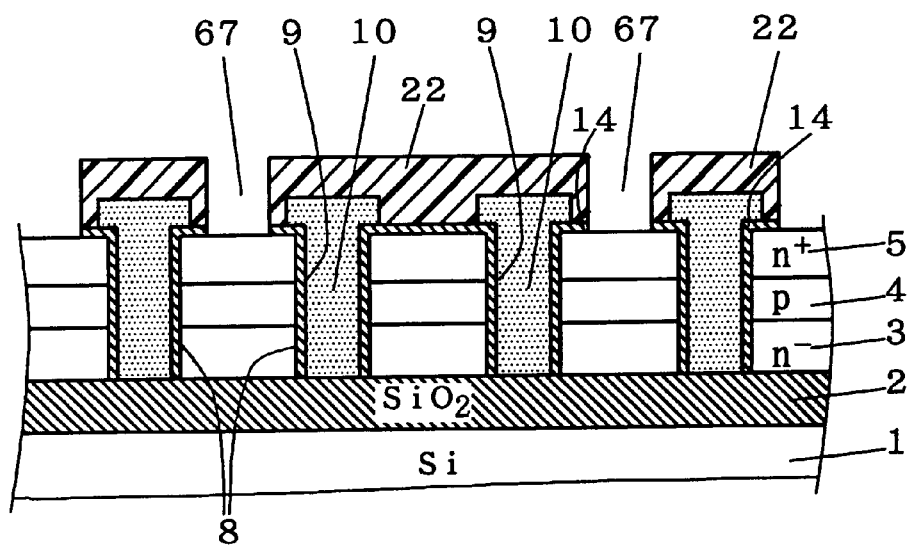
FIG. 36 is a diagram showing a process of manufacturing the device according to the fifth embodiment.

In order to manufacture the device 105, the opening 67 at the steps shown in FIGS. 19 to 21 is preferably formed thinly as shown in FIG. 36 in the process of manufacturing the device 101 shown in FIGS. 7 to 24. In the device 105, thus, the ON-state voltage can further be reduced without a complicated manufacturing process.

6. Sixth Embodiment

Figure 37:
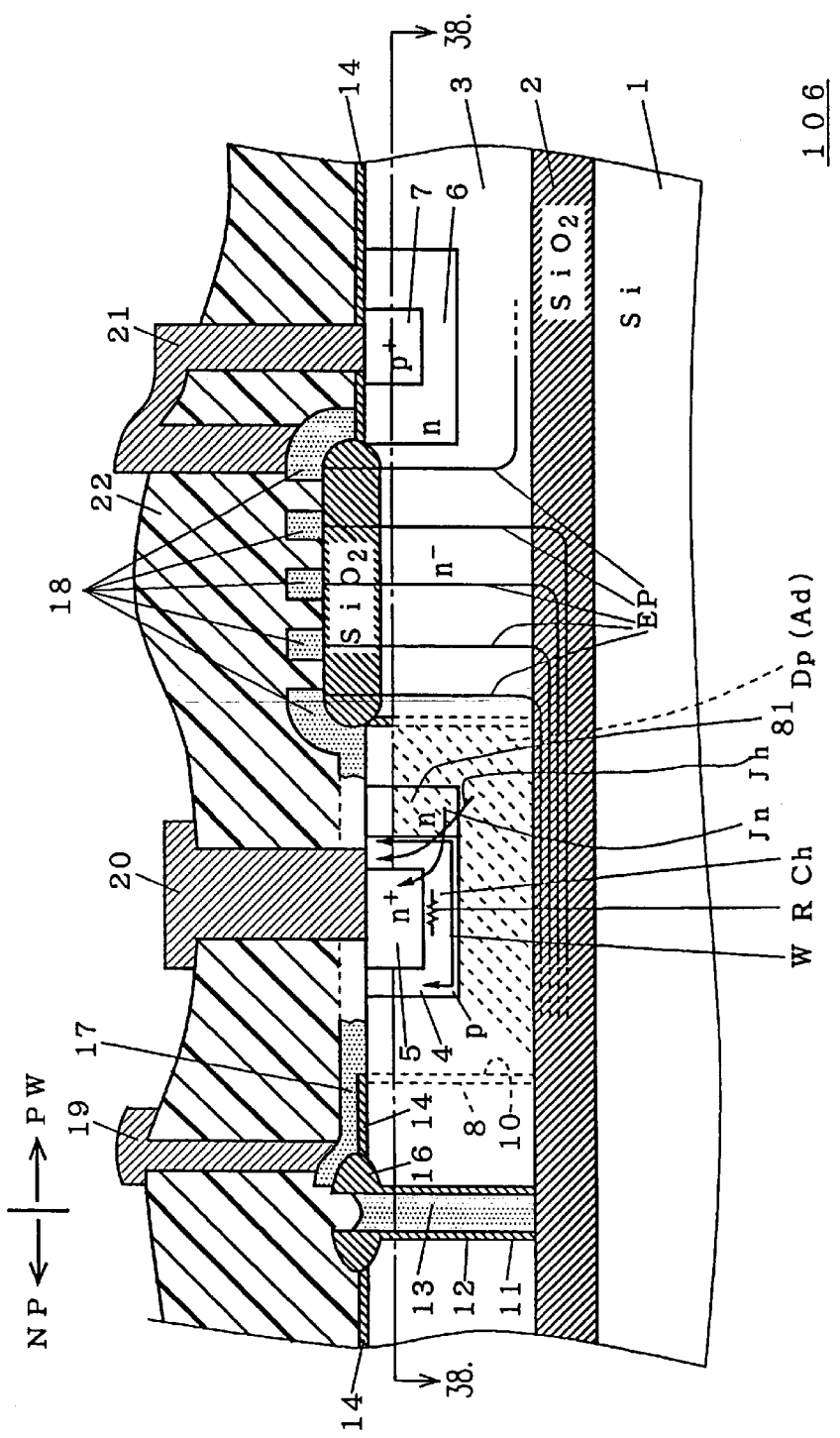
FIG. 37 is a sectional front view showing an device according to a sixth embodiment.
Figure 38:
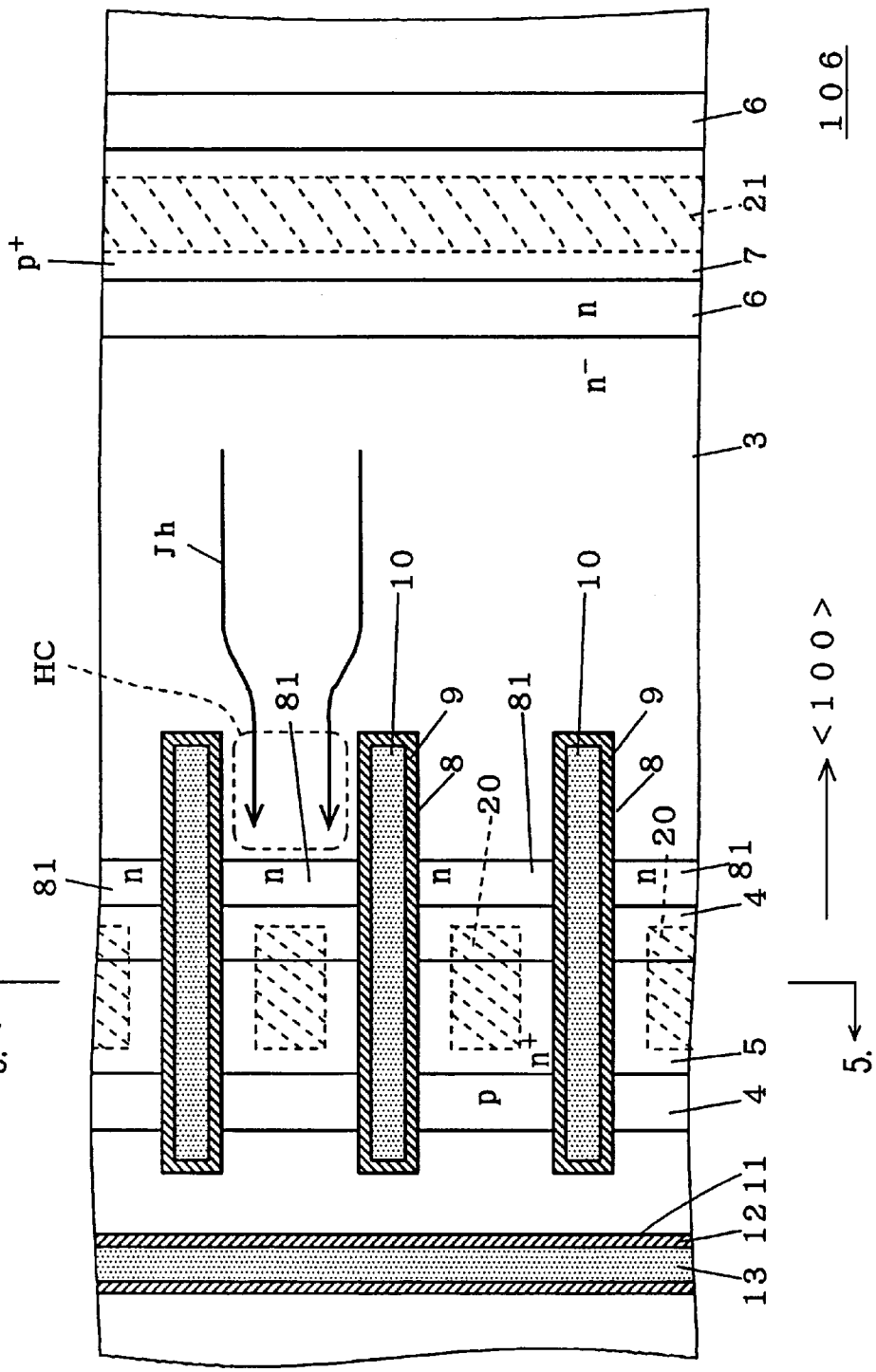
FIG. 38 is a sectional view taken along the line D—D shown in FIG. 37.

FIG. 37 is a sectional front view showing an device according to a sixth embodiment. FIG. 38 is a sectional view taken along the line D—D shown in FIG. 37. A sectional view taken along the line E—E shown in FIG. 38 is identical to FIG. 5. An device 106 is characteristically different from the device 101 in that an n-type well layer (a semiconductor well layer) 81 is formed adjacently to a p-type base layer 4 in an n-type silicon layer 3.

The n-type well layer 81 is provided in a portion of the p-type base layer 4 closer to a collector electrode 21, and has almost the same depth as that of the p-type base layer 4 so as to come in contact with the p-type base layer 4. A concentration of an n-type impurity in the n-type well layer 81 is set higher than that in the n-type silicon layer 3, is preferably set lower than that in an n-type emitter layer 5 and higher than that in an n-type buffer layer 6.

Figure 39:
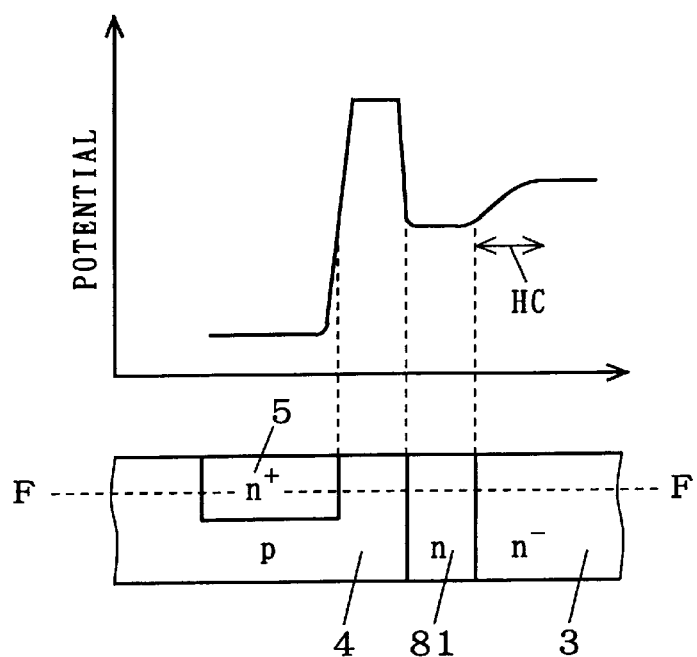
FIG. 39 is a chart for explaining operation of the device according to the sixth embodiment.

FIG. 39 is a band chart related to the n-type well layer 81 and a surrounding region thereof. The band chart represents a potential energy of an electron on the line F—F of a sectional view incidental to a lower part. As shown in the band chart, the potential energy of the electron is lower in the n-type well layer 81 than in the n-type silicon layer 3. In other words, a built-in potential between the p-type base layer 4 and the n-type well layer 81 is higher than a built-in potential between the p-type base layer 4 and the n-type silicon layer 3 without the n-type well layer 81 provided therein A magnitude of the potential for a hole is reverse from top to bottom to that of FIG. 39. For this reason, the hole flowing from the n-type silicon layer 3 into the n-type well layer 81 is accumulated in a region HC in the vicinity of a boundary between the n-type silicon layer 3 and the n-type well layer 81. As a result, an electronic current Jn is increased, and conductivity modulation is further increased on the n-type silicon layer 3. Accordingly, an ON-state voltage can be reduced more. In the device 106, thus, the n-type well layer 81 is provided so that the effect of reducing the ON-state voltage can further be enhanced.

Figure 40:
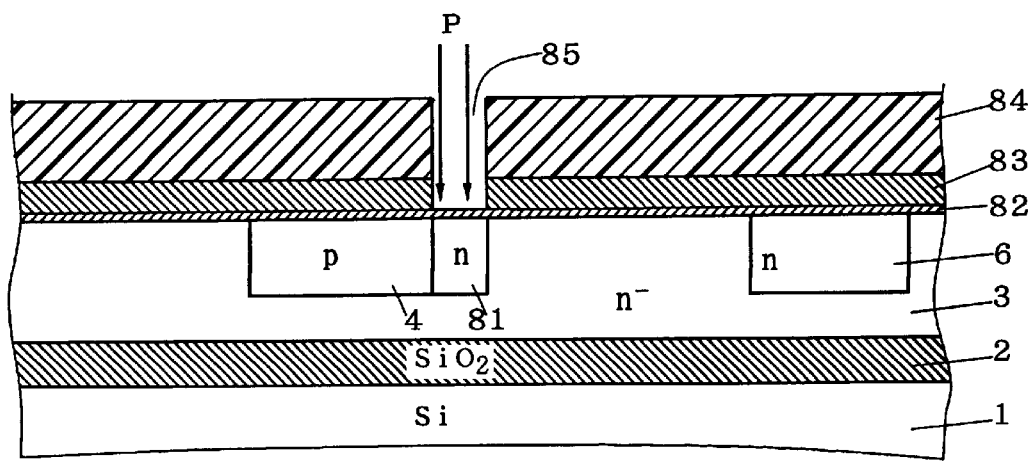
FIG. 40 is a diagram showing a process of manufacturing the device according to the sixth embodiment.

In order to manufacture the device 106, it is preferable that a step shown in FIG. 40 should additionally be performed between the steps shown in FIGS. 8 and 9, for example, in the process of manufacturing the device 101 shown in FIGS. 7 to 24. At the step shown in FIG. 40, a silicon oxide film 82, a silicon nitride film 83 and a resist layer 84 are first formed on an n-type silicon layer 3 in this order in the same manner as the step shown in FIG. 8. Then, an opening 85 is selectively formed in a portion of the resist layer 84 corresponding to an n-type well layer 81. Etching is carried out by using the resist layer 84 as a shield. Consequently, the silicon nitride film 83 is selectively removed.

Then, phosphorus is implanted into an upper principal surface of the n-type silicon layer 3 by using the resist layer 84 and the silicon nitride film 83 as the shields. As a result, the n-type well layer 81 is selectively formed in a shape corresponding to the opening 85, that is, like a band adjacent to the p-type base layer 4 on the upper principal surface of the n-type silicon layer 3. Thereafter, the resist layer 84, the silicon nitride film 83 and the silicon oxide film 82 are removed. As described above, it is possible to obtain the device 106 having excellent ON-state voltage characteristics by a relatively simple method in which an ion implanting step is added in one stage to the process of manufacturing the device 101.

7. Seventh Embodiment

Figure 41:
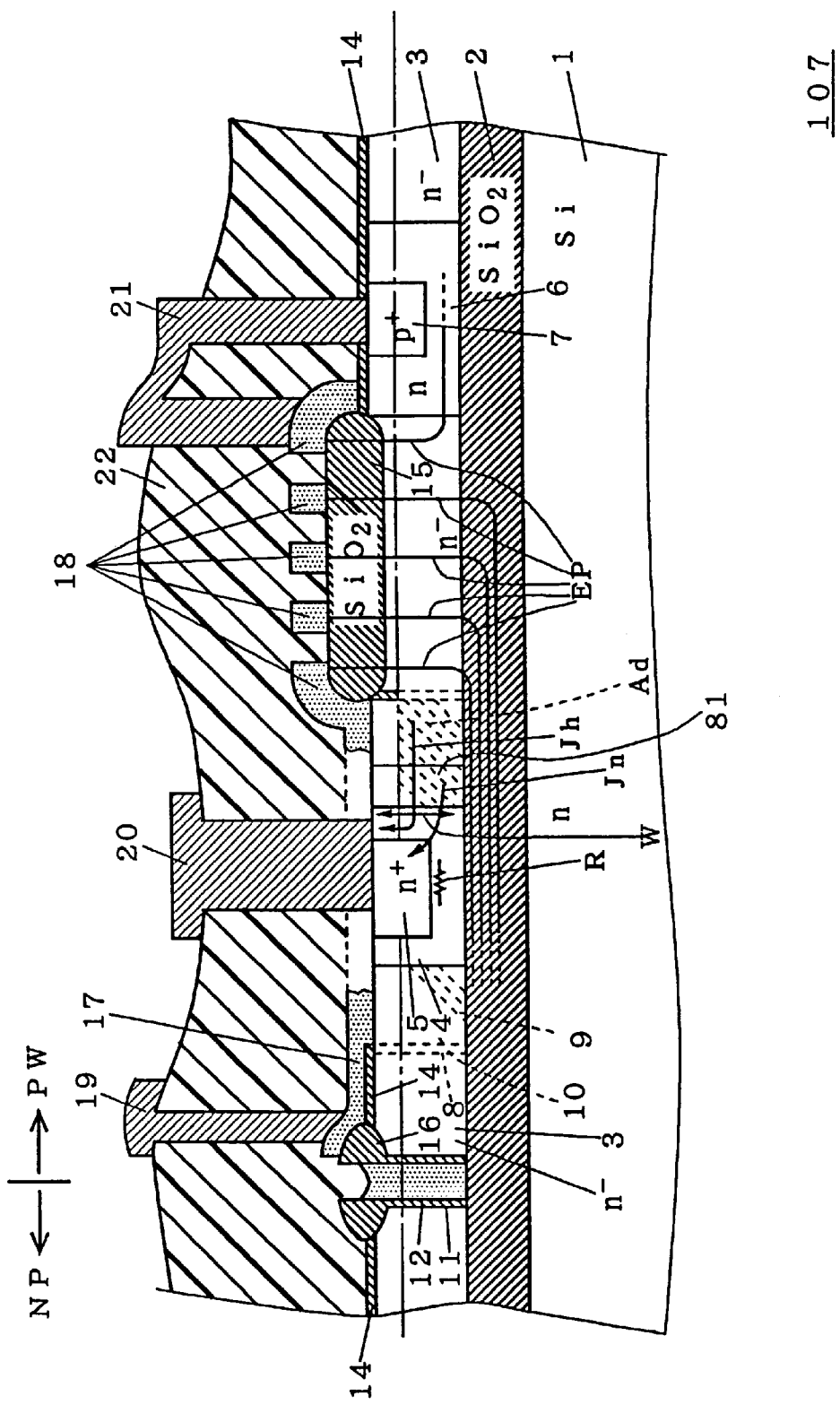
FIG. 41 is a sectional front view showing an device according to a seventh embodiment.

FIG. 41 is a sectional front view showing an device according to a seventh embodiment. An device 107 is characteristically different from the device 106 in that a p-type base layer 4, an n-type well layer 81 and an n-type buffer layer 6, as well as a gate trench 8, have such depths as to reach an upper principal surface of a silicon oxide film 2.

In the device 107, the p-type base layer 4 and the n-type well layer 81 have such depths as to reach the upper principal surface of the silicon oxide film 2. Therefore, all hole currents Jh flowing from an n-type silicon layer 3 to the p-type base layer 4 pass through the n-type well layer 81. Consequently, a hole is accumulated more effectively in the vicinity of a boundary between the n-type well layer 81 and the n-type silicon layer 3 than in the device 106. As a result, the effect of reducing an ON-state voltage can further be enhanced.

In order to manufacture the device 107, it is preferable that a semiconductor layer formed at each of the steps shown in FIGS. 7, 8 and 40 should have such a depth as to reach the upper principal surface of the silicon oxide film 2 in the process of manufacturing the device 106. In other words, it is possible to obtain the device 107 having a lower ON-state voltage without adding a new step to the process of manufacturing the device 106.

8. Eighth Embodiment

Figure 42:
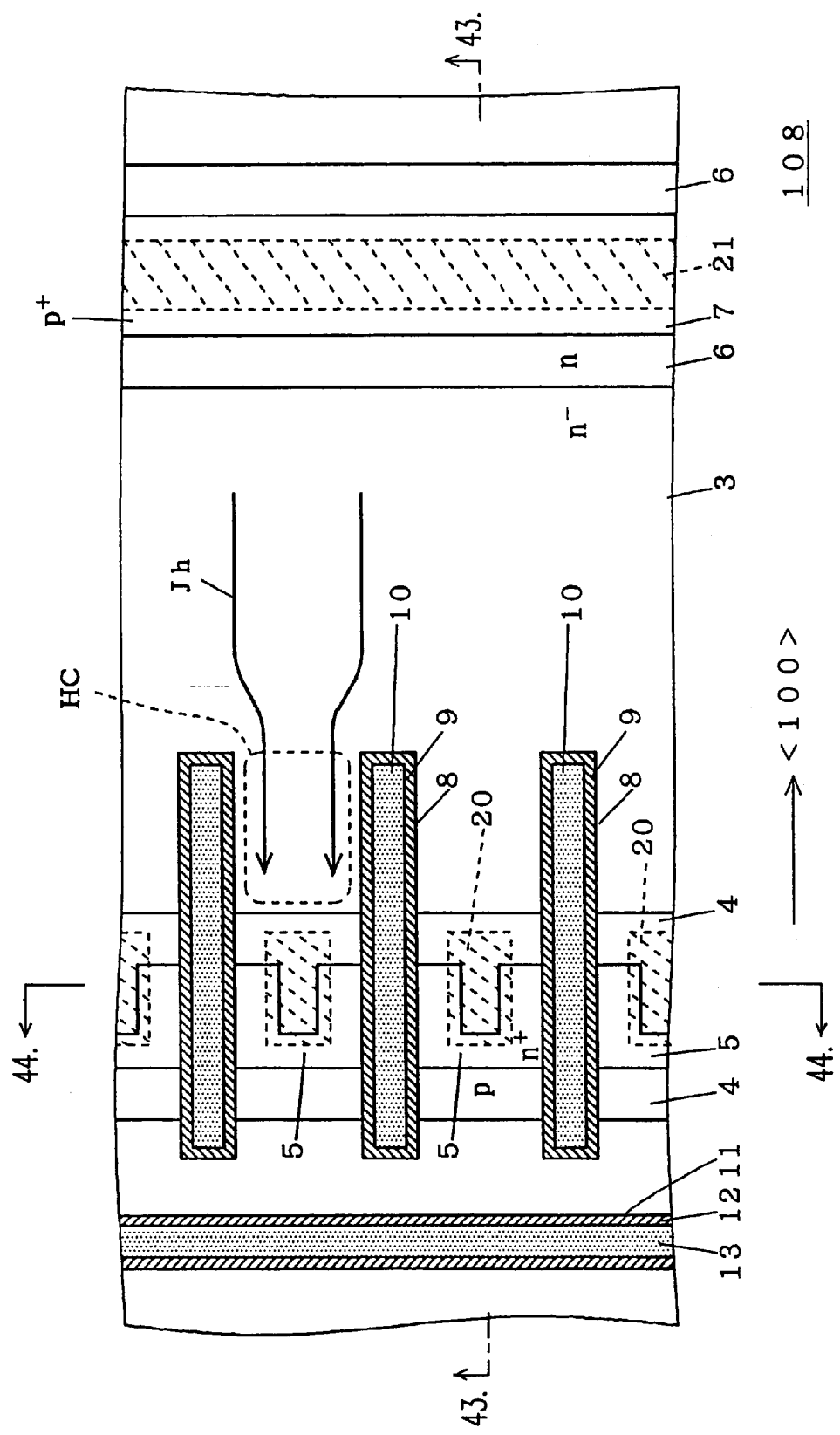
FIG. 42 is a sectional plan view showing an device according to an eighth embodiment.
Figure 43:
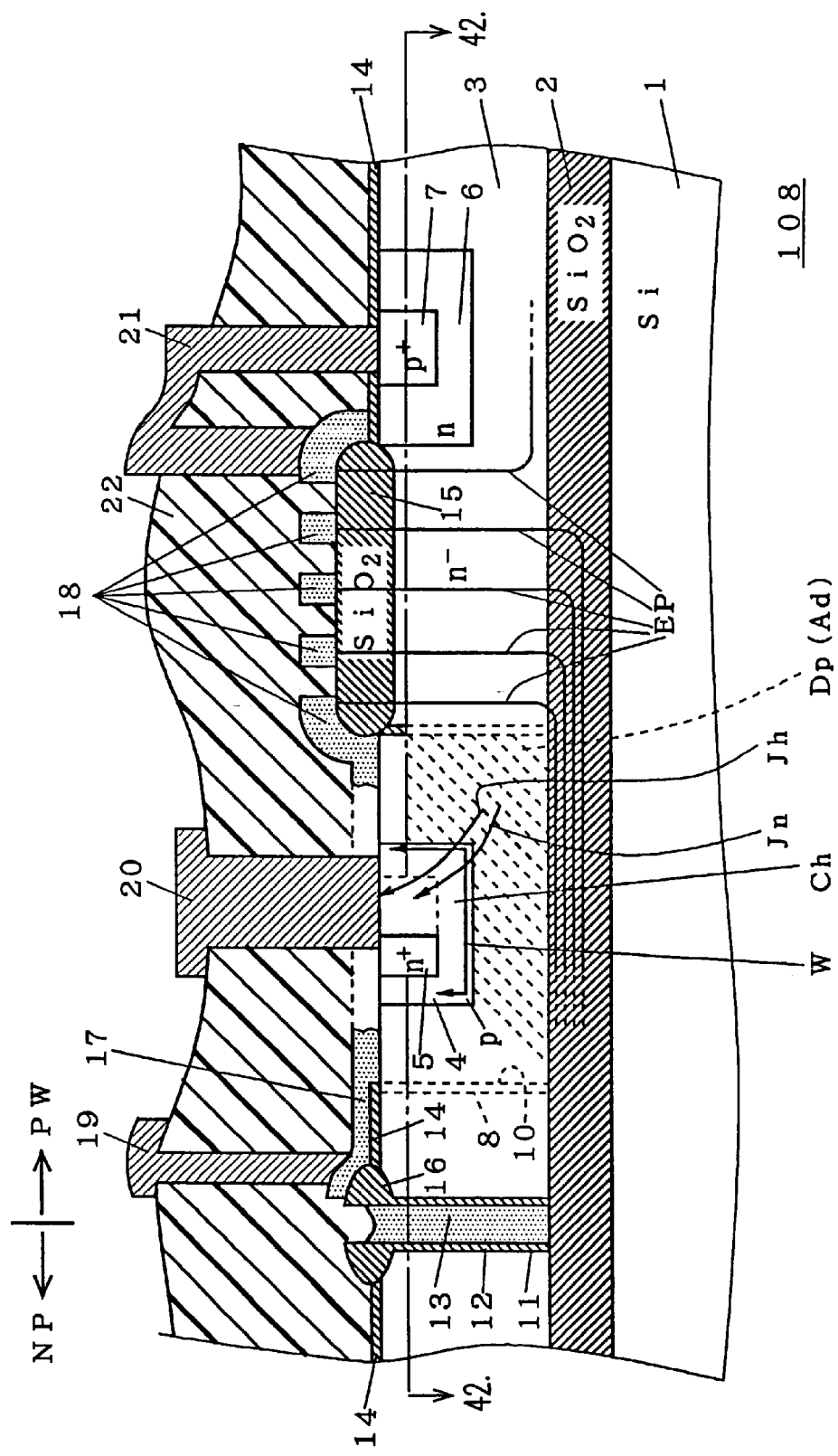
FIG. 43 is a sectional view taken along the line A—A shown in FIG. 42.

FIG. 42 is a sectional plan view showing an device according to an eighth embodiment. FIG. 43 is a sectional view taken along the line A—A shown in FIG. 42. FIG. 42 corresponds to a sectional view taken along the line D—D shown in FIG. 43. An device 108 is characteristically different from the device 101 in that a central portion of a side wall of an n-type emitter layer 5 interposed between adjacent gate trenches 8 which is opposite to a collector electrode 21 (or a p-type collector layer 7) retreats in such a manner that the n-type emitter layer 5 has a sectional U plane shape. An emitter electrode 20 is also connected to an upper principal surface of a portion of a p-type base layer 4 corresponding to a retreating portion of the n-type emitter layer 5.

Owing to the characteristic of the device 108, a path for a hole current Jh flowing from an n-type silicon layer 3 into the emitter electrode 20 through the p-type base layer 4 is enlarged on the p-type base layer 4. For this reason, it is possible to suppress a voltage drop caused by the hole current Jh on the p-type base layer 4. Thus, a latch-up tolerance can be enhanced.

Figure 44:
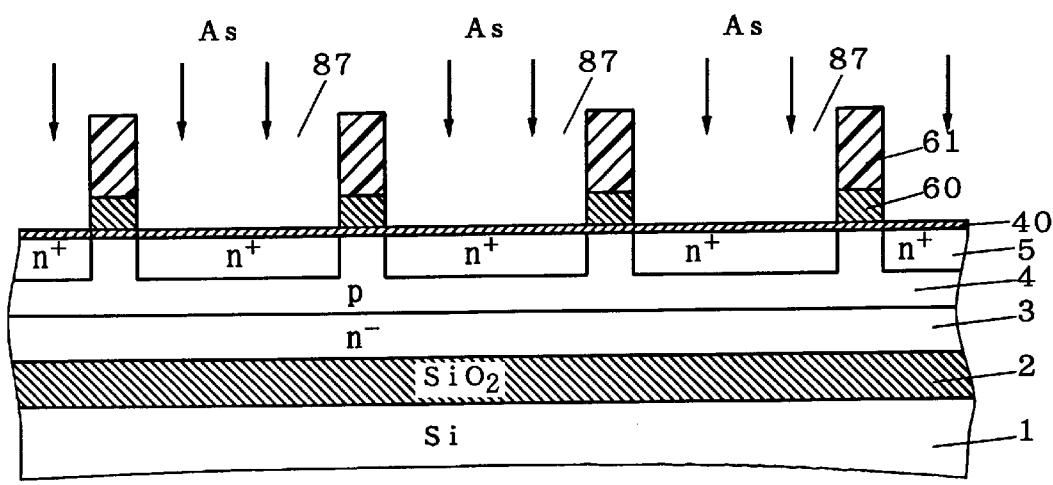
FIG. 44 is a diagram showing a process of manufacturing the device according to the eighth embodiment.

In order to manufacture the device 108, it is preferable that the opening 63 at the step shown in FIG. 9 should be replaced with an opening 87 shown in FIG. 44 in the process of manufacturing the device 101 shown in FIGS. 7 to 24. FIG. 44 shows a section taken along the line E—E in FIG. 42 at a step of forming the n-type emitter layer 5. The opening 87 has a sectional U shape corresponding to the sectional shape of the n-type emitter layer 5 shown in FIG. 42.

At the steps of forming the gate trench 8 and the isolation trench 11 shown in FIGS. 12 and 13, the gate trench 8 is formed so as to divide the central portion of each section of the n-type emitter layer 5 which appears periodically in FIG. 44. Thus, it is possible to obtain the device 108 having a high latch-up tolerance without adding a new step to the process of manufacturing the device 101.

9. Ninth Embodiment

Figure 45:
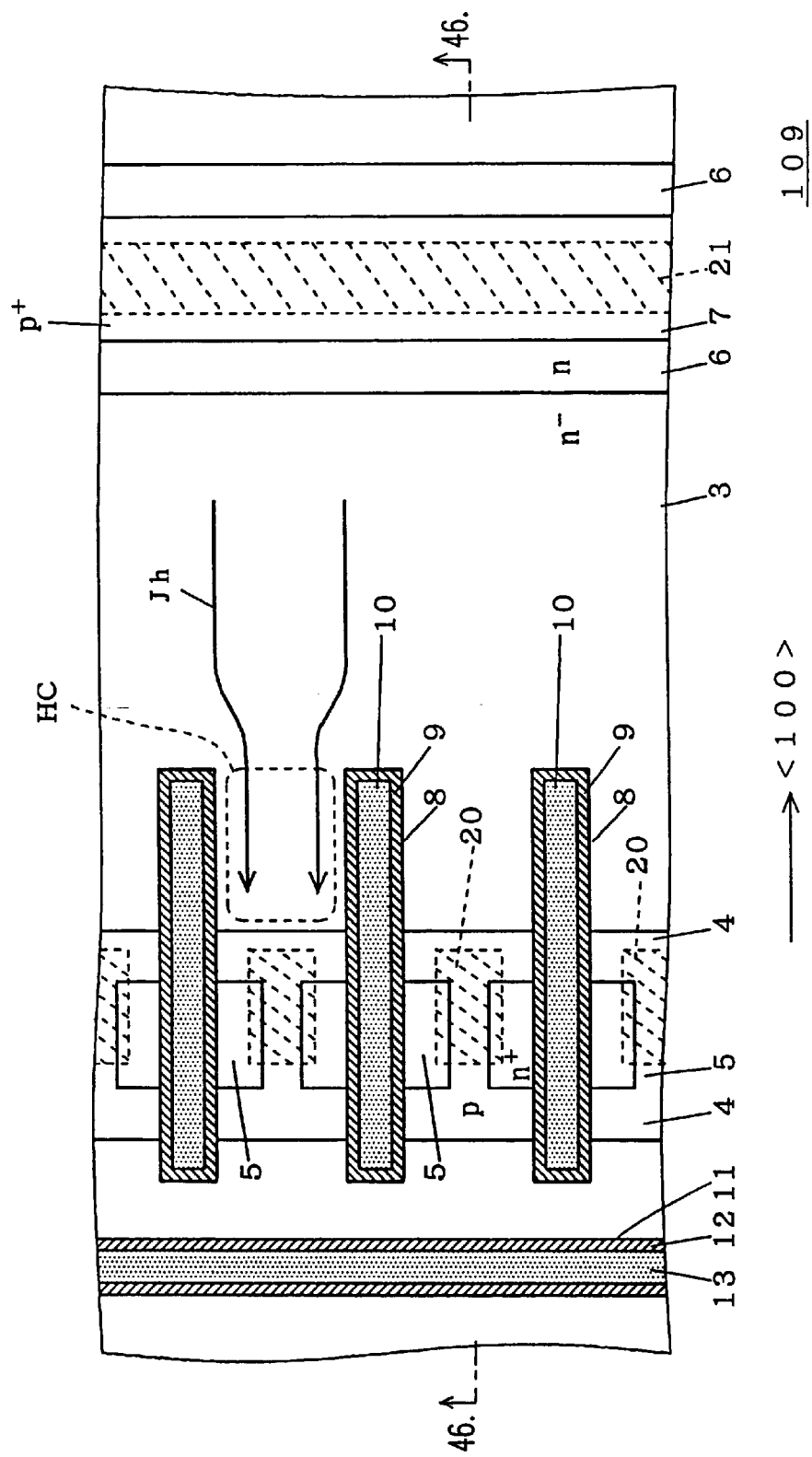
FIG. 45 is a sectional plan view showing an device according to a ninth embodiment.
Figure 46:
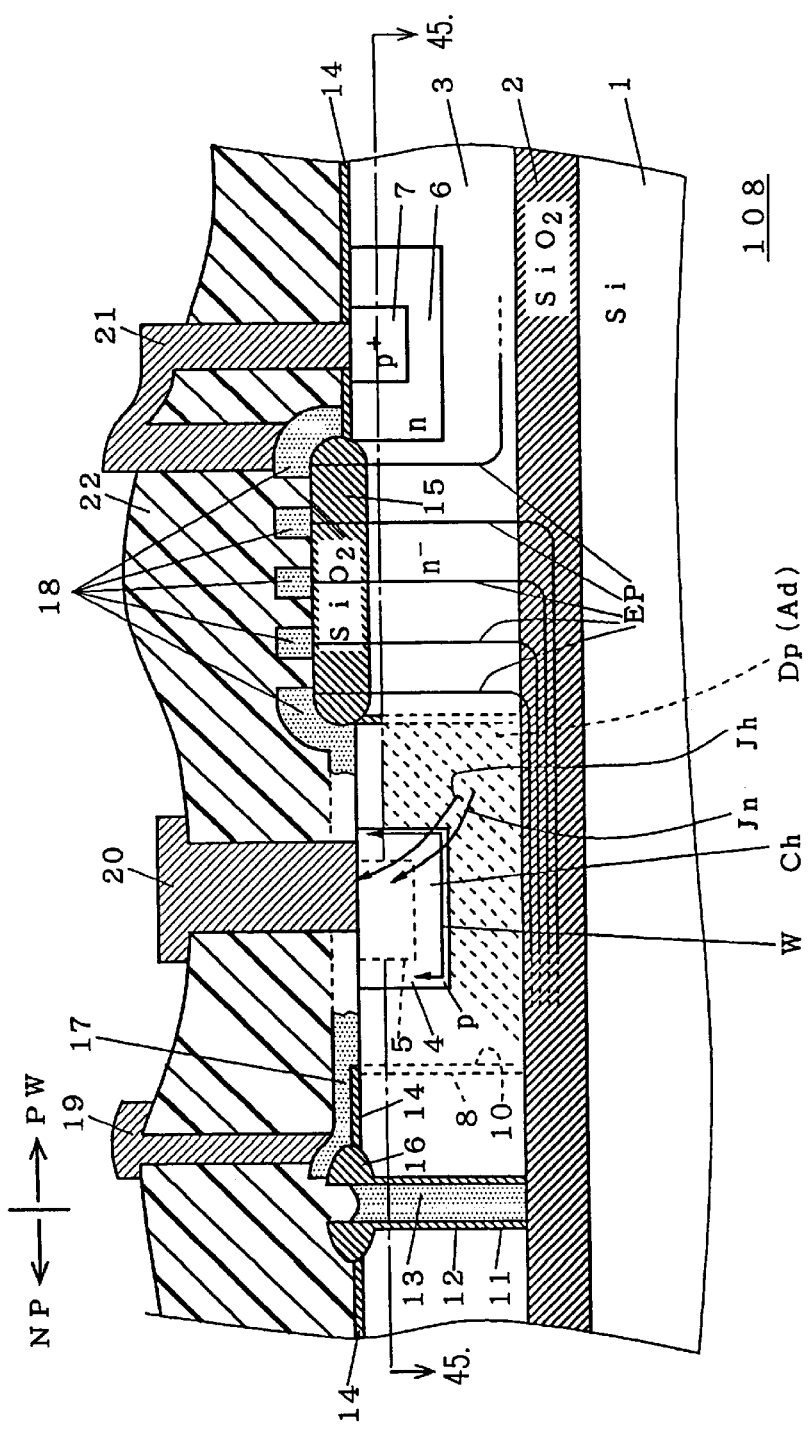
FIG. 46 is a sectional view taken along the line A—A shown in FIG. 45.

FIG. 45 is a sectional plan view showing an device according to a ninth embodiment. FIG. 46 is a sectional view taken along the line A—A shown in FIG. 45. FIG. 45 corresponds to a sectional view taken along the line D—D shown in FIG. 46. An device 109 is characteristically different from the device 101 in that an n-type emitter layer 5 is divided into two portions by a p-type base layer 4 in a central portion of a region interposed between adjacent gate trenches 8.

In other words, the device 109 has a structure in which a central portion of a side wall of the n-type emitter layer 5 opposite to a collector electrode 21 (or a p-type collector layer 7) retreats up to an opposite side. In this sense, the device 108 and 109 correspond to special examples of a form in which the central portion of the side wall of the n-type emitter layer 5 retreats, respectively. Also in the device 109, an emitter electrode 20 is connected to at least a part of an upper principal surface of a portion of the p-type base layer 4 which fills up the retreating portion of the n-type emitter layer 5 in the same manner as in the device 108.

Owing to the characteristic of the device 109, a path for a hole current Jh flowing from an n-type silicon layer 3 into the emitter electrode 20 through the p-type base layer 4 is enlarged on the p-type base layer 4. In particular, the path for the hole current Jh is enlarged more than in the device 108. Consequently, a latch-up tolerance can be enhanced more than in the device 108.

In order to manufacture the device 109, it is preferable that the opening 87 at the step of manufacturing the device 108 shown in FIG. 44 should be formed to have a sectional shape corresponding to the plane shape of the n-type emitter layer 5 shown in FIG. 45. A sectional view taken along the line E—E shown in FIG. 45 at a step of forming the n-type emitter layer 5 is identical to FIG. 44. Thus, it is possible to obtain the device 109 having a much higher latch-up tolerance without adding a new step to the process of manufacturing the device 108.

10. Tenth Embodiment

Figure 47:
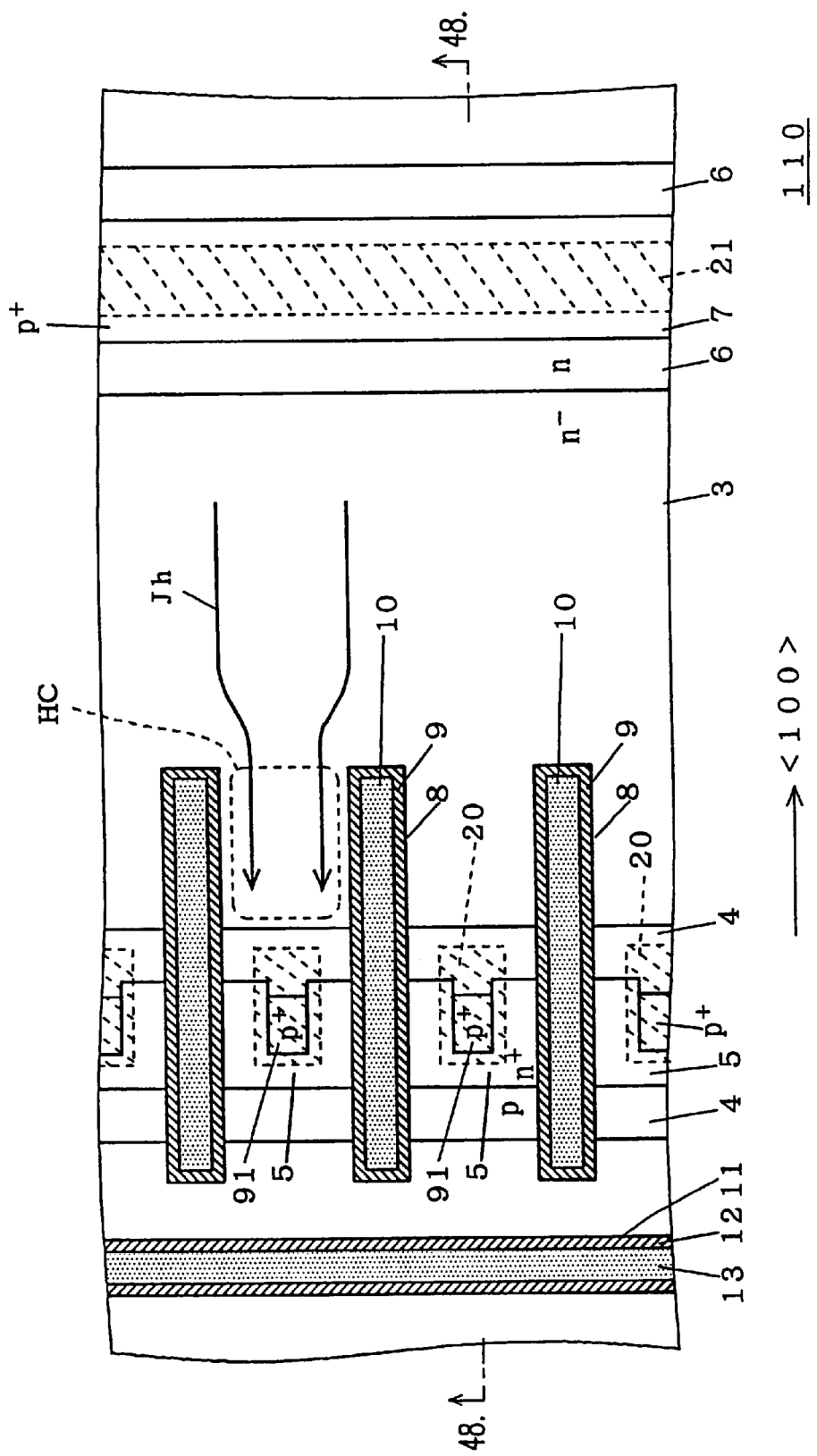
FIG. 47 is a sectional plan view showing an device according to a tenth embodiment.
Figure 48:
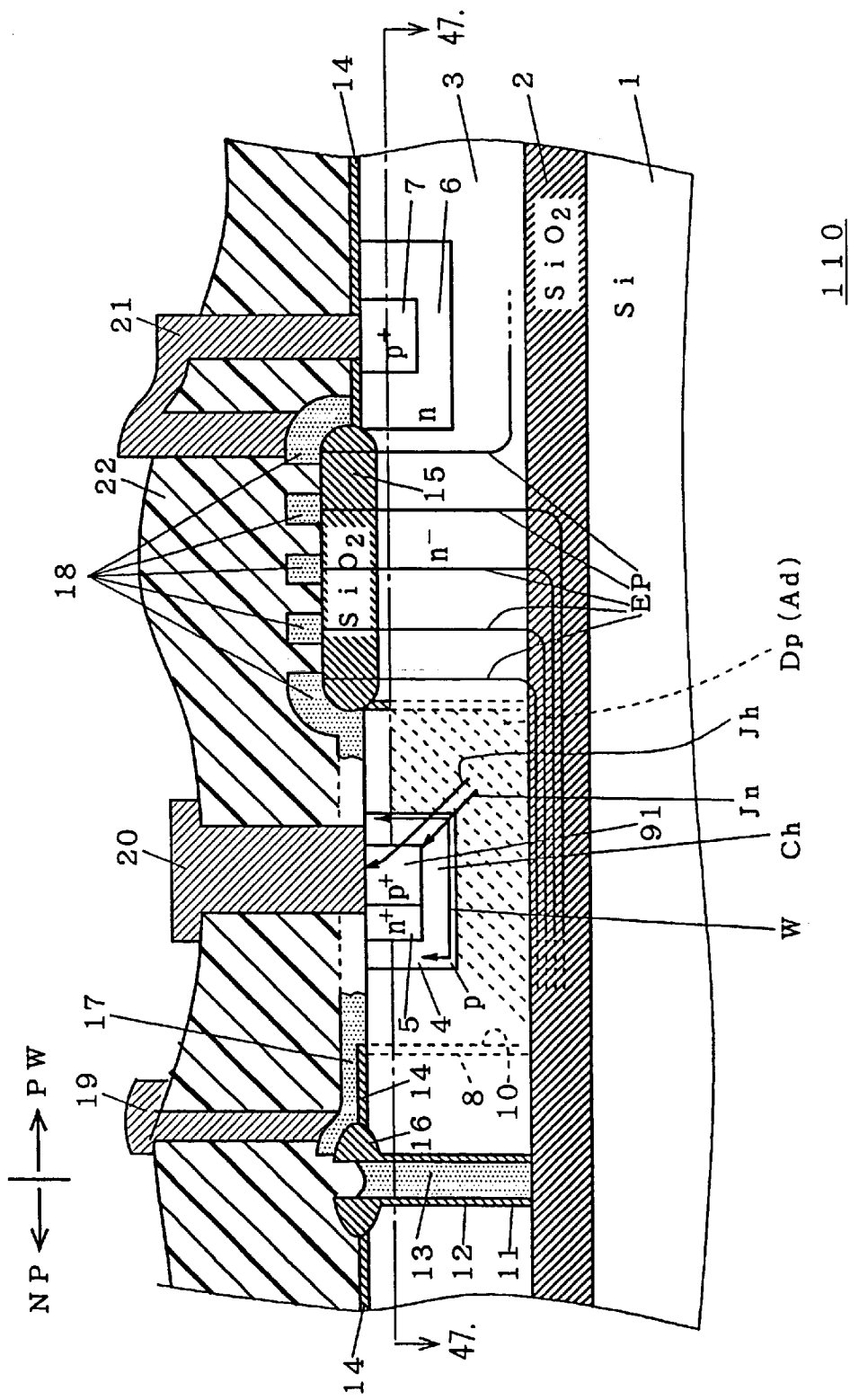
FIG. 48 is a sectional view taken along the line A—A shown in FIG. 47.

FIG. 47 is a sectional plan view showing an device according to a tenth embodiment. FIG. 48 is a sectional view taken along the line A—A shown in FIG. 47. FIG. 47 corresponds to a sectional view taken along the line D—D shown in FIG. 48. An device 110 is characteristically different from the device 108 in that a p-type silicon layer (a fifth semiconductor layer) 91 is formed in a retreating portion of an n-type emitter layer 5 having a sectional plane shape in which a part retreats in a U shape in such a manner that it comes in contact with the n-type emitter layer 5. An emitter electrode 20 is also connected to an upper principal surface of the p-type silicon layer 91.

A concentration of a p-type impurity in the p-type silicon layer 91 is set higher than that in a p-type base layer 4. For this reason, a voltage drop generated by a hole current Jh passing through the p-type base layer 4 including the p-type silicon layer 91 can be suppressed more than in the device 108. As a result, a latch-up tolerance can further be enhanced.

Figures 49, 50:
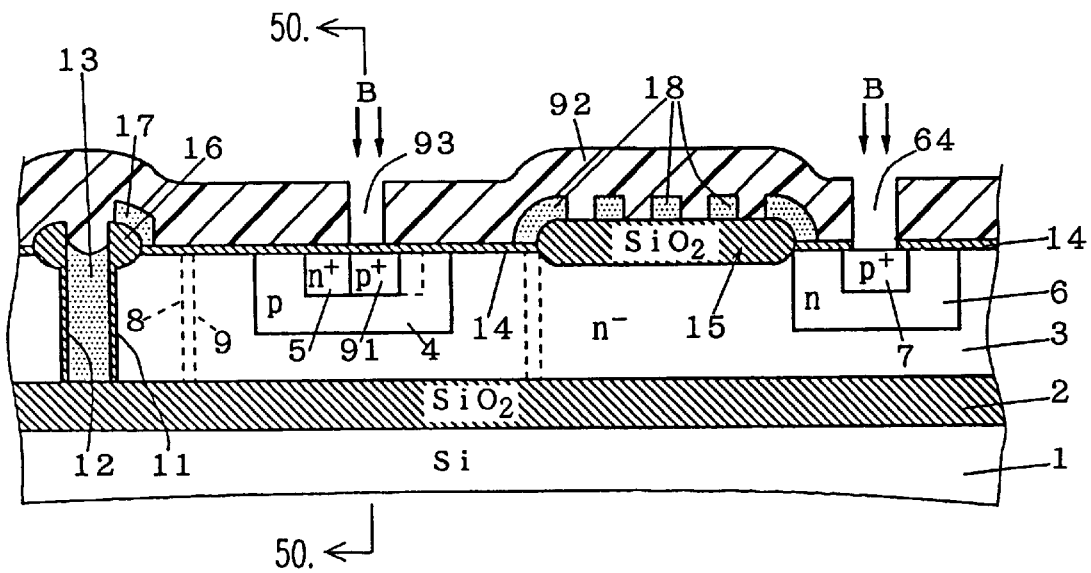
FIG. 49 is a diagram showing a process of manufacturing the device according to the tenth embodiment.
FIG. 50 is a diagram showing the process of manufacturing the device according to the tenth embodiment.

In order to manufacture the device 110, it is preferable that steps shown in FIGS. 49 and 50 should be performed in place of the step of manufacturing the device 108 shown in FIG. 18, for example. FIG. 50 is a sectional view taken along the line E—E shown in FIG. 49. At the steps shown in FIGS. 49 and 50, a resist layer 92 having an opening 64 corresponding to a p-type collector layer 7 and an opening 93 corresponding to the p-type silicon layer 91 is formed in place of the resist layer 63 having the opening 64 shown in FIG. 18. Boron is selectively implanted through the two kinds of openings 64 and 93. Consequently, the p-type collector layer 7 and the p-type silicon layer 91 are formed at the same time.

Figure 51:
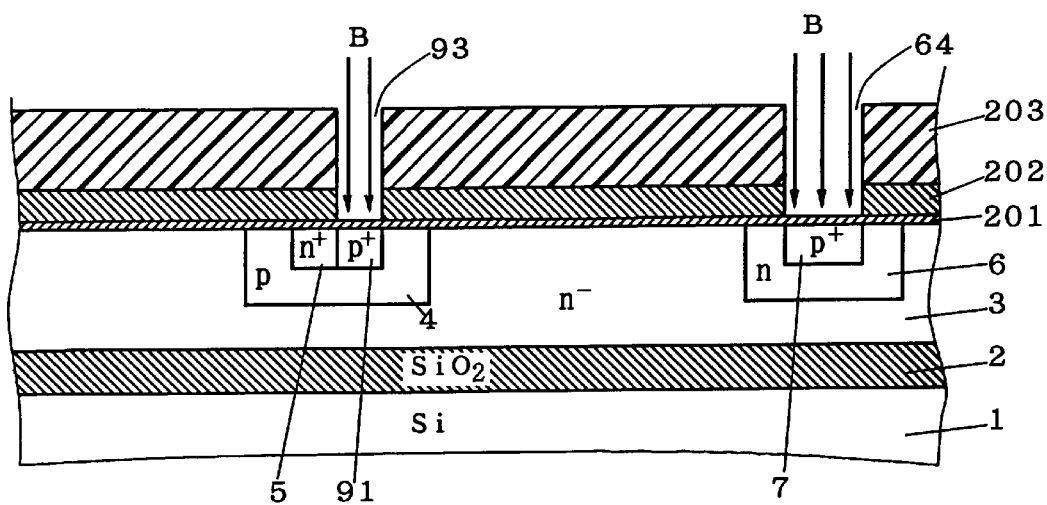
FIG. 51 is a diagram showing the process of manufacturing the device according to the tenth embodiment.

In order to manufacture the device 110, a step shown in FIG. 51 may be performed in place of the step shown in FIG. 25 in the method for manufacturing the device 108 using the step shown in FIG. 25. At the step shown in FIG. 51, an opening 93 corresponding to a p-type silicon layer 91 is formed on a resist layer 203 in addition to an opening 64 corresponding to a p-type collector layer 7. Then, boron is selectively implanted through the two kinds of openings 64 and 93. Consequently, the p-type collector layer 7 and the p-type silicon layer 91 are formed at the same time.

By any method described above, it is possible to obtain the device 110 having a much higher latch-up tolerance without adding a new step to the process of manufacturing the device 108.

11. Eleventh Embodiment

Figure 52:
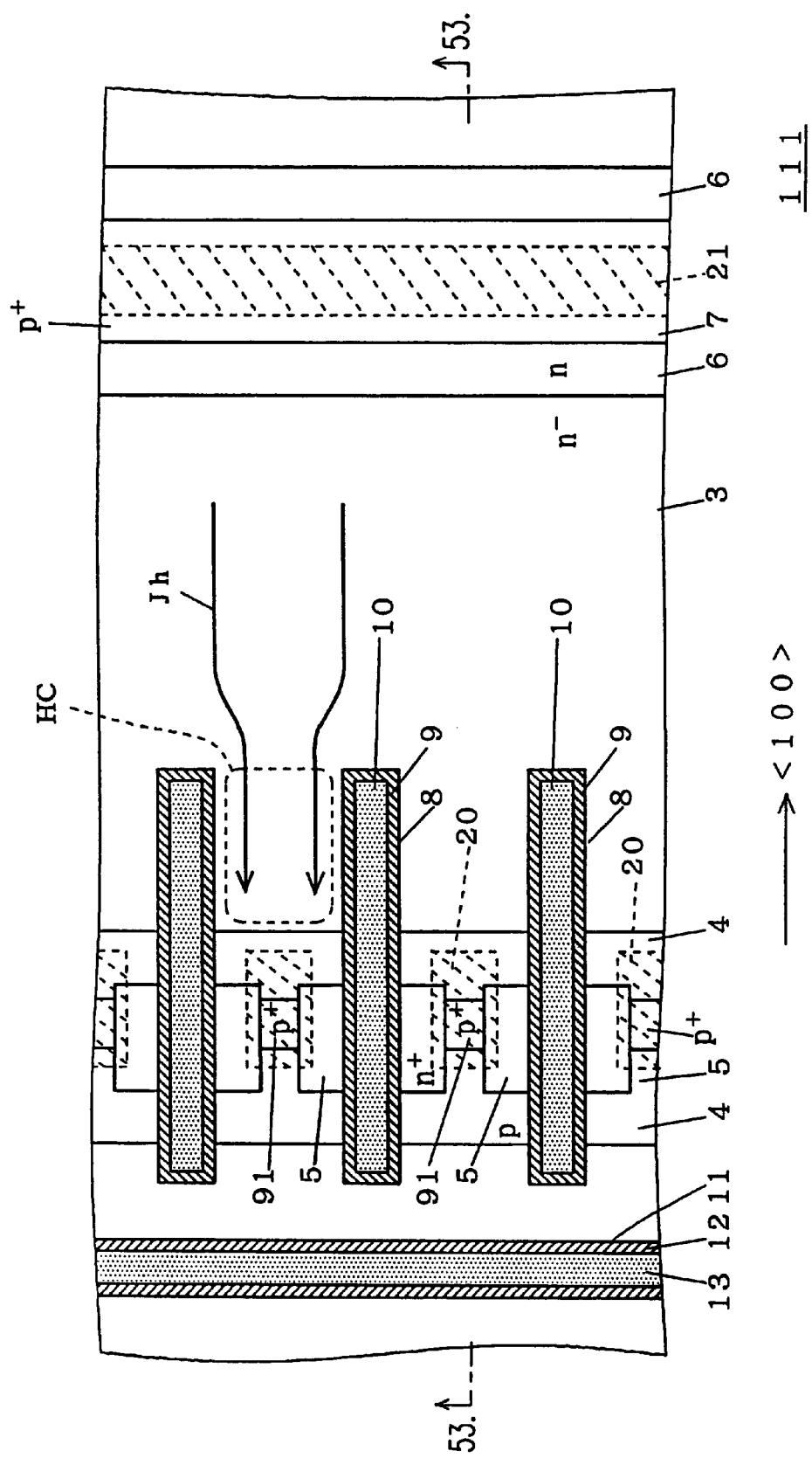
FIG. 52 is a sectional plan view showing an device according to an eleventh embodiment.
Figure 53:
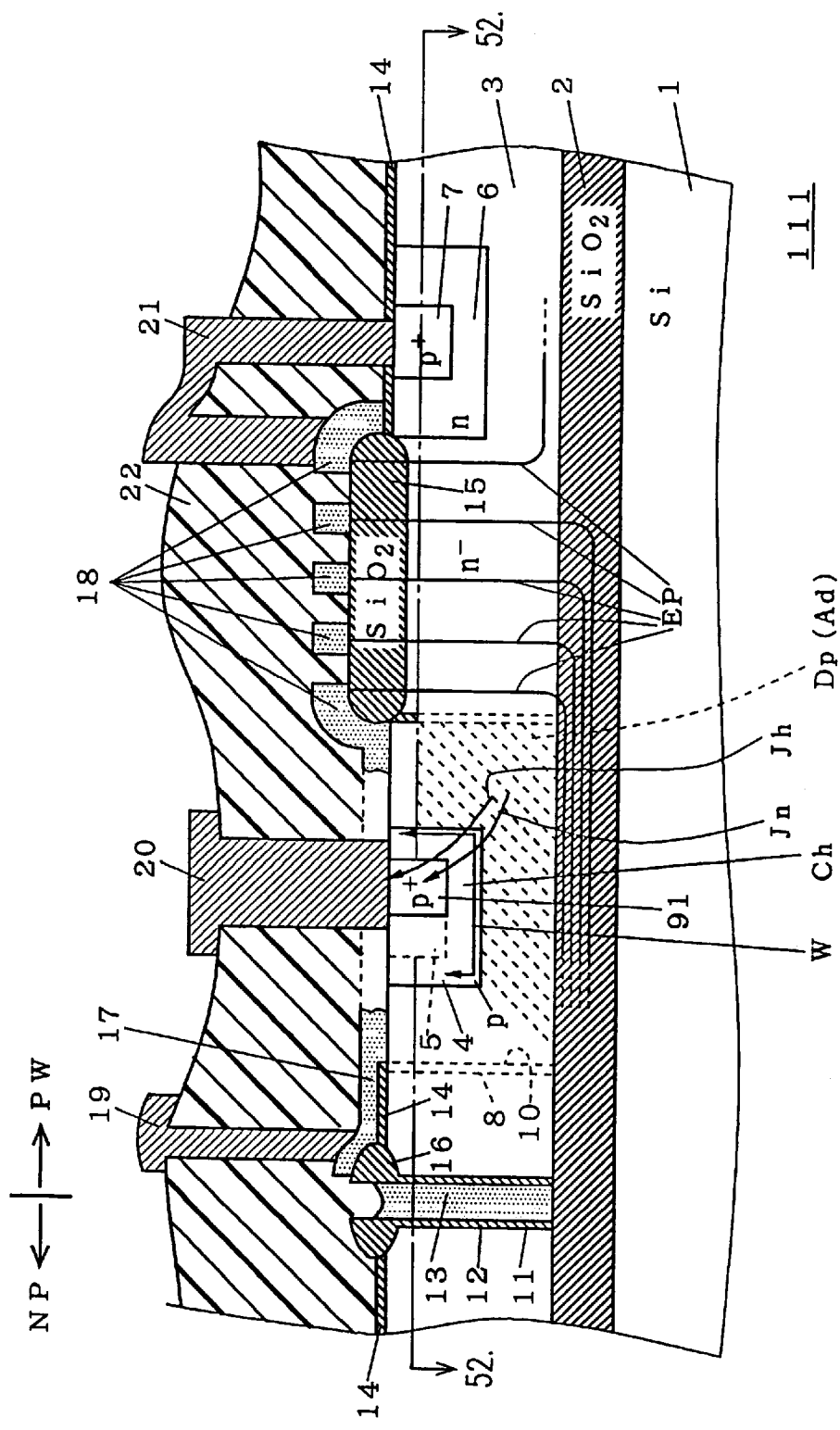
FIG. 53 is a sectional view taken along the line A—A shown in FIG. 52.

FIG. 52 is a sectional plan view showing an device according to an eleventh embodiment. FIG. 53 is a sectional view taken along the line A—A shown in FIG. 52. FIG. 52 corresponds to a sectional view taken along the line D—D shown in FIG. 53. In the same manner as the device 109, an device 111 has a structure in which an n-type emitter layer 5 is divided into two portions by a p-type base layer 4 in a central portion of a region interposed between adjacent gate trenches 8. In the same manner as the device 110, furthermore, a p-type silicon layer 91 containing a p-type impurity at a higher concentration than the p-type base layer 4 is formed in a portion of the p-type base layer 4 interposed between the n-type emitter layers 5 so as to come in contact with the n-type emitter layers 5. An emitter electrode 20 is also connected to an upper principal surface of the p-type silicon layer 91.

Owing to the characteristic of the device 111, a voltage drop generated by a hole current Jh which passes through the p-type base layer 4 including the p-type silicon layer 91 can be suppressed more than in the device 109 and 110. As a result, a latch-up tolerance can further be enhanced.

In order to manufacture the device 111, it is preferable that the process of manufacturing the device 109 and that of manufacturing the device 110 should be combined and performed. More specifically, it is preferable that the steps shown in FIGS. 49 and 50 should be performed in place of the step of manufacturing the device 109 shown in FIG. 18. The step shown in FIG. 51 may be performed in place of the step shown in FIG. 25 in the method for manufacturing the device 109 using the step shown in FIG. 25. In any method described above, it is possible to obtain the device 111 having a much higher latch-up tolerance without adding a new step to the process of manufacturing the device 109 or 110.

12. Twelfth Embodiment

Figure 54:
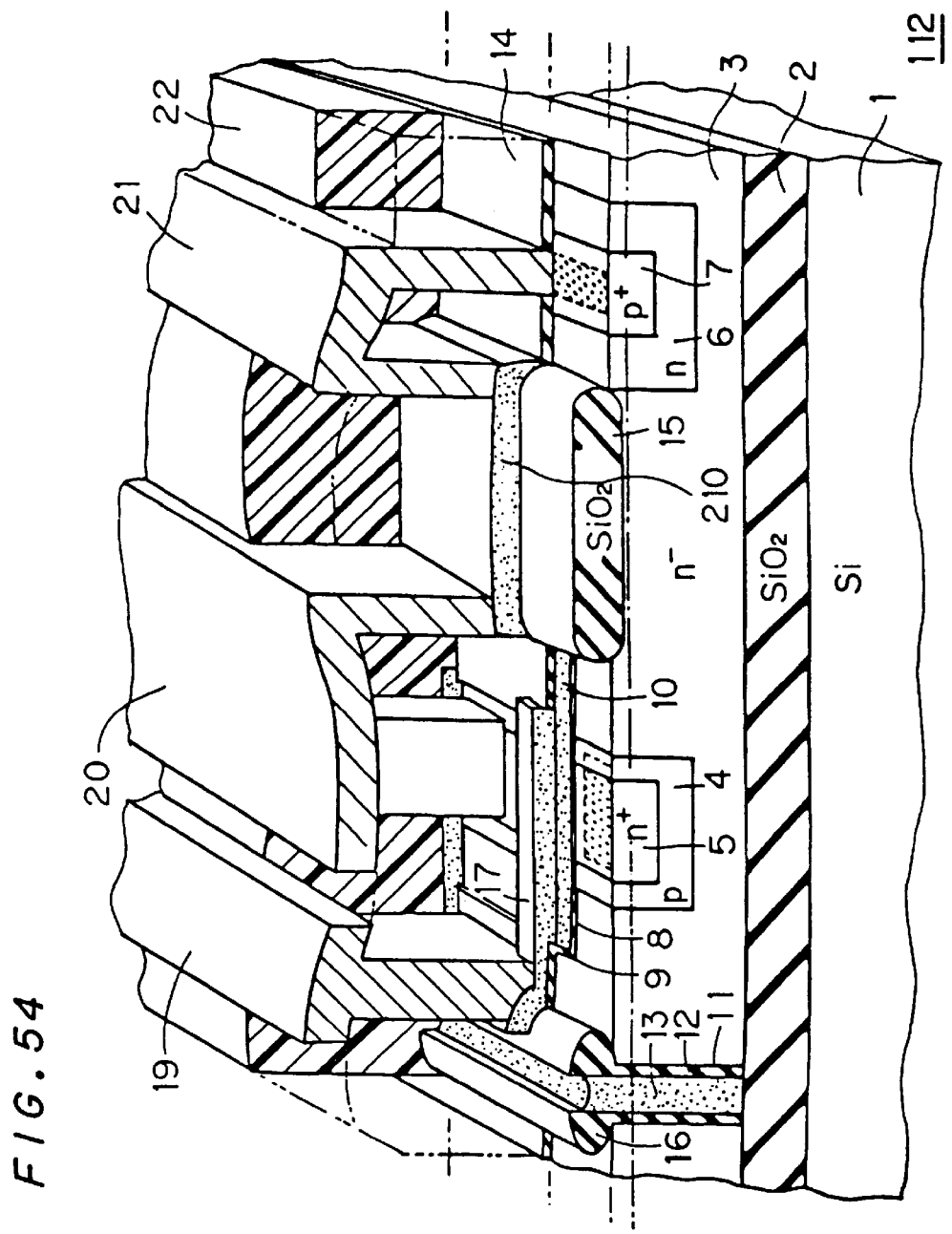
FIG. 54 is a sectional perspective view showing an device according to a twelfth embodiment.
Figure 55:
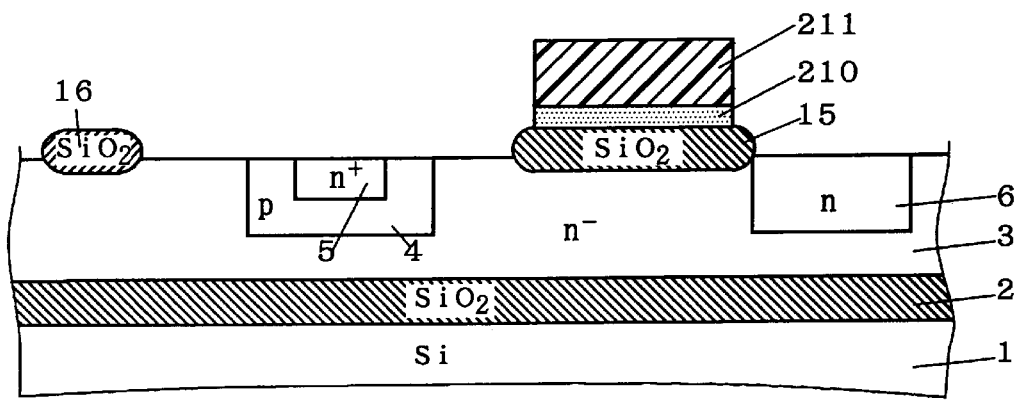
FIG. 55 is a diagram showing a process of manufacturing the device according to the twelfth embodiment.

At FIG. 54 is a sectional perspective view showing an device according to a twelfth embodiment. An device 112 is characteristically different from the device 101 in that a field plate 210 formed as a high resistance member is provided in place of the field plate 18 utilizing capacity coupling. The field plate 210 is formed by a polycrystalline semiconductor having an electric resistance which is increased as an insulator is approached, that is, a so-called SIPOS (Semi-Insulating Polycrystalline Silicon).

The field plate 210 covers an upper surface of a LOCOS 15, and has an end closer to a p-type collector layer 7 to which a collector electrode 21 is connected and has an end closer to an n-type emitter layer 5 to which an emitter electrode 20 is connected. The field plate 210 is continuously provided integrally without a clearance from one of the ends to the other end. Accordingly, a current having a small magnitude flows from one of the ends to the other end in the field plate 210.

For this reason, an electric potential of the field plate 210 is consecutively changed from an electric potential of the collector electrode 21 to that of the emitter electrode 20 with a movement from one of the ends to the other end. Differently from the field plate 18, the field plate 210 is continuously provided integrally without a clearance from one of the ends to the other end. Therefore, the electric potential of the field plate 210 is changed more smoothly than in the field plate 18. Accordingly, uniformity of distribution of an electric field on an n-type silicon layer 3 provided under the field plate 18 is increased more. Consequently, a breakdown voltage of the device can further be enhanced.

In order to manufacture the device 112, it is preferable that steps shown in FIGS. 55 to 60 should be performed after the steps of manufacturing the device 101 shown in FIGS. 7 to 11 are performed. At the step shown in FIG. 55, a polysilicon layer doped with no impurity, that is, a SIPOS layer is first deposited on an n-type silicon layer 3 and LOCOSs 15 and 16, and a resist layer is formed on the SIPOS layer. Subsequently, the resist layer is selectively removed except for an upper region of the LOCOS 15. Consequently, a patterned resist layer 211 is obtained. The polysilicon layer is subjected to selective etching by using the resist layer 211 as a shield. Thus, a field plate 210 is formed on the LOCOS 15. Then, the resist layer 211 is removed.

Figure 56:
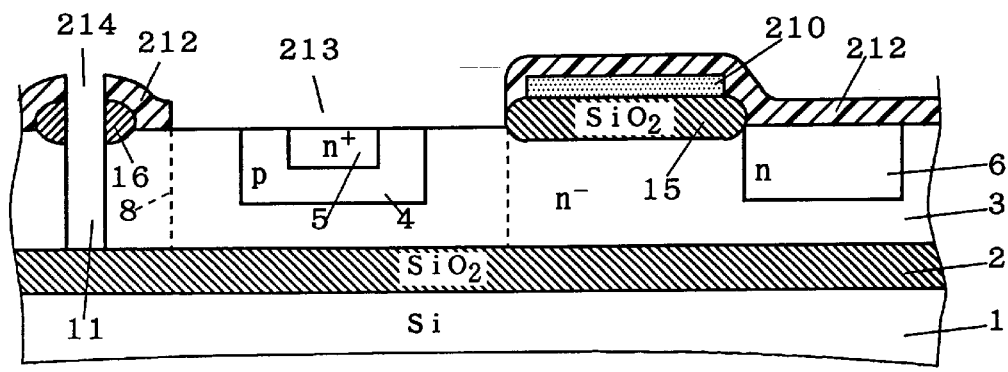
FIG. 56 is a diagram showing the process of manufacturing the device according to the twelfth embodiment.

At the step shown in FIG. 56, a TEOS layer is deposited on the n-type silicon layer 3, the LOCOSs 15 and 16, and the field plate 210. Thereafter, openings 213 and 214 are selectively formed in portions of the TEOS layer in which a gate trench 8 and an isolation trench 11 are to be formed. As a result, a patterned TEOS layer 212 is formed. RIE is carried out by using the TEOS layer 212 as a shield. Consequently, the gate trench 8 and the isolation trench 11 are formed in portions of the n-type silicon layer 3 corresponding to the openings 213 and 214, respectively. The RIE is performed until the gate trench 8 and the isolation trench 11 completely penetrate the n-type silicon layer 3. Then, the TEOS layer 212 is removed.

Figure 57:
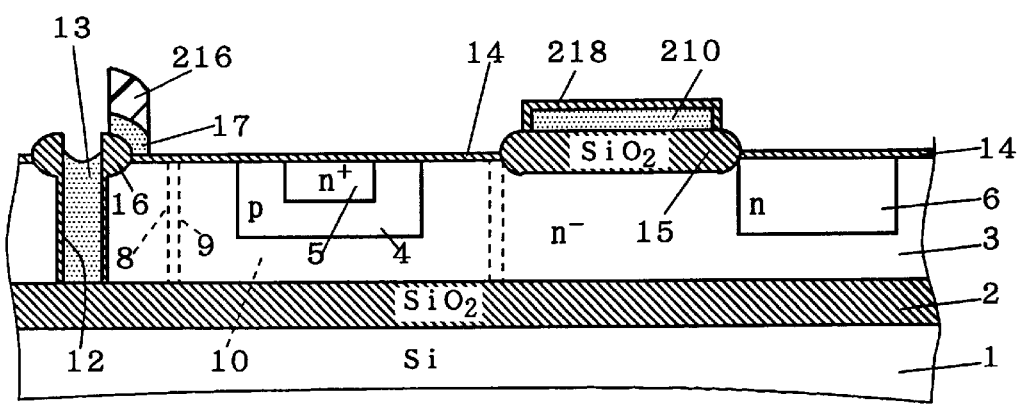
FIG. 57 is a diagram showing the process of manufacturing the device according to the twelfth embodiment.

At the step shown in FIG. 57, a silicon oxide film is formed on surfaces of the n-type silicon layer 3 and the field plate 210. As a result, an insulation film 14 is formed over a whole region which is not covered with the LOCOSs 15 and 16 on an upper principal surface of the n-type silicon layer 3, and a gate insulation film 9 and an isolation insulation film 12 are formed on internal walls of the gate trench 8 and the isolation trench 11 which are defined by the n-type silicon layer 3, that is, side walls thereof, respectively. Furthermore, an insulation film 218 is formed on the surface of the field plate 210, that is, an upper surface and a side wall thereof.

Then, polysilicon doped with impurities is deposited over a whole surface of an intermediate product. As a result, a gate electrode 10 formed of the polysilicon is buried in the gate trench 8 with the gate insulation film 9 interposed therebetween. Similarly, an isolation electrode 13 formed of the polysilicon is buried in the isolation trench 11 with the isolation insulation film 12 interposed therebetween. Furthermore, an upper portion of the gate electrode 10, that of the isolation electrode 13, and upper surfaces of the insulation films 14 and 210 are covered with a polysilicon layer having a certain thickness.

After a resist layer is deposited on the polysilicon layer, it is patterned in a shape corresponding to a gate wiring 17. As a result, a patterned resist layer 216 is obtained. The polysilicon layer is subjected to selective etching by using the resist layer 216 as the shield. Consequently, the gate wiring 17 is formed.

Figure 58:
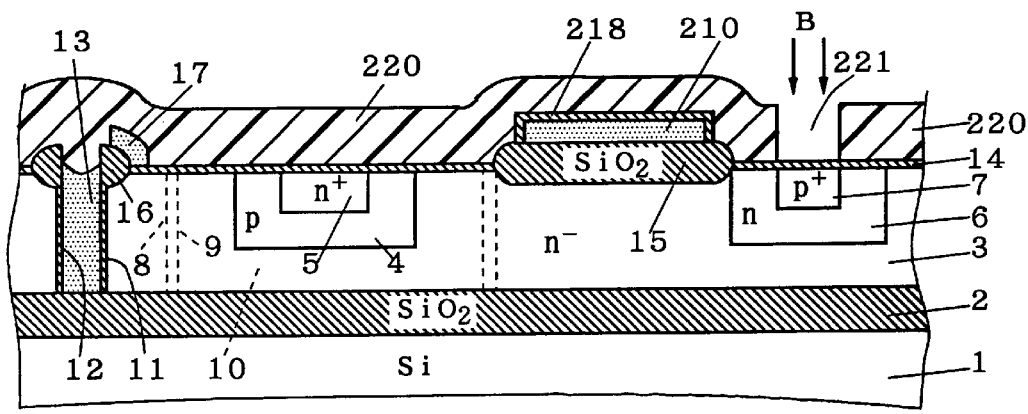
FIG. 58 is a diagram showing the process of manufacturing the device according to the twelfth embodiment.

At the step shown in FIG. 58, a resist layer 220 is deposited over a whole upper surface of the intermediate product. Then, an opening 221 is selectively formed in a portion of the resist layer 220 corresponding to a p-type collector layer 7. Thereafter, boron is implanted into the upper principal surface of the n-type silicon layer 3 by using the resist layer 220 as the shield. As a result, the p-type collector layer 7 is selectively formed in a shape corresponding to the opening 221 on the upper principal surface of the n-type silicon layer 3. Subsequently, the resist layer 220 is removed.

Figure 59:
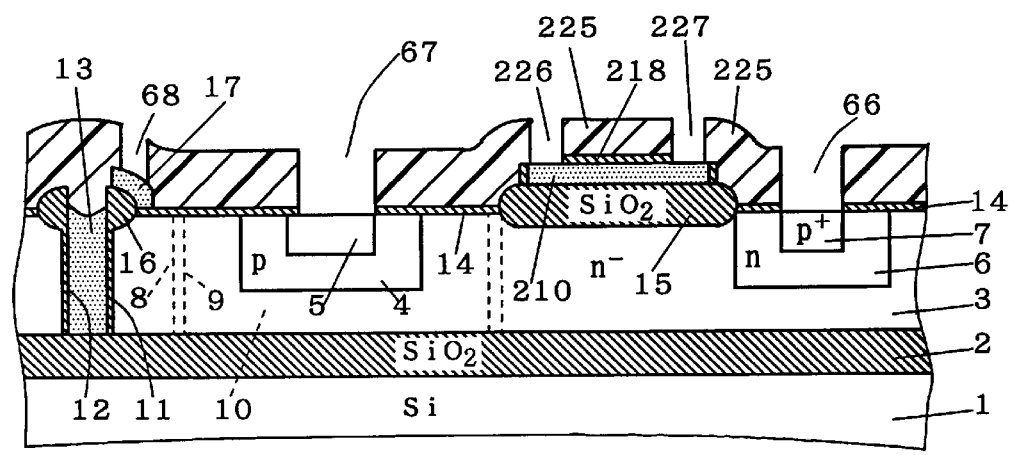
FIG. 59 is a diagram showing the process of manufacturing the device according to the twelfth embodiment.

At the step shown in FIG. 59, a TEOS layer is deposited over the whole upper surface of the intermediate product. Then, openings 66, 227, 67, 226 and 68 are selectively formed in portions of the TEOS layer which correspond to a connecting portion of the collector electrode 21 and the n-type silicon layer 3, that of the collector electrode 21 and the field plate 210, that of the emitter electrode 20 and the n-type silicon layer 3, that of the emitter electrode 20 and the field plate 210, and that of the gate wirings 17 and 19, respectively. As a result, an insulation layer 225 is formed of TEOS. The openings 66, 227, 67, 226 and 68 defined by the insulation layer 225 function as contact holes of electrodes and electrode wirings.

Figure 60:
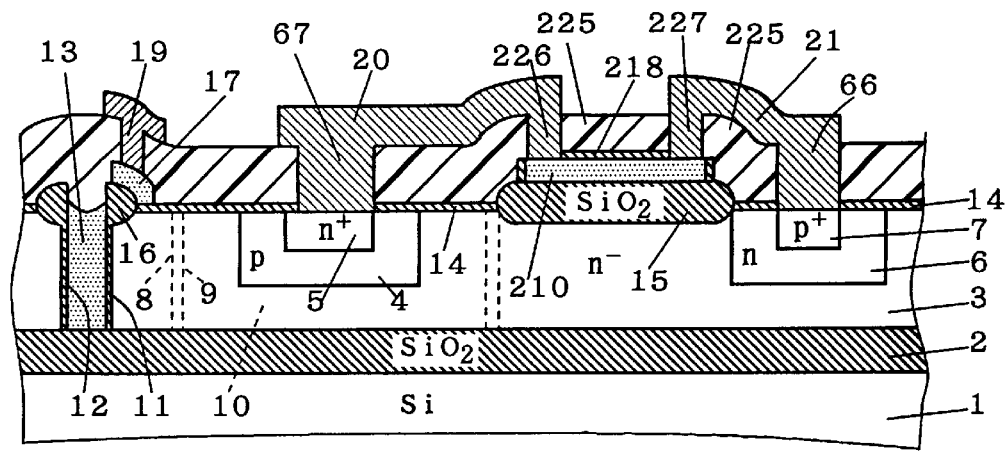
FIG. 60 is a diagram showing the process of manufacturing the device according to the twelfth embodiment.

At the step shown in FIG. 60, aluminum is first deposited over the whole upper surface of the intermediate product. As a result, the openings 66, 227, 67, 226 and 68 acting as the contact holes are filled with the aluminum. More specifically, the aluminum is connected to the n-type silicon layer 3, the field plate 210 or the gate wiring 17 in a bottom portion of each contact hole. Furthermore, the aluminum is deposited over upper portions of the openings 66, 227, 67, 226 and 68 and an upper portion of the insulation layer 225.

Then, selective etching is carried out by using a shield which is not shown. Consequently, the aluminum deposit layer is patterned. As a result, the gate wiring 19, the emitter electrode 20 and the collector electrode 21 are formed from the aluminum deposit layer. By performing the above-mentioned steps, the device 112 can easily be obtained.

13. Thirteenth Embodiment

Figure 61:
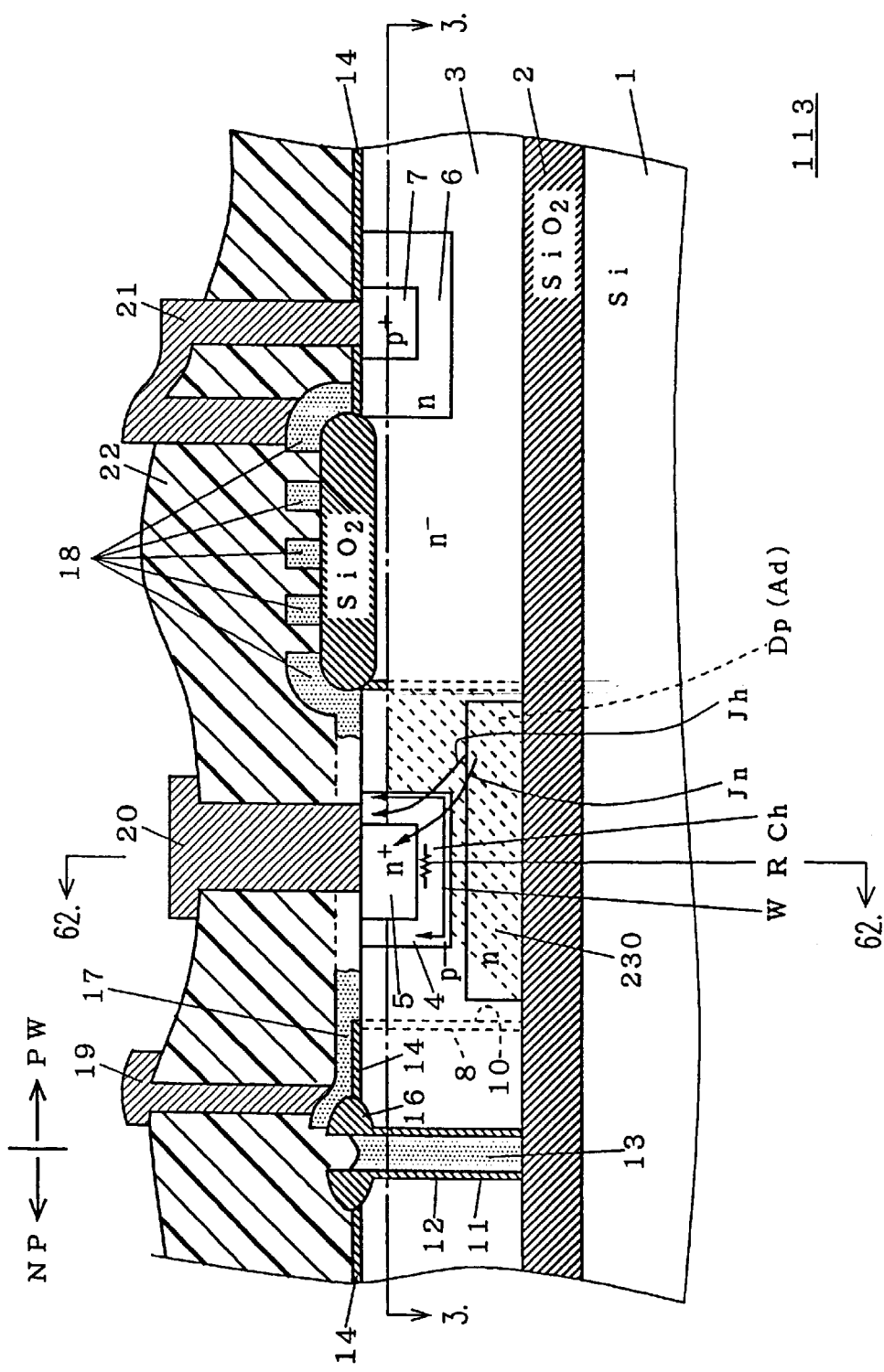
FIG. 61 is a sectional front view showing an device according to a thirteenth embodiment.
Figure 62:
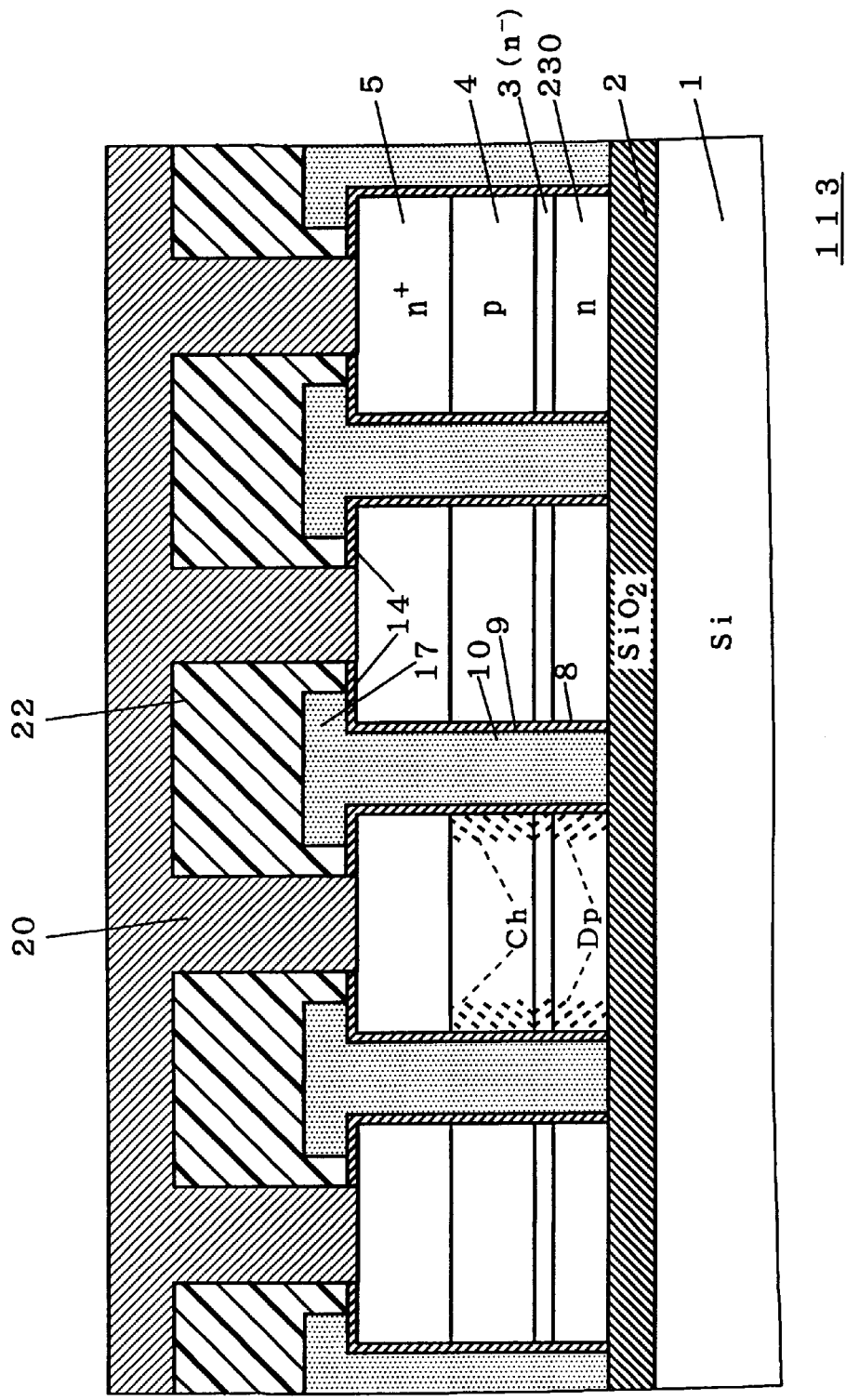
FIG. 62 is a sectional view taken along the line E—E shown in FIG. 61.

FIG. 61 is a sectional front view showing an device according to a thirteenth embodiment. FIG. 62 is a sectional view taken along the line E—E shown in FIG. 61. A sectional view taken along the line D—D shown in FIG. 61 is identical to FIG. 3. An device 113 is characteristically different from the device 101 in that an n-type silicon layer (a bottom semiconductor layer) 230 having a higher concentration of an n-type impurity than that of an n-type silicon layer 3 is formed below a p-type base layer 4.

A portion of the n-type silicon layer 3 which is positioned under the p-type base layer 4 corresponds to the region in which an electronic current Jn relatively concentrates. In the device 113, the n-type silicon layer 230 having a low resistance is provided in a region in which the electronic current Jn relatively concentrates. Therefore, a voltage drop caused by the electronic current Jn can be suppressed. Consequently, an ON-state voltage can further be reduced.

Figure 63:
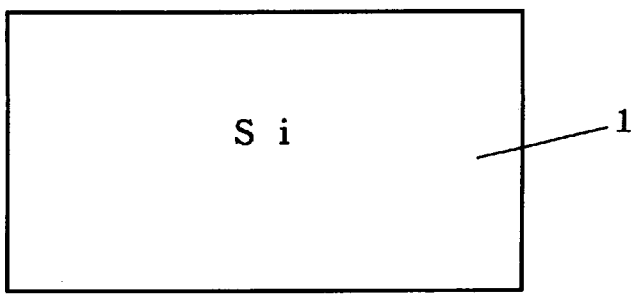
FIG. 63 is a diagram showing a process of manufacturing the device according to the thirteenth embodiment.
Figure 64:
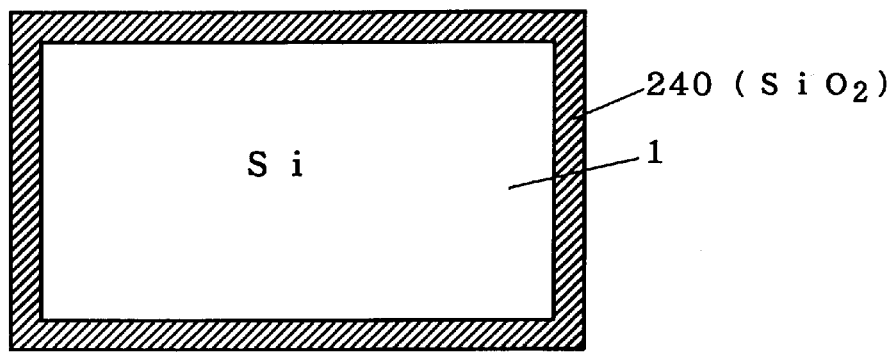
FIG. 64 is a diagram showing the process of manufacturing the device according to the thirteenth embodiment.

FIGS. 63 to 69 are diagrams showing a suitable method for manufacturing the device 113. In order to manufacture the device 113, a silicon substrate 1 is first prepared as shown in FIG. 63. Then, a silicon oxide film 240 is formed on a surface of the silicon substrate 1 as shown in FIG. 64.

Figure 65:
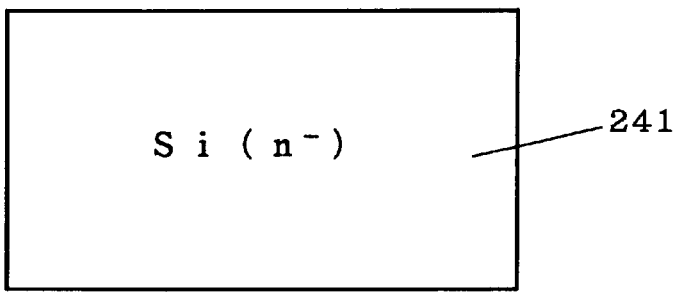
FIG. 65 is a diagram showing the process of manufacturing the device according to the thirteenth embodiment.
Figure 66:
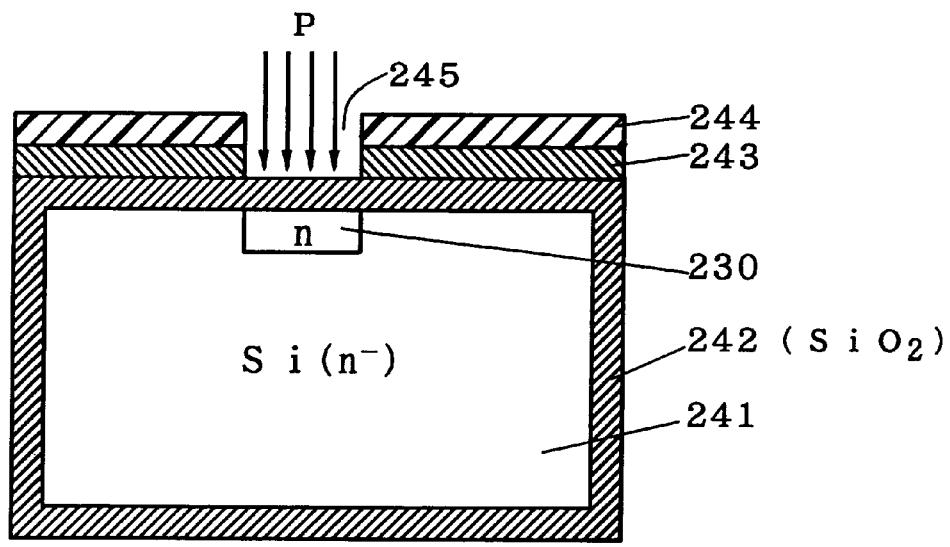
FIG. 66 is a diagram showing the process of manufacturing the device according to the thirteenth embodiment.

Then, an n-type silicon substrate 241 which is the source of an n-type silicon layer 3 is prepared in addition to the silicon substrate 1 as shown in FIG. 65. Then, a step shown in FIG. 66 is performed. At the step shown in FIG. 66, a silicon oxide film 242 is first formed on a surface of the n-type silicon substrate 241. Subsequently, a silicon nitride film 243 is formed on one of principal surfaces of the n-type silicon substrate 241 covered with the silicon oxide film 242, and a resist layer 244 is deposited on the silicon nitride film 243.

Then, an opening 245 is formed on the resist layer 244. The silicon nitride film 243 is subjected to selective etching through the opening 245. Consequently, the same opening as the opening 245 is formed also on the silicon nitride film 243. Phosphorus is selectively implanted by using the silicon nitride film 243 and the resist layer 244 as shields. Consequently, an n-type silicon layer 230 is selectively formed on one of the principal surfaces of the n-type silicon substrate 241. Thereafter, the resist layer 244, the silicon nitride film 243 and the silicon oxide film 242 are removed.

Figure 67:
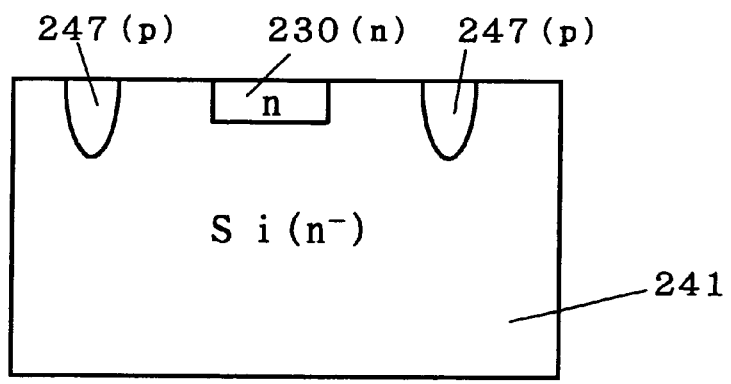
FIG. 67 is a diagram showing the process of manufacturing the device according to the thirteenth embodiment.

At a step shown in FIG. 67, boron is selectively implanted into one of the principal surfaces of the n-type silicon substrate 241 through the same step, and is then diffused. Consequently, a p-type silicon layer 247 is formed. The p-type silicon layer 247 is formed for an alignment mark in the vicinity of an end of the n-type silicon substrate 241.

Figure 68:
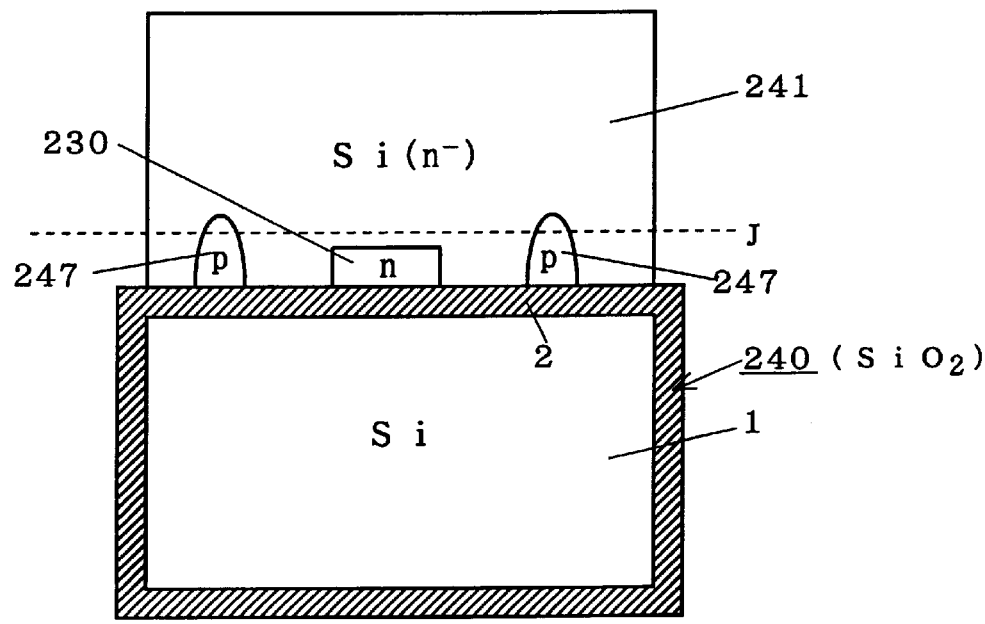
FIG. 68 is a diagram showing the process of manufacturing the device according to the thirteenth embodiment.

Then, one of principal surfaces of the silicon substrate 1 covered with the silicon oxide film 240 is stuck to one of the principal surfaces of the n-type silicon substrate 241 as shown in FIG. 68. A portion of the silicon oxide film 240 which is interposed between the silicon substrate 1 and the n-type silicon substrate 241 corresponds to the above-mentioned silicon oxide film 2. Thereafter, the other principal surface of the n-type silicon substrate 241 is polished up to a J—J cutting plane in FIG. 68.

The J—J cutting plane is parallel with one of the principal surfaces of the n-type silicon substrate 241, and is set into a position which is deeper than a bottom portion of the n-type silicon layer 230 (an upper end in FIG. 68) and is shallower than a bottom portion of the p-type silicon layer 247. As a result of the polish, the above-mentioned n-type silicon layer 3 is formed from the n-type silicon substrate 241.

Figure 69:
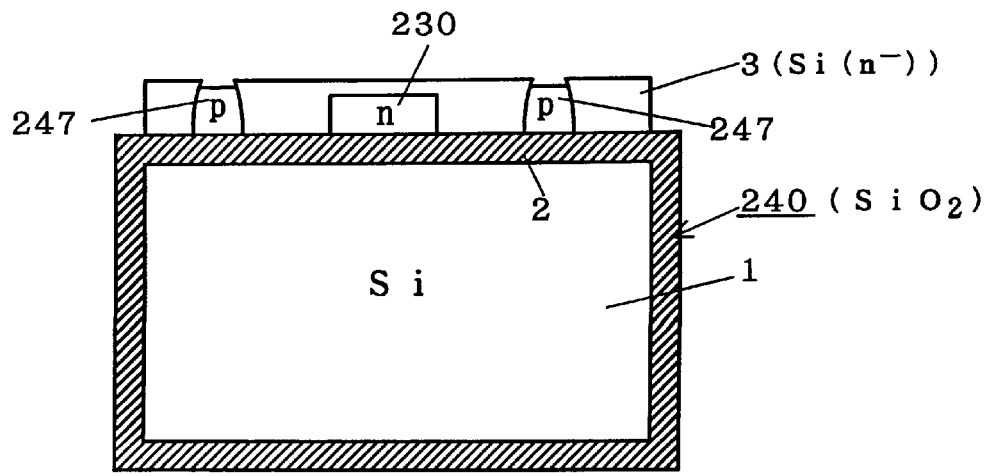
FIG. 69 is a diagram showing the process of manufacturing the device according to the thirteenth embodiment.
Figure 70:
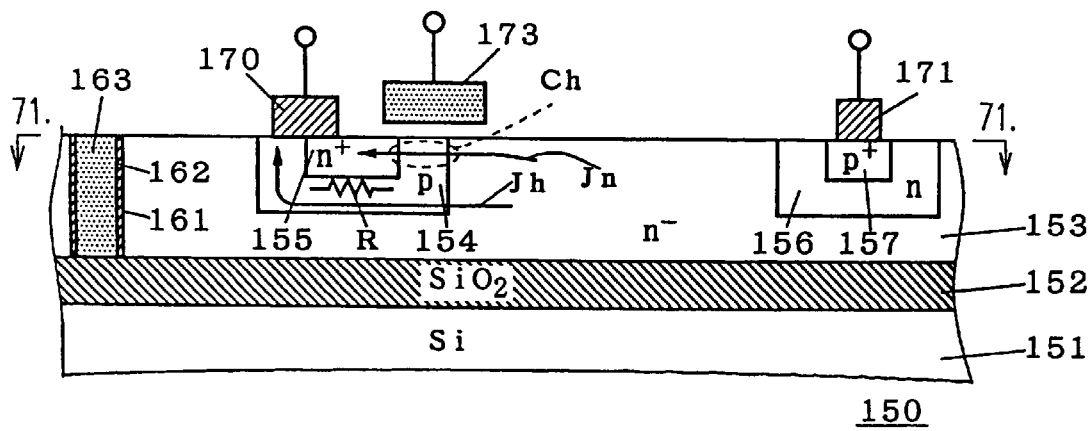
FIG. 70 is a sectional front view showing an device according to the prior art.
Figure 71:
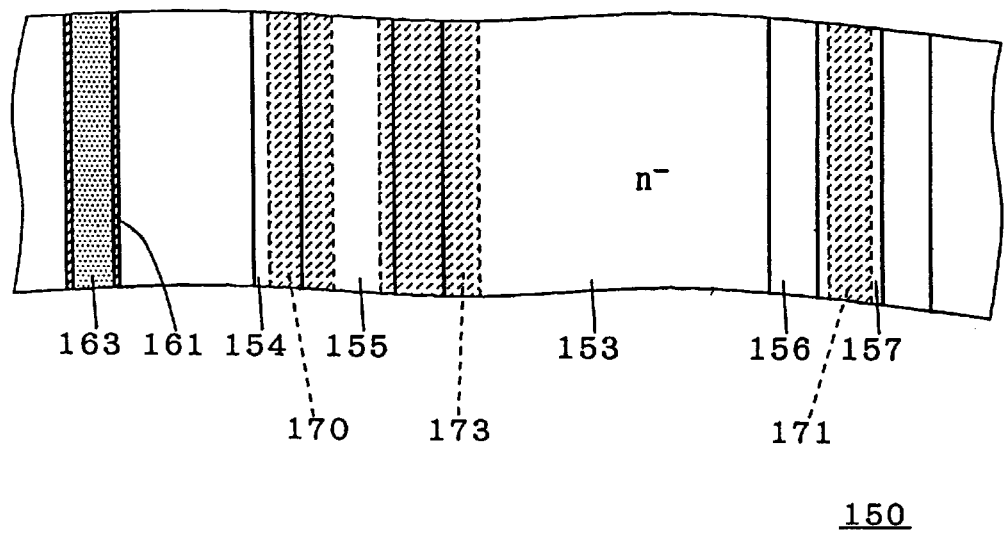
FIG. 71 is a sectional view taken along the line K—K shown in FIG. 70.

Subsequently, the p-type silicon layer 247 which is exposed to the other principal surface of the n-type silicon layer 3 is subjected to selective etching as shown in FIG. 69. As a result, the other principal surface of the n-type silicon layer 3 selectively retreats in a portion of the p-type silicon layer 247. When forming various semiconductor layers at succeeding steps, the retreating portion functions as an alignment mark for recognizing a position of the n-type silicon layer 230. After the step shown in FIG. 69 is completed, the steps of manufacturing the device 101 shown in FIGS. 7 to 24 are performed, for example. Thus, the device 113 is obtained.

14. Variant (1) While the IGBT and the MOS have included the n-type buffer layer 6 in the above-mentioned embodiments, a form in which the n-type buffer layer 6 is not provided can also be used. By providing the n-type buffer layer 6, a distance between the p-type base layer 4 and the p-type collector layer 7 is reduced so that a punch-through can be prevented. In other words, a size of the device can be reduced and a high breakdown voltage can be kept.

(2) While an example in which only the device 103 comprises a MOS transistor has been described in the above-mentioned embodiments, the p-type collector layer 7 is replaced with the n-type drain layer 75 so that it is possible to implement an device comprising the MOS transistor in place of the IGBT in other embodiments as well as the first embodiment.

(3) In some embodiments including the first embodiment, the p-type collector layer 7 is replaced with a general semiconductor layer (which is not restricted to a monolayer) so that various semiconductor device can be implemented in addition to the IGBT. As an example, the MOS transistor is obtained by replacing the p-type collector layer 7 with the n-type drain layer 75.

(4) The above embodiments have described examples in which the collector electrode 21 and the gate wiring 19 are connected to the field plate 18 and the collector electrode 21 and the emitter electrode 20 are connected to the field plate 210. However, if either a set of the collector electrode 21 and the gate wiring 19 or that of the collector electrode 21 and the emitter electrode 20 is connected to any of the field plates 18 and 210, it is generally possible to obtain the effect that a breakdown voltage is enhanced.

While the invention has been described in detail, the foregoing description is in all aspects illustrative and not restrictive. It is understood that numerous other modifications and variations can be devised without departing from the scope of the invention.

We claim:

1. A semiconductor device comprising:
   a first semiconductor layer of a first conductivity type having a first principal surface and a second principal surface;
   a second semiconductor layer of a second conductivity type which is selectively formed on said first principal surface of said first semiconductor layer;
   a third semiconductor layer of a first conductivity type selectively formed on an inside of an exposed surface of said second semiconductor layer, wherein said third semiconductor layer is shallower than said second semiconductor layer, has a higher impurity concentration than that of said first semiconductor layer, and said third semiconductor layer is formed between a first edge and a second edge of said second semiconductor layer, said first and second edges being adjacent to said first semiconductor layer;
   a fourth semiconductor layer which is selectively exposed to said first principal surface of said first semiconductor layer apart from said second semiconductor layer;
   a first main electrode connected to said second and third semiconductor layers;
   a second main electrode connected to said fourth semiconductor layer;
   a gate trench defined by said first semiconductor layer, said gate trench being open to said first principal surface, said gate trench extending in a direction orthogonal to a longitudinal direction of said second semiconductor layer, extending in said first semiconductor layer across said first edge of said second semiconductor layer, extending in said first semiconductor layer across said second edge of said second semiconductor layer, and said gate trench being deeper than said second semiconductor layer;
   a gate insulation film covering an internal wall of said gate trench; and
   a gate electrode buried in said gate trench with said gate insulation film interposed therebetween.

2. The semiconductor device according to claim 1, wherein said gate trench is divided into lines of unit gate trenches arranged at regular intervals, and
   a connecting portion of said first main electrode and said second and third semiconductor layers is divided into a plurality of regions interposed between said lines of said unit gate trenches.

3. The semiconductor device according to claim 2, wherein said fourth semiconductor layer is a semiconductor layer of a second conductivity type, and
   said connecting portion is provided thinly in a part of said regions.

4. The semiconductor device according to claim 2, wherein said fourth semiconductor layer is a semiconductor layer of a second conductivity type,
   said third semiconductor layer retreats on a side wall facing said fourth semiconductor layer in a central position of each of said regions from said side wall toward an opposite side or up to said opposite side, and
   said connecting portion includes at least a part of said exposed surface of a portion of said second semiconductor layer which fills up a retreating portion of said third semiconductor layer.

5. The semiconductor device according to claim 4, further comprising a fifth semiconductor layer of a second conductivity type which is selectively formed in said retreating portion of said third semiconductor layer and has a higher impurity concentration than that of said second semiconductor layer.

6. The semiconductor device according to claim 1, wherein said fourth semiconductor layer is a semiconductor layer of a second conductivity type.

7. The semiconductor device according to claim 6, wherein said first main electrode is connected to exposed surfaces of said second and third semiconductor layers across an edge of said third semiconductor layer which is closer to said second main electrode.

8. The semiconductor device according to claim 6, further comprising a semiconductor well layer of a first conductivity type which is selectively formed on said first semiconductor layer and has a higher impurity concentration than that of said first semiconductor layer,
   wherein said semiconductor well layer is in contact with said second semiconductor layer on a side of said second semiconductor layer which is closer to said second main electrode.

9. The semiconductor device according to claim 8, further comprising:

a substrate insulation film covering said second principal surface of said first semiconductor layer;

a semiconductor substrate covering said substrate insulation film; and a semiconductor well layer of a first conductivity type which is selectively formed on said first semiconductor layer and has a higher impurity concentration than that of said first semiconductor layer, wherein said semiconductor well layer is in contact with said second semiconductor layer on a side of said second semiconductor layer which is closer to said second main electrode, and has a bottom portion which reaches said substrate insulation film.

10. The semiconductor device according to claim 6, wherein said gate trench extends to a portion of said first semiconductor layer on an outside beyond said edge of said second semiconductor layer which is closer to said second main electrode, and said gate trench projects in a direction orthogonal to an extension direction on an end closer to said second main electrode in said extension direction.

11. The semiconductor device according to claim 1, wherein said fourth semiconductor layer is a semiconductor layer of a first conductivity type having a higher impurity concentration than that of said first semiconductor layer.

12. The semiconductor device according to claim 1, further comprising:

a substrate insulation film covering said second principal surface of said first semiconductor layer; and a semiconductor substrate covering said substrate insulation film.

13. The semiconductor device according to claim 12, wherein a bottom portion of said gate trench reaches said substrate insulation film, said first semiconductor layer further defines an isolation trench open to said first principal surface, and said isolation trench has an annular shape to enclose said second, third and fourth semiconductor layers and said gate trench, and has a bottom portion which reaches said substrate insulation film, said semiconductor device further comprising:

an isolation insulation film covering an internal wall of said isolation trench; and an isolation electrode buried in said isolation trench with said isolation insulation film interposed therebetween.

14. The semiconductor device according to claim 1, wherein a material of said first semiconductor layer is single-crystalline silicon, and a <100> orientation of said single-crystalline silicon is coincident with an extension direction of said gate trench.

15. The semiconductor device according to claim 1, further comprising an insulation layer and a field plate opposite through said insulation layer in a region interposed between said first and second main electrodes in said first principal surface of said first semiconductor layer, wherein an end of said field plate which is closer to said first main electrode is electrically connected to said first main electrode or said gate electrode, and an end of said field plate which is closer to said second main electrode is electrically connected to said second main electrode.

16. The semiconductor device according to claim 1, further comprising a bottom semiconductor layer of a first conductivity type which is selectively formed between said second principal surface of said first semiconductor layer and said second semiconductor layer and has a higher impurity concentration than that of said first semiconductor layer.

* * * * *